United States Patent [19]

Watanabe et al.

[11] Patent Number: 5,686,835

[45] Date of Patent: Nov. 11, 1997

[54] PHYSICAL QUANTITY DETECTION DEVICE FOR CONVERTING A PHYSICAL QUANTITY INTO A CORRESPONDING TIME INTERVAL

[75] Inventors: Takamoto Watanabe, Nagoya; Yoshinori Ohtsuka, Okazaki; Tadashi Hattori, Okazaki; Kouichi Hoshino, Obu, all of Japan

[73] Assignees: Nippondenso Co., Ltd, Kariya; Nippon Soken, Inc., Nishio, both of Japan

[21] Appl. No.: 589,093

[22] Filed: Jan. 19, 1996

Related U.S. Application Data

[63] Continuation of Ser. No. 437,568, May 9, 1995, abandoned, which is a continuation of Ser. No. 112,314, Aug. 27, 1993, abandoned, which is a continuation of Ser. No. 866,351, Apr. 10, 1992, abandoned, which is a continuation of Ser. No. 467,402, Jan. 18, 1990, Pat. No. 5,134,371.

[30] Foreign Application Priority Data

| Jan. 18, 1989 | [JP] | Japan | 1-10235 |
| Jan. 20, 1989 | [JP] | Japan | 1-12526 |
| Apr. 17, 1989 | [JP] | Japan | 1-96873 |
| Oct. 11, 1989 | [JP] | Japan | 1-264319 |
| Dec. 14, 1989 | [JP] | Japan | 1-324290 |
| Dec. 25, 1989 | [JP] | Japan | 1-336089 |

[51] Int. Cl.$^6$ ............ G01P 3/481; G01P 3/489; G01R 23/10; G01R 25/00

[52] U.S. Cl. ............ 324/166; 324/207.12; 324/207.2; 324/207.21; 324/76.48; 324/76.55; 324/76.82; 327/4; 327/40

[58] Field of Search ............ 324/166, 174, 324/207.2, 207.21, 233, 236, 237, 251, 252, 327, 328, 656, 667, 668, 674, 675, 676, 681–683, 707–712, 76.41, 76.47, 76.48, 76.52–76.55, 76.62, 76.77, 76.82, 76.83; 327/3, 4, 7, 39–49; 331/65, 66; 377/43

[56] References Cited

U.S. PATENT DOCUMENTS 3,164,777  1/1965  Guanella .
3,317,829  5/1967  Kuhrt et al. .

(List continued on next page.)

FOREIGN PATENT DOCUMENTS 281733  9/1988  European Pat. Off. .
3621710  1/1988  Germany .

(List continued on next page.)

OTHER PUBLICATIONS

Sensor Device Hand Book (Feb. 25, 1985) pp. 54–59 and translation.

Macario, R.C.V.; Discriminative Metal Detector, Wireless World, Jul. 1978, vol. 84, No. 1511.

Agrawal et al.; Transistor probe simplifies solid–state gaussmeter, Electronics, Oct. 9, 1980, vol. 53, No. 22.

V.P. Chirkov, "Magnetic Induction–to–Frequency Transducer", Izmeritel'naya Tekhnika (Russian language journal), No. 12, pp. 69–70, Dec., 1978.

Elektor, vol. 4, Nos. 7–8, Jul./Aug. 1978, "Signal Injector", p. 27.

Kwiatkowski, et al., "The permalloy magnetoresistive sensors—properties and applications", Journal of Physics E., Warsaw Tech. Univ., vol. 19, No. 7, Jul. 1986, pp. 502–515.

*Primary Examiner*—Gerard R. Strecker
*Attorney, Agent, or Firm*—Cushman Darby & Cushman IP Group of Pillsbury Madison & Sutro, LLP

[57] ABSTRACT

A magnetic detection device including at least one oscillator circuit having a magnetoresistance element which converts a change of magnetism detected into a digital signal and a comparator for comparing the digitalized oscillating frequency of the oscillator circuit with another digitalized oscillating frequency generated from another oscillating circuit by taking a ratio thereof or by detecting a phase difference between the pulse signals. Utilizing the magnetic detection device, the amount of change of magnetism can be stably detected with a high accuracy within a wide range of ambient usage temperatures. The physical quantity detection device includes a magnetic detection device which can detect any physical quantity with a high accuracy.

17 Claims, 36 Drawing Sheets

U.S. PATENT DOCUMENTS

| | | | |
|---|---|---|---|
| 3,492,564 | 1/1970 | Baker, Jr. | 324/328 X |
| 3,518,540 | 6/1970 | Roberts . | |
| 3,808,524 | 4/1974 | Tarassoff et al. | 331/65 X |
| 3,857,103 | 12/1974 | Grazia | 327/3 |
| 4,104,619 | 8/1978 | Hesler | 331/66 X |
| 4,139,819 | 2/1979 | Worley . | |
| 4,150,573 | 4/1979 | Iinuma et al. | 331/65 X |
| 4,182,986 | 1/1980 | Parker | 331/260 X |
| 4,296,377 | 10/1981 | Ohkubo | 324/252 |
| 4,308,501 | 12/1981 | Tuccinardi et al. | 331/65 X |
| 4,316,158 | 2/1982 | Akita et al. | 331/111 |
| 4,319,188 | 3/1982 | Ito et al. | 324/173 |
| 4,321,539 | 3/1982 | Trump | 324/328 |
| 4,341,998 | 7/1982 | Castera et al. | 331/667 X |
| 4,649,342 | 3/1987 | Nakamura | 324/252 X |
| 4,683,437 | 7/1987 | Javeri . | |
| 4,721,905 | 1/1988 | Mehrgardt . | |
| 4,754,221 | 6/1988 | Ao et al. | 324/252 X |
| 4,816,748 | 3/1989 | Tazawa et al. | 331/65 X |
| 4,984,254 | 1/1991 | Thomas . | |
| 5,005,064 | 4/1991 | Yoshino et al. . | |
| 5,128,624 | 7/1992 | Hoshino et al. | 327/3 |
| 5,134,371 | 7/1992 | Watanabe | 324/252 |
| 5,359,287 | 10/1994 | Watanabe | 324/207.21 |

FOREIGN PATENT DOCUMENTS

| | | | |
|---|---|---|---|
| 48-94477 | 12/1973 | Japan . | |
| 0068266 | 6/1979 | Japan | 324/207.21 |
| 55-75343 | 6/1980 | Japan . | |
| 57-142336 | 9/1982 | Japan | G01L 9/12 |
| 58-61583 | 4/1983 | Japan | H01R 13/66 |
| 59-37611 | 9/1984 | Japan | H03K 3/354 |
| 60-104925 | 6/1985 | Japan . | |
| 60-173434 | 9/1985 | Japan | G01L 3/10 |
| 61-227422 | 10/1986 | Japan . | |
| 62-111518 | 5/1987 | Japan . | |
| 54-138457 | 10/1989 | Japan . | |
| 805926 | 12/1958 | United Kingdom | 324/252 |
| 1397246 | 6/1975 | United Kingdom | 324/253 |
| 8807206 | 9/1988 | WIPO . | |

Fig. 1
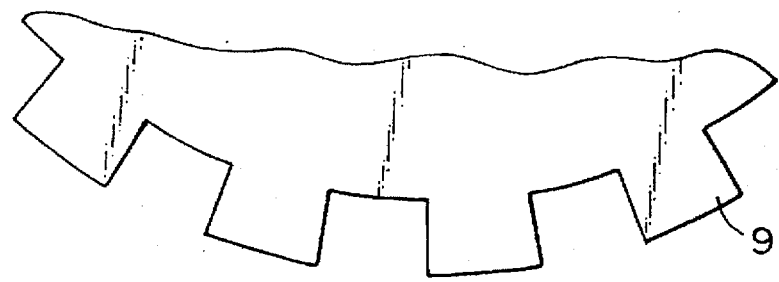
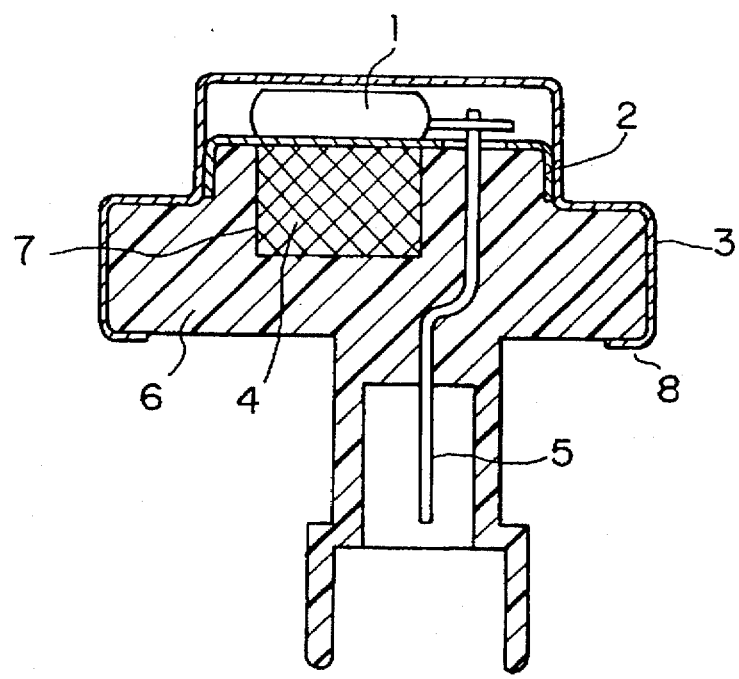
Fig. 2
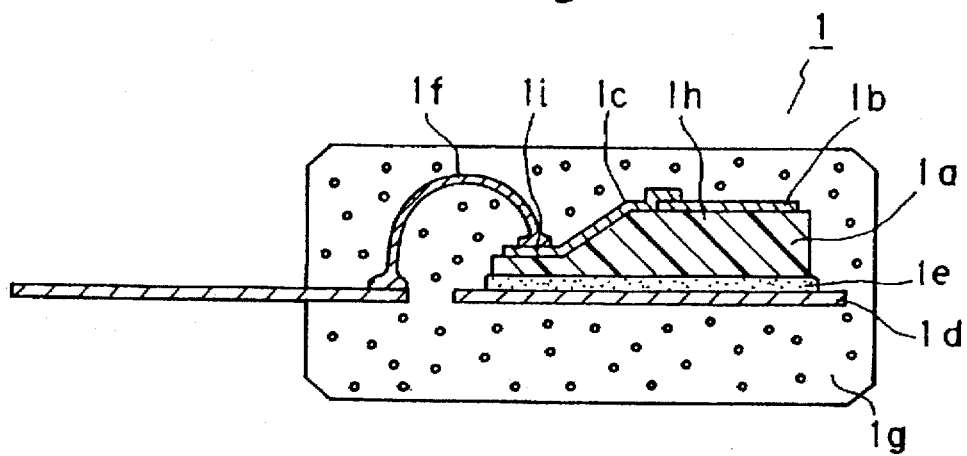

WHEN $R_1 > R_2$ $$V_{AH} = \frac{R_2/R_3}{1+R_2/R_3} \cdot V_{DD}$$

$$V_{AL} = \frac{1}{1+R_2/R_3} \cdot V_{DD}$$

$V_{AS} = V_{AH} - V_{AL}$ $R_{3x} = 2K\Omega$ $R_{3x} = 1K\Omega$

Fig. 21 (a)
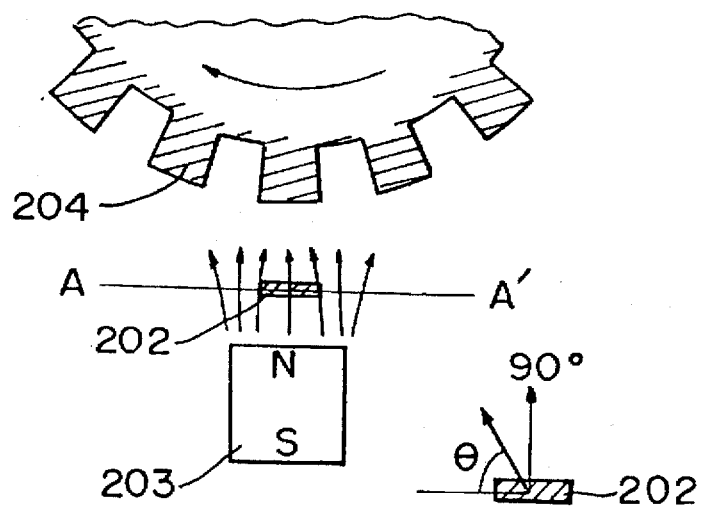
Fig. 21 (b)
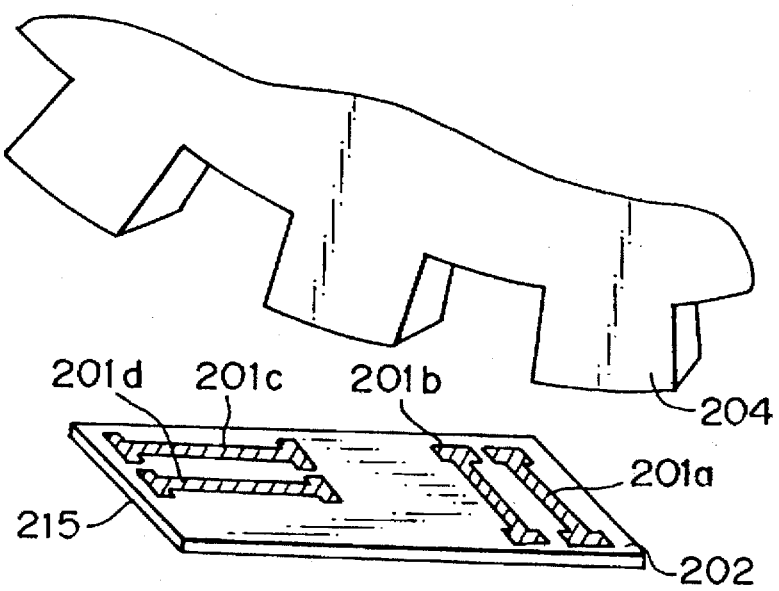
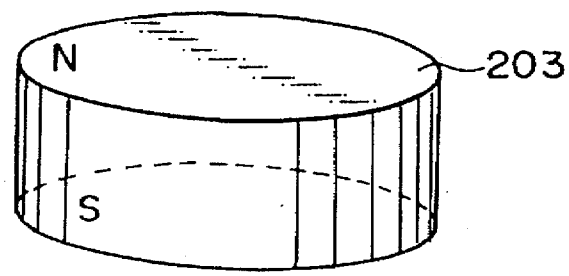

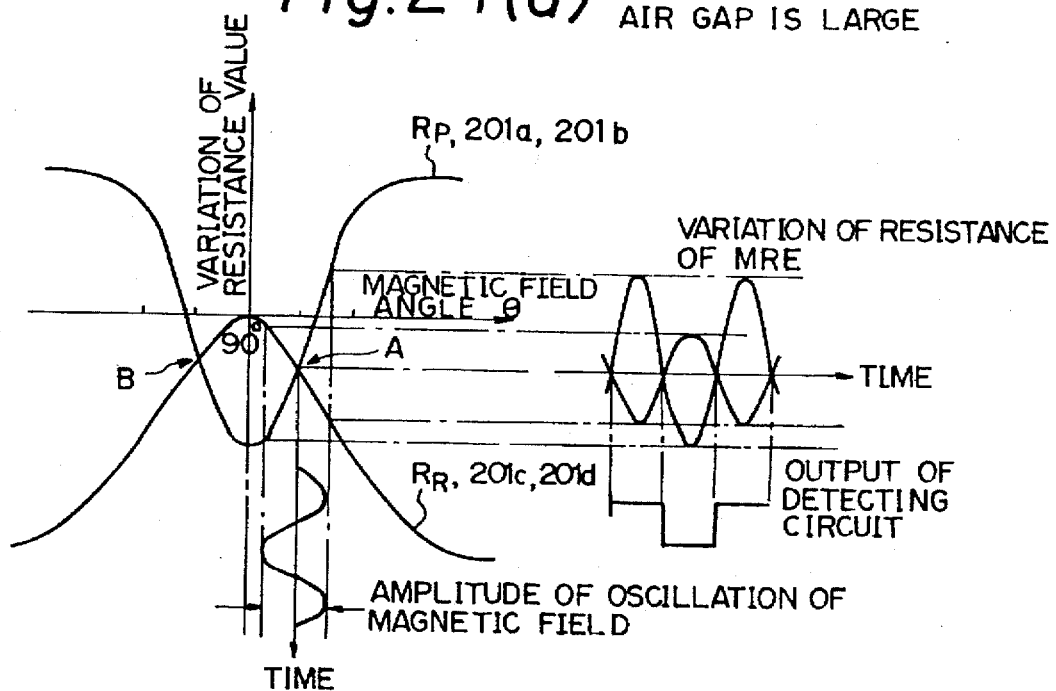
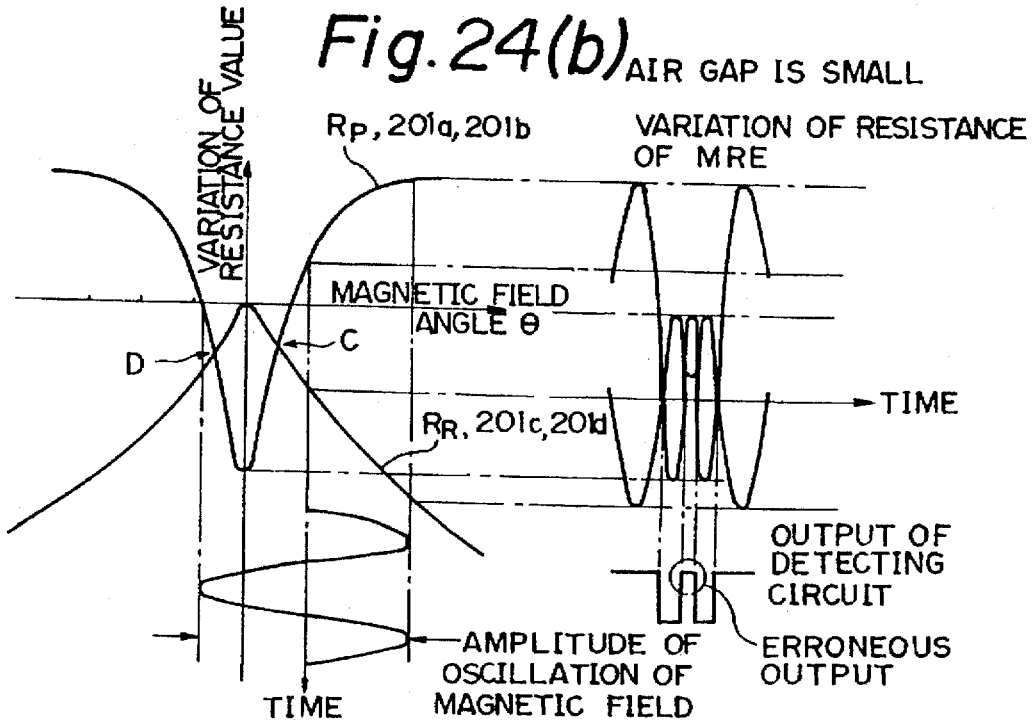

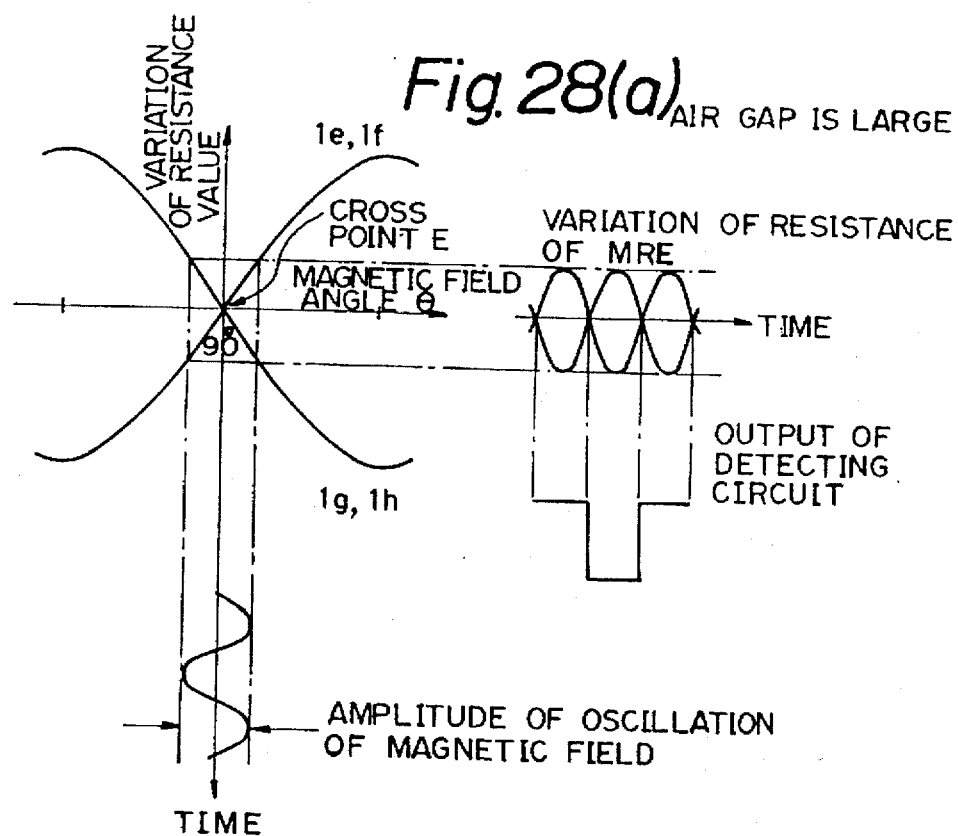
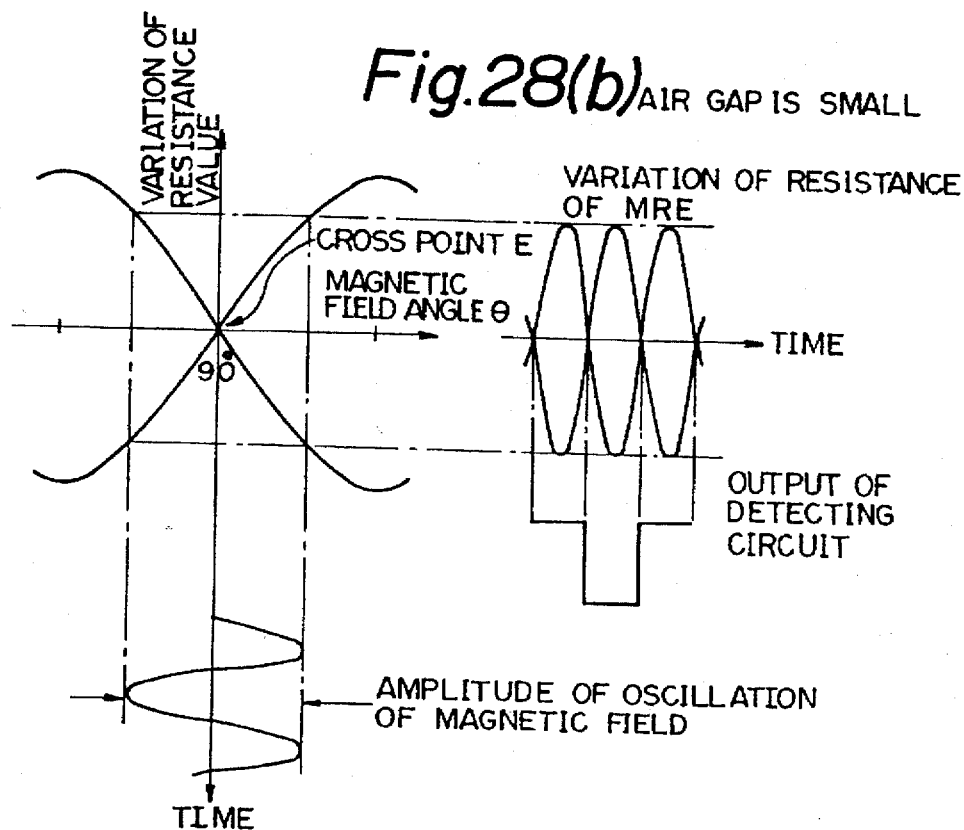

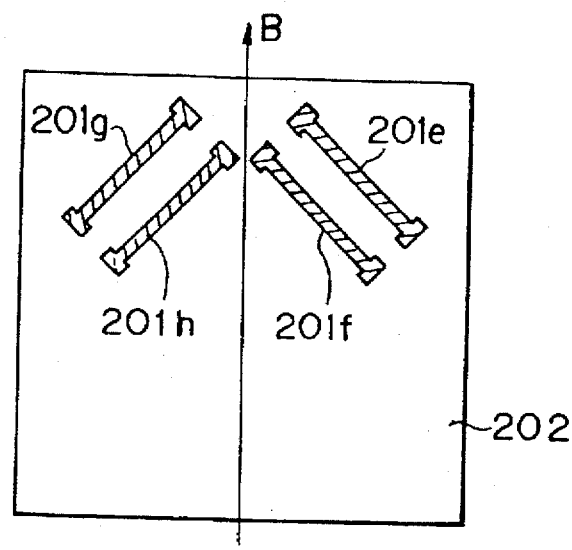
Fig.29(a)
Fig.29(b)
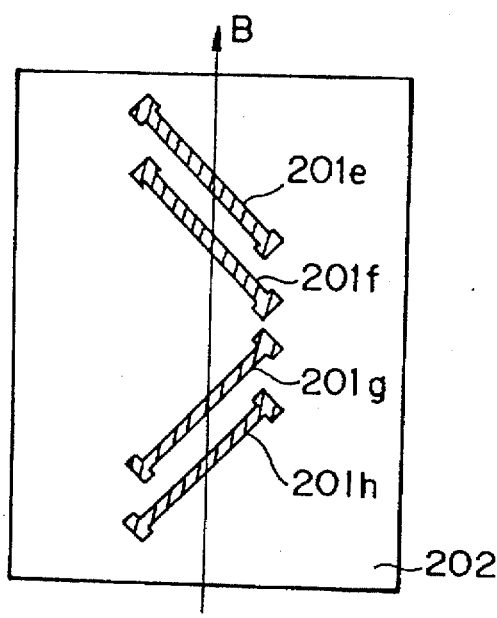
Fig.29(c)
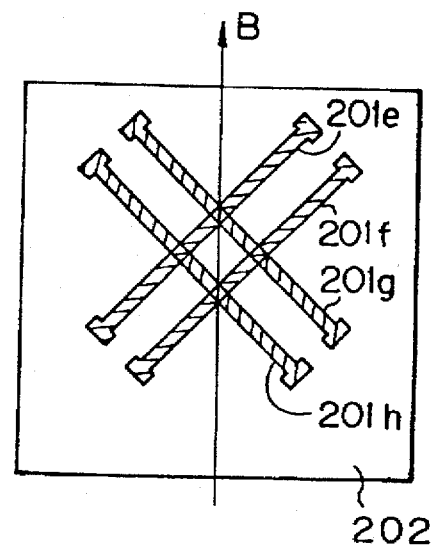

Fig. 42

| | Iv1 | Iv2 | Iv3 |
|---|---|---|---|
| P CHANNEL FET(W/L) | 250/5 | 1250/5 | 1250/5 |
| N CHANNEL FET(W/L) | 100/5 | 500/5 | 500/5 |

UNIT: μm

Fig. 43

| | Iv1 | Iv2 | Iv3 |
|---|---|---|---|
| P CHANNEL FET(W/L) | 1250/5 | 1250/5 | 1250/5 |
| N CHANNEL FET(W/L) | 500/5 | 500/5 | 500/5 |

UNIT: μm

PHYSICAL QUANTITY DETECTION DEVICE FOR CONVERTING A PHYSICAL QUANTITY INTO A CORRESPONDING TIME INTERVAL

This is a Continuation of Application Ser. No. 08/437,568 filed May 9, 1995, now abandoned; which was a Continuation of Ser. No. 08/112,314 filed Aug. 27, 1993, now abandoned; which was a Continuation of Ser. No. 07/866,351 filed Apr. 10, 1992, now abandoned; which was a Continuation of Ser. No. 07/467,402, filed Jan 18, 1990, now U.S. Pat. No. 5,134,371 issued Jul. 28, 1992.

BACKGROUND OF THE INVENTION

1. Field of the Invention

This invention relates to a magnetic detection device which converts a magnetic state to an electric signal utilizing a magnetoresistance effective element (MRE), whose electric resistance is determined by the magnetic state, for speed detection by magnetic changes etc. and to a physical quantity detection device utilizing the same.

More particularly, this invention relates to a magnetic detection device for detecting the amount of magnetic change with a high accuracy and sensitivity utilizing a means which converts the change of the magnetism to a digital pulse signal.

2. Description of the Related Art

Generally speaking, a position sensor or a rotational speed sensor has to have a high level of detection accuracy, a wide range of ambient temperature of use, and simple construction. Use is now made of sensors working by detecting magnetism. The reason is that an MRE has a high sensitivity to magnetism, is relatively stable against temperature changes, and can be easily produced. In addition, in an electronic circuit for converting a magnetic state into an electric signal, the magnetic state directly determines the resistance, so it is important that the design of the detecting circuit be simple. These characteristics make it effective to mount both the MRE and detection circuit on one chip.

In a conventional sensor or circuit, use is made of a resistance bridge circuit, widely used for detecting a resistance value, and a voltage amplifying circuit, which can detect and amplify an output voltage.

The output voltage of the resistance bridge circuit is stable against temperature changes. The voltage amplifying circuit is an analog circuit, however, so when the temperature changes, the characteristics of the transistor in the voltage amplifying circuit change and the resistance of the resistor shifts, whereby an offset voltage is generated. Therefore, the range of ambient temperature in which the voltage amplifying circuit can correctly work, is relatively narrow.

This problem can be alleviated to a certain extent by utilizing a temperature compensating circuit, but the construction of the circuit becomes complicated and the production efficiency is reduced. Also, when the temperature increases to a much higher level, the temperature compensating circuit itself cannot work correctly. Therefore, the circuit is not suitable for a circuit used, for example, for detection of rotational speed in automobiles, when the range of ambient temperature of use is wide.

Note that when this kind of magnetic detection device is used as a sensor for detecting the rotational speed of a wheel of an automobile, especially when used for an antilock brake system (ABS), a wide range of temperatures under which the device can be guaranteed to normally operate is required, because the sensor is usually mounted near a brake, which is usually heated to a high temperature.

In the future, sensors will have to be built on one chip and the range of ambient temperature of use of a detection circuit will become wider, so a detection circuit which can operate stably in a wide range of ambient temperatures of use will become necessary.

Note also that the mounting position of the magnetic sensor greatly affects the output signal and the adjustment thereof is very difficult.

SUMMARY OF THE INVENTION

The present invention was created to overcome the problems mentioned above. The primary object of the present invention is to provide a magnetic detection device which can stably work in a much wider range of ambient temperatures and which is suitable for being made on an integrated circuit.

Another object of the present invention is to improve the sensitivity of the magnetic detection device.

Another object of the present invention is to provide a magnetic detection device which can detect movement of an object to be detected in a good condition regardless of the distance between the device and the object.

A still further object of the present invention is to provide various physical quantity detection circuits.

According to the present invention, there is provided a magnetic detection device which comprises at least one oscillating circuit having a magnetoresistance effective element (MRE) and a comparator for comparing an oscillating frequency of the oscillating circuit with another oscillating frequency to detect magnetic changes. According to the present invention, there is further provided a physical quantity detection device comprising a detecting device for detecting a magnetic change comprising at least one oscillating circuit having an MRE and a comparator for comparing an oscillating frequency of the oscillating circuit with another oscillating frequency and outputting a pulse signal indicating a magnetic change, and a converter for converting the output pulse signal output from the comparator to a pulse signal indicating a change of the physical quantity. Moreover according to the present invention, there is provided another type of a magnetic detection circuit and a physical quantity detection circuit utilizing the same, which comprises;

a magnetic field generating means for generating a bias magnetic field toward an object to be detected having magnetic materials therein and MREs provided on a predetermined plane arrange in the bias magnetic field, a resistance value thereof being changed in response to a change of conditions of the bias magnetic field due to a movement of the object to be detected, the change of conditions of the bias magnetic field being detected by the change of the resistance value of said MRES, the predetermined plane formed by a direction of the bias magnetic field generated from the magnetic field generating means and a moving direction of the object to be detected, the MREs being arranged on the plane so that the change of the resistance value displays at least one of a monotonous increment and monotonous reduction due to the change of the bias magnetic field.

Further according to the present invention, there is provided a different type of a magnetic detection circuit utilizing a pulse phase difference which comprises;

a detecting circuit for detecting pulse phase difference, which comprises a delayed pulse signal output means comprising a signal delay circuit which outputs a plurality of pulse signals when a first pulse signal is input thereto, each pulse signal being delayed from the previous pulse signal by a predetermined different delay time, a pulse signal selecting means which receives as input a second pulse signal delayed from the first pulse signal by any desired time and a plurality of pulse signals output from the delayed pulse signal output means and which selects from the plurality of pulse signals, a certain pulse signal having a specific condition with respect to a timing at which the second pulse signal is input, and a detecting means for detecting a phase difference between the first and the second pulse signals utilizing the pulse signal selected by the pulse signal selecting means.

BRIEF DESCRIPTION OF THE DRAWINGS

FIG. 1 is a cross-sectional view of a construction of a magnetic detection device of a first aspect of the present invention;

FIG. 2 is a cross-sectional view of a construction of a molded chip;

FIGS. 21(a) and 21(b) are a front view and a perspective view, respectively, indicating an arrangement among a magnet, an insulating substrate on which MREs are mounted, and an object to be detected in a conventional device;

FIG. 24(a) shows the change in resistance of the MREs and an output of the magnetic detection device with respect to the magnetic field angle in the conventional device shown in FIGS. 21(a) and 21(b) when the air gap is large;

FIG. 24(b) shows the change in resistance of the MREs and an output of the magnetic detection device with respect to the magnetic field angle in the conventional device shown in FIGS. 21(a) and 21(b) when the air gap is small;

FIG. 28(a) is a graph of the change in resistance of the MRE and an output of the magnetic detection device with respect to the magnetic field angle with a large air gap;

FIG. 28(b) is a graph of the change in resistance of the MRE and an output of the magnetic detection device with respect to the magnetic field angle with a small air gap;

FIGS. 29(a), 29(b), and 29(c) show patterns of arrangement of MREs on the insulating substrate of the magnetic detection device shown in FIG. 25;

FIG. 42 is a chart indicating the transistor size of each inverter in FIG. 40;

FIG. 43 is a chart indicating the transistor size of each inverter in a conventional circuit;

DESCRIPTION OF THE PREFERRED EMBODIMENTS

Figure 3A:
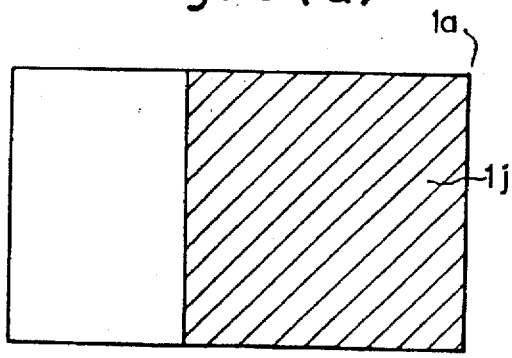
FIGS. 3(a) to 3(d) are cross-sectional views showing a method of producing a thin portion in an insulating substrate.

Embodiments of the present invention will be explained with reference to the attached drawings hereunder.

FIG. 1 shows the construction of a magnetic detection device of a first aspect of the present invention. In the magnetic detection device, a magnetic sensor is arranged between a bias magnet and a gear made of a magnetic material. It is suitably used for detecting a rotational speed of a wheel of an automobile with ABS.

The magnetic detection device of the first aspect basically includes a molded chip 1, an MRE molded therein with resin, an inner case 2 made of a metallic material, an external case 3, a bias magnet 4, an output pin 5, and a connector 6. The bias magnet 4 is inserted into a grooved portion 7 provided in the connector 6, and the inner case 2 is fixed to the connector 6 with a suitable adhesive, not shown in FIG. 1. The molded chip 1 is fixed to the portion just on the upper surface of the bias magnet 4 with a suitable adhesive, not shown in FIG. 1, and is also connected to the output pin 5 which is integrally mounted within the connector 6 by welding or the like. Finally, the outer case 3 is press fit to the connector 6, and the end 8 of the case 3 is crimped.

In FIG. 1, a rotating gear 9 made of a magnetic material is provided as an example of an object to be detected.

Note that when the magnetic detection device is used for detecting the rotational speed of a wheel, the shaft axis of the wheel penetrates into the center of the rotating gear 9.

The construction of the molded chip 1 is indicated in FIG. 2. As shown in FIG. 2, an MRE 1b made of Ni—Co or Ni—Fe is formed in a U-configuration by a photoetching method or the like on a surface of a glass plate or an insulating substrate 1a made of high resistance Si or made of Si with an oxide film formed on a surface thereof. One end of a conductive layer 1c is arranged to come into contact with the MRE 1b. The insulating substrate 1a provided with the MRE 1b and the conductive layer 1c is mounted on a lead frame 1d by a die bonding paste 1e, while another end of the conductive layer 1c is connected to the lead frame 1d with a bonding wire 1f. After that, the whole device is filled with a molding resin utilizing the injection molding method.

When the insulating substrate 1a is Si, a thin portion 1i may be formed in the substrate 1a other than at the portion on which the MRE 1b is intended to be arranged, utilizing an etching method, providing a tapered portion between them. The bonding wire if as mentioned above is connected to this thin portion 1i of the substrate.

When a substrate made of Si having an insulating film on the surface thereof is used as the insulating substrate 1a, not only the oscillating circuit explained later but also other circuits may be simultaneously formed inside or on the surface of the silicon substrate 1a.

FIGS. 3(a) to 3(d) show a method to form the thin portion 1i on the insulating substrate made of Si.

In this embodiment, the crystal plane (100) is used as the surface direction of the silicon substrate.

Figure 3B:
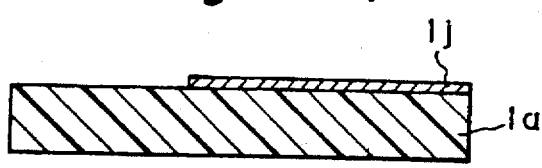
Figure 3C:
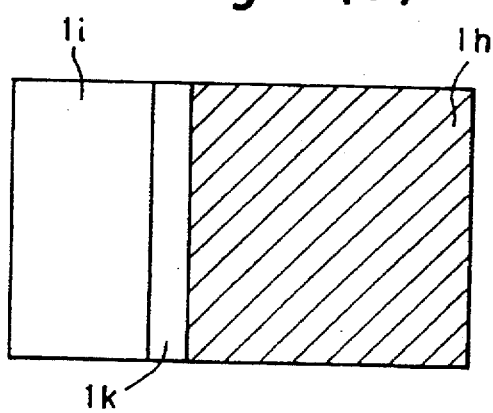
Figure 3D:
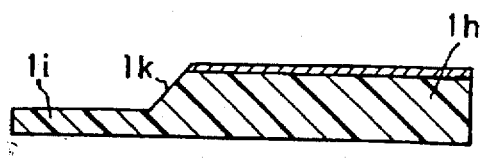

In FIG. 3(a), first an oxide film 1j is formed on a portion of the surface of the Si substrate 1a as shown by hatching. The cross-section thereof is shown in FIG. 3(b). An isotropic etching using an alkaline substance is applied to the substrate so that a thin portion 1i is formed leaving the thick portion 1h unchanged as shown in FIG. 3(c) and a tapered portion 1k having an angle of about 54 degrees is formed between them. The cross-section thereof is shown in FIG. 3(d). After that, an oxide film is formed on the surface thereof to give the insulating substrate used in this invention.

Figure 4:
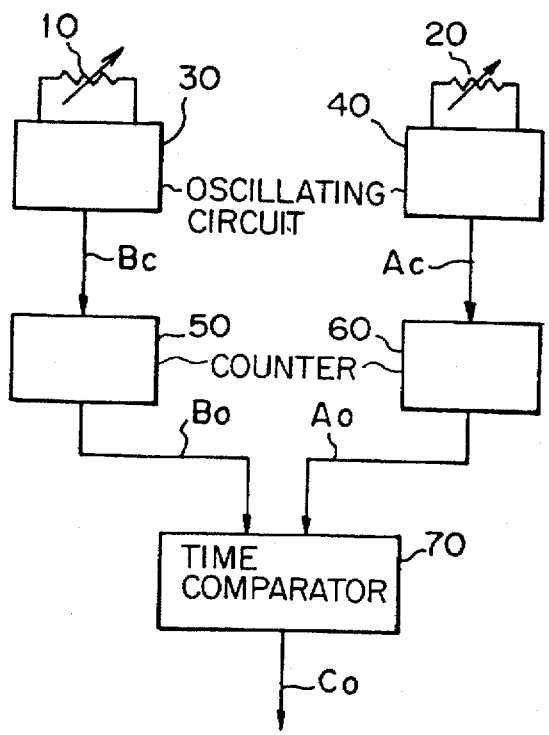
FIG. 4 is a block diagram of the detection circuit of the first aspect of the present invention.

FIG. 4 is a block diagram of a detection circuit as the main element of this device. This circuit outputs pulses such as a high level and a low level indicating changes in the magnetic field affecting the MRE. This system can be used as a detection circuit for a rotational speed sensor, for example.

Figure 5:
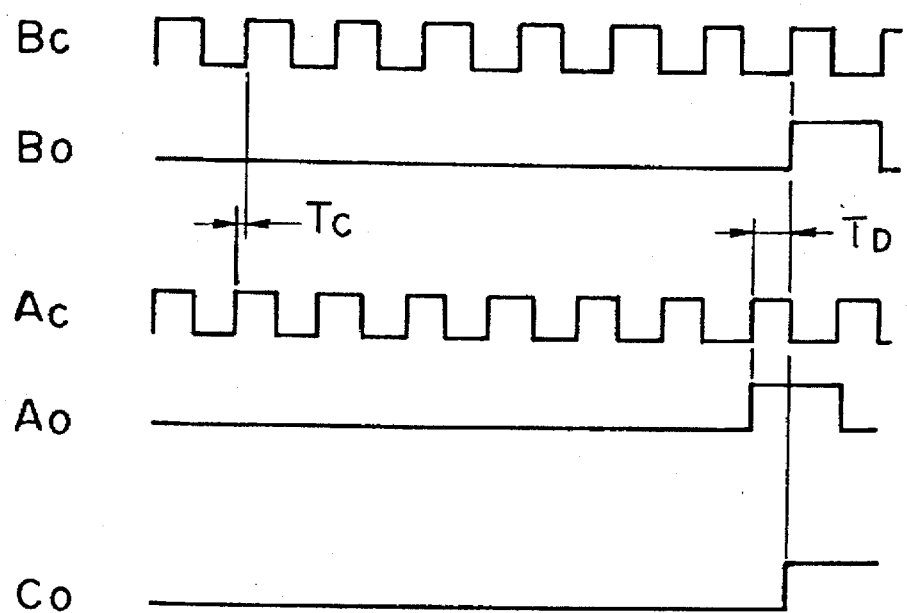
FIGS. 5 and 6 are timing charts each indicating a timing condition of a block output signal in the circuit.
Figure 6:
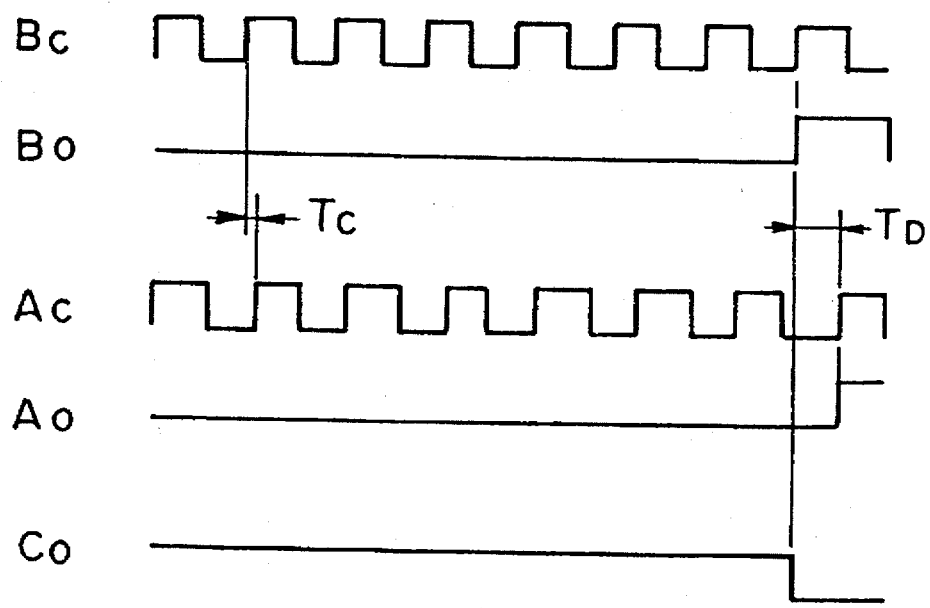

FIGS. 5 and 6 are timing charts indicating timing conditions of each signal output from each block in the block diagram of FIG. 4 and show the operating theory of this embodiment.

The MREs 10 and 20 shown in FIG. 4, which have the same pattern and the same size, are formed on the surface of the insulating substrate 1a as shown in FIG. 2 and are mounted on one chip in such a way that the longitudinal directions of one pattern are arranged perpendicular (90°) to those of other longitudinal directions of another pattern so that the resistance of each MRE changes in the opposite direction from each other with respect to the effect of the same magnetic field.

Oscillating circuits 30 and 40 have oscillating frequencies defined by the resistances of the MREs 10 and 20 and have output clock pulses $B_C$ and $A_C$ having oscillating frequencies equal to those frequencies. The clock pulses $B_C$ and $A_C$ are input to counters 50 and 60, respectively. The counters 50, 60 output divided pulses $A_0$ and $B_0$ which are obtained by dividing the clock pulses $B_C$ and $A_C$ by one-eighth, for example, respectively.

A timing comparator 70 detects the interrelation between timings of rising edges of the pulse $A_0$ and the pulse $B_0$ utilizing the pulse $A_0$ and the pulse $B_0$ output from the counters 50 and 60 as input data. The timing comparator 70 outputs a high level signal (H) when the timing of the rising edge of the pulse $B_0$ is later than that of the pulse $A_0$ and outputs a low level signal (L) when the timing of the rising edge of the pulse $B_0$ is earlier than that of the pulse $A_0$.

Accordingly, one pulse can be obtained in one cycle of change of a magnetic field or magnetism, and the frequency of the output pulse coincides with the frequency of the magnetic change. Therefore, when a constant relationship exists between the rotating frequency and the frequency of the magnetic change, the frequency of the output pulse $C_0$ indicates the rotating frequency.

FIG. 5 shows the timing relationship among the clock pulses $B_C$ and $A_C$, the divided pulses $A_0$ and $B_0$ output from counters 50 and 60, respectively, and the output pulse $C_0$ output from the timing comparator 70 when the frequency of the clock pulses $A_C$ is higher than that of the clock $B_C$.

The clock pulses $B_C$ and $A_C$ are divided, for example, by one-eighth in the counters 50 and 60, respectively. Therefore, a phase difference between the clock pulses $B_C$ and $A_C$ caused by a frequency difference $T_C$ can be obtained as the phase difference $T_D$ between the divided pulses $A_0$ and $B_0$ output from the counters 50 and 60, respectively.

Note that $T_D$ can be obtained as a phase difference eight times the frequency difference $T_c$, so the pulse phase difference can be detected stably.

The timing comparator 70 outputs signal $C_0$ corresponding to the output signal level (H) of the divided pulses $A_0$ at the time when the level of the divided pulses $B_0$ increases. Accordingly, the output signal $C_0$ is at a high level when the level of the divided pulses $B_0$ increases.

FIG. 6 shows the timing relationship among the clock pulses $B_C$ and $A_C$, the divided pulses $A_0$ and $B_0$ output from the counters 50 and 60, respectively, and the output pulse $C_0$ output from the timing comparator 70 when the frequency of the clock pulse $B_C$ is higher than that of the clock $A_C$.

As explained above, the timing comparator 70 outputs signal $C_0$ corresponding to the output signal level (L) of the divided pulse signal $A_0$ at the time when the level of the divided pulse signal $B_0$ increases. Accordingly, the output signal $C_0$ is at a low level when the level of the divided pulses $B_0$ increases.

Figure 7B:
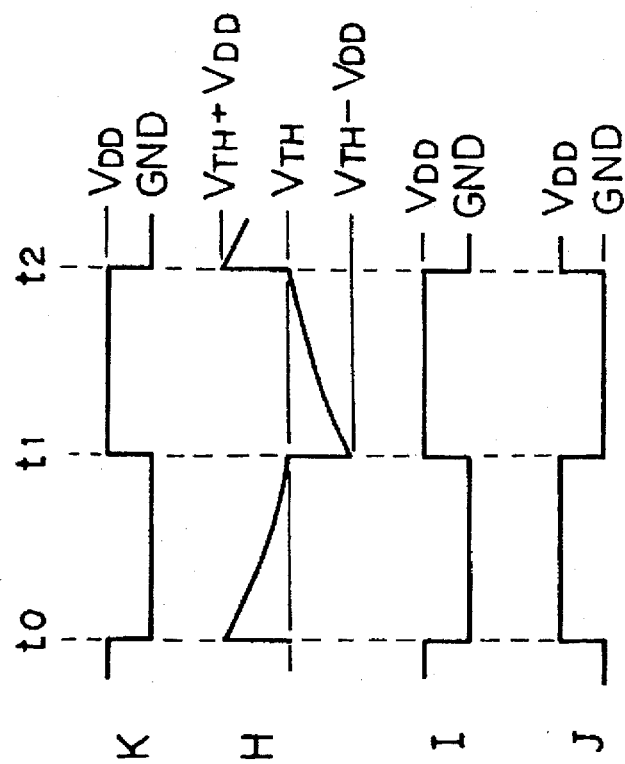
FIG. 7(b) shows an operational waveform obtained in the circuit shown in FIG. 7(a)
Figure 7A:
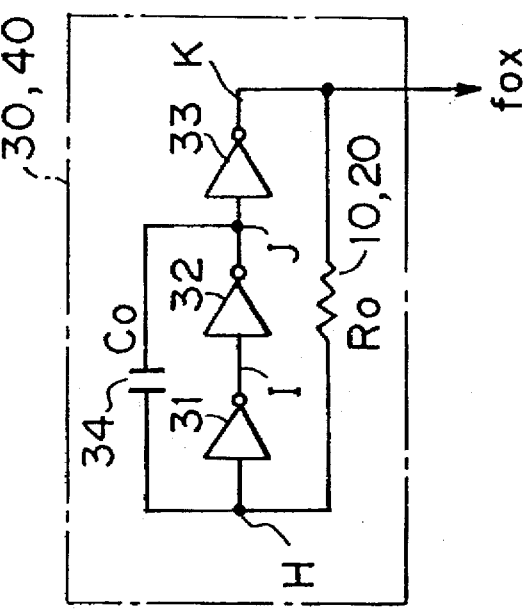
FIG. 7(a) shows an embodiment of an oscillating circuit used in the present invention.

FIG. 7(a) shows one example of a circuit construction of the oscillating circuits 30 and 40 and further explains the application of the known oscillating circuit of this embodiment. FIG. 7(b) shows operational waveforms obtained at the points K, H, I, and J indicated in FIG. 7(a). Serially arranged inverters 31, 32, and 33 are provided, and an input of the inverter 31 is connected to an output of the inverter 33 through an MRE 10 or 20 (having resistances of $R_0$). Further, an input of the inverter 31 is connected to an output of the inverter 32 through a capacitor 34.

According to this circuit, the oscillating frequency $f_0$ is defined by the following equation;

$$f_0 = \left[ -C_o R_o \left\{ l_n\left(\frac{V_{TH}}{V_{DD}+V_{TH}}\right) + l_n\left(\frac{V_{DD}-V_{TH}}{2V_{DD}-V_{TH}}\right) \right\} \right]^{-1}$$

When the threshold value VTH of the inverters 31, 32, and 33 is $V_{TH}=\frac{1}{2}V_{DD}$, the frequency $f_0$ is as follows;

$$f_0 = \frac{1}{2.2C_o R_o}$$

Note that the frequency $f_0$ above is determined by the charge/discharge time a time constant defined by the resistance Ro Of the MREs 10 and 20 and the capacitance of the capacitor 34.

Figure 8:
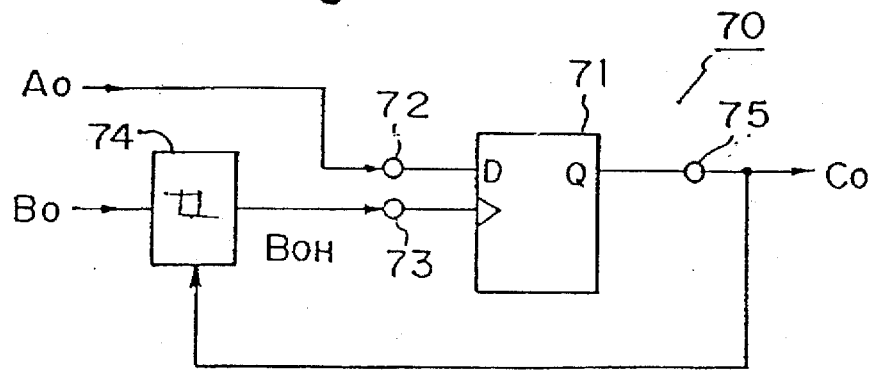
FIG. 8 shows one embodiment of a timing comparator.

FIG. 8 shows one example of a circuit construction which can be used in the timing comparator 70. In that, the output $A_0$ of the divided pulses from the counter 60 is input to a data input terminal 72 of a D-type flip-flop 71 triggered by a rising edge of an input pulse, while an output pulse $B_{OH}$ from a hysteresis control circuit 74 is input to the clock input terminal 73 of the D-type flip-flop 71.

The D-type flip-flop 71 outputs a signal corresponding to the output signal $A_0$ of the divided pulses input to the input terminal 72 of the flip-flop 71 when the output $B_0$ of the hysteresis control circuit 74 is increased. Therefore; the outputs $C_0$ of the timing comparator as shown in FIGS. 5 and 6 correspond to the pulse signal output from the output terminal 75 of the D-type flip-flop 71 shown in FIG. 8.

Figure 9:
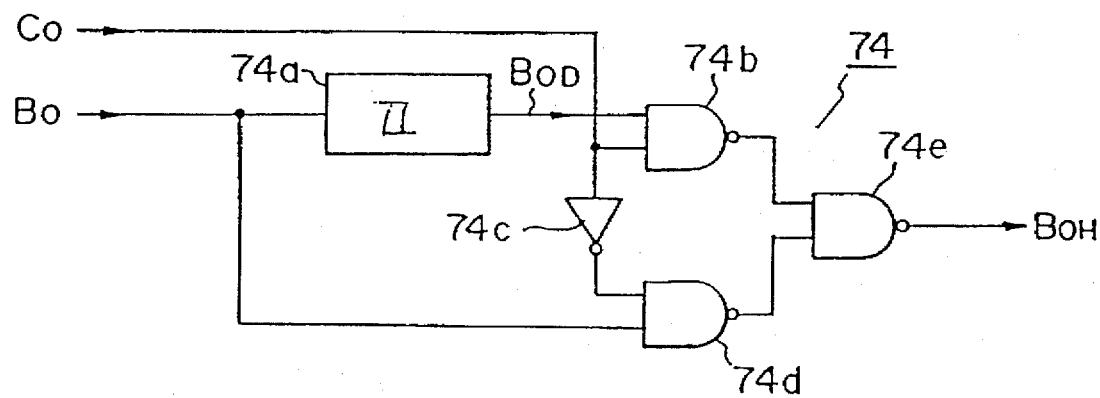
FIG. 9 shows one embodiment of a hysteresis control circuit.

FIG. 9 shows one example of a circuit construction of the hysteresis control circuit 74. This hysteresis control circuit 74 includes a NAND gate circuit 74b to which are input an output pulse $B_{OD}$ from a pulse delay circuit 74a, which receives the output of the divided pulses $B_0$, and an output $C_0$ from the D-type flip-flop, a NAND gate circuit 74d to which are input an output of an inverter 74c inverting the pulse signal $C_0$ and the output of the divided pulses $B_0$, and the output of the divided pulses $B_0$ and a NAND gate 74e to which are input the outputs of the NAND gates 74b and 74d and which outputs signal $B_{OH}$ used as a clock input of the D-type flip-flop 71.

Figure 10:
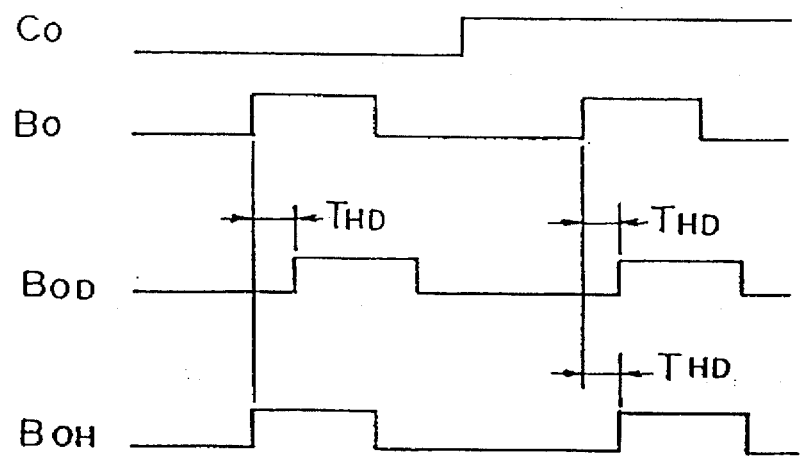
FIG. 10 is a timing chart showing an operation of the hysteresis control circuit.

FIG. 10 is a timing chart indicating operations of the hysteresis control circuit 74. As shown, the pulse delay circuit 74a outputs pulse $B_{OD}$ which is delayed from the output pulse $B_0$ by the delay time $T_{HD}$. When the output $C_0$ of the timing comparator is low, the output pulse $B_0$ is selected, whereby the pulse $B_0$ becomes the output $B_{OH}$ of the hysteresis control circuit, while when the output $C_0$ is high, the output pulse $B_{OH}$ is selected, whereby the pulse $B_{OD}$ becomes the output $B_{OH}$ of the hysteresis control circuit.

Note that, in this embodiment, the oscillating frequencies of the oscillating circuits 30 and 40 are determined by the resistances $R_0$ of the MREs 10 and 20, the capacitance $C_0$ of the capacitor, the characteristics of transistors in the inverters 31 to 33, and the like. These elements can be provided on one chip, whereby a pair of oscillating circuits having the same oscillating frequencies can be produced. Accordingly, when no magnetism affects the MRE 10 and 20 in the oscillating circuits 30 and 40, the oscillating frequencies of the two oscillating circuits 30 and 40 in one pair are almost the same.

Even if the temperature changes, as long as the whole chip is subjected to the same temperature, each of the three factors determining the oscillating frequencies as explained above equally changes so while the absolute values of the oscillating frequencies vary, the oscillating frequencies of the two oscillating circuits 30 and 40 in one pair are always equal. Therefore, the influence on the oscillating frequencies by temperature changes can be eliminated by detecting the ratio between the oscillating frequencies of the oscillating circuits 30 and 40 in one pair.

When magnetism affects a pair of the oscillating circuits 30 and 40, the resistances of the MREs 10 and 20 vary in accordance with changes in the magnetism and thereby the ratio of the oscillating frequencies will be changed. Note that this change of the frequency ratio is caused only by the magnetic condition.

In the present invention, when the source voltage changes, the effect on the oscillating frequencies can be compensated for by taking the ratio in the same manner as in the case of a temperature change.

As explained above, the operation of detecting magnetic conditions can be stably carried out under a widened range of ambient temperature of usage by detecting with the timing comparator 70 the change in the ratio between two oscillating frequencies generated from a pair of oscillating circuits 30 and 40, the oscillating frequency of which is determined in accordance with the magnetic condition.

The detection circuit of the present invention is basically constructed with digital circuits and therefore problems which occurred in analog circuits, for example, changes in the characteristics of transistors, changes of resistance values of resistors, and changes of the capacitance value of capacitors, do not occur. Thus, the detection device of the present invention can correctly operate at a high temperature at which no detection device consisting of analog circuits can correctly operate. Further, the detection device of the present invention can be easily formed by an integrated circuit.

Generally speaking, when a conductive layer 1c is connected to a lead frame 1d with a bonding wire 1f, the bonding wire 1f should be bonded with a predetermined curvature in order to keep a certain tensile strength, but in this embodiment, since the bonding wire 1f is connected to the surface of the thin portion 1i of the insulating substrate 1a, the gap between the MRE 1b (10, 20) and the molding resin 1g can be reduced, and the distance between the MRE 1b (10, 20) and the rotating gear 9 can also be reduced as small as possible, thus improving the sensitivity.

Figure 11:
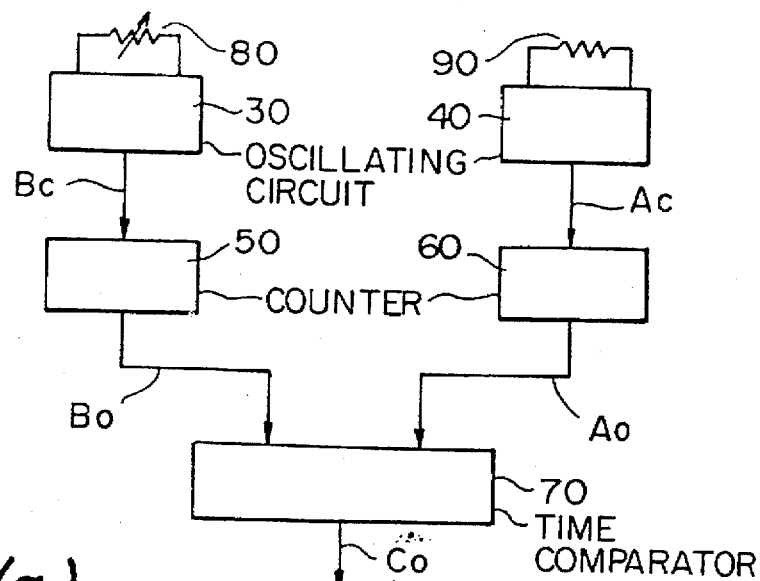
FIG. 11 is a block diagram of another detection circuit of the first aspect of the present invention.

Another detection circuit of the first aspect of the present invention by which the sensitivity of the detection device is improved will be explained hereunder. FIG. 11 is a block diagram of a detection circuit. In the first example, the MRE was used in both the oscillating circuits 30 and 40, in this example, an MRE 80 is used only in the oscillating circuit 30. In the oscillating circuit 40, an ordinary reference resistor 90 is used, and the resistance does not change with magnetic changes.

Figure 12A:
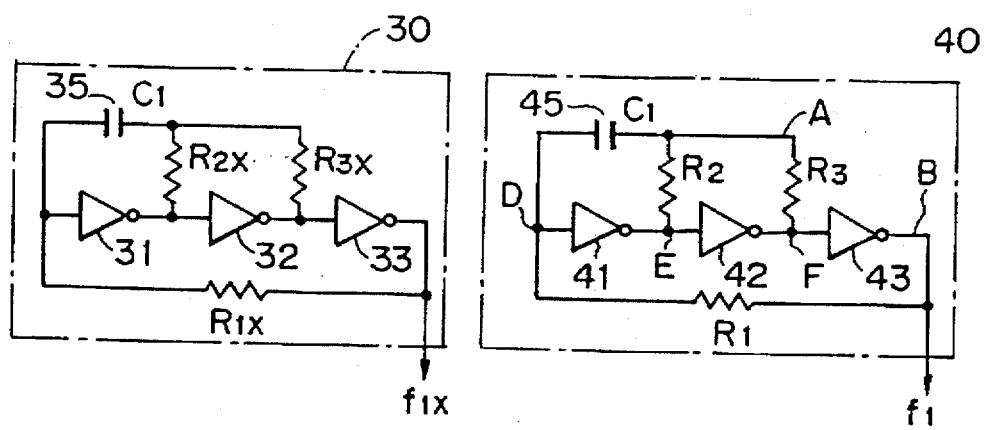
FIG. 12(a) shows one embodiment of an oscillating circuit used in the circuit of FIG. 11.
Figure 12B:
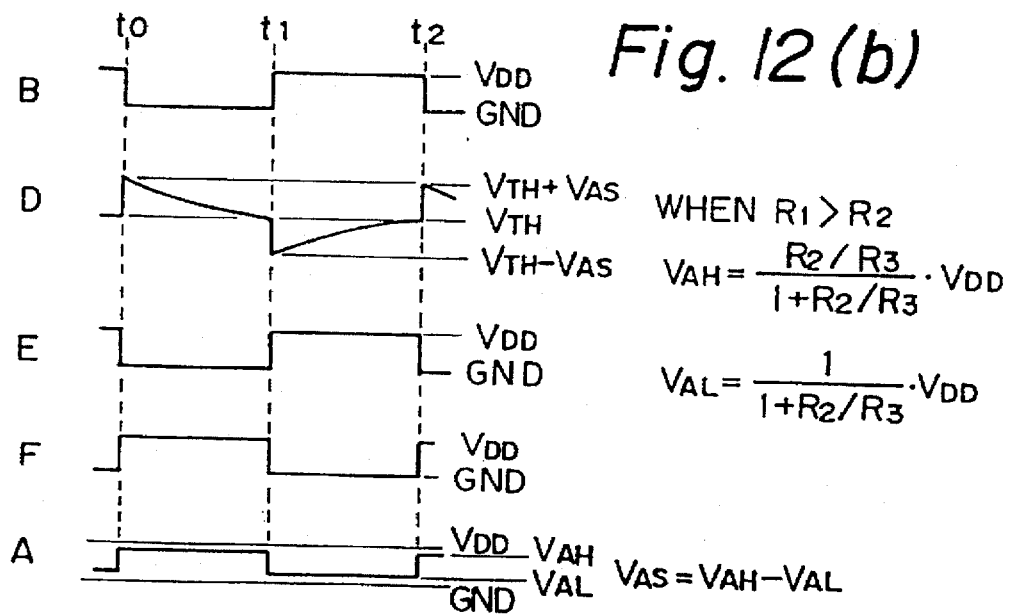
FIG. 12(b) shows an operational waveform obtained in the circuit shown in FIG. 12(a)

FIG. 12(a) shows the specific construction of the oscillating circuits 30 and 40, important elements in this example, and FIG. 12(b) shows operational waveforms obtained at the points B, D, E, F, and A shown in FIG. 12(a).

Figure 31:
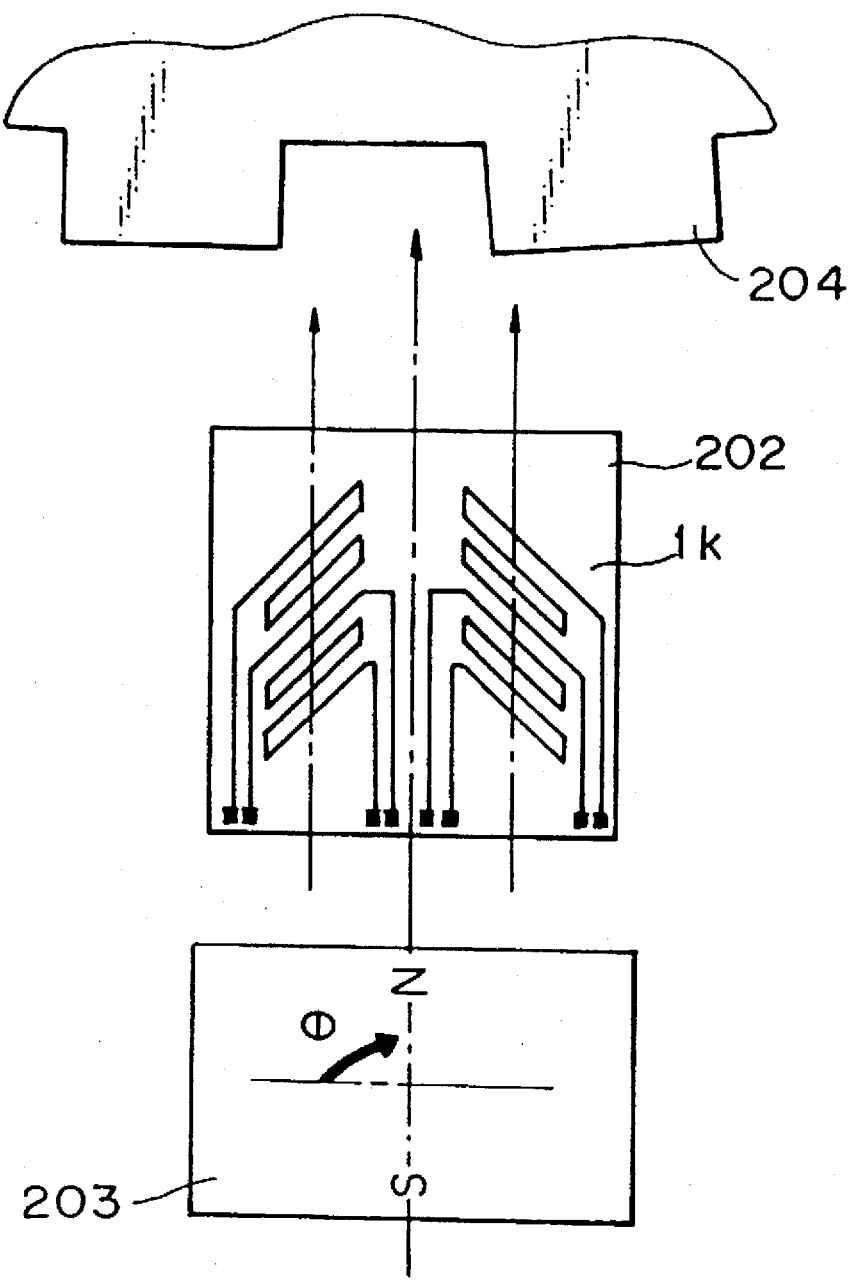
FIG. 31 shows the mutual relationship of arrangements among a magnet, an insulating substrate on which NREs are mounted, and an object to be detected in the device shown in FIG. 26.

In FIGS. 12(a), 31(41), 32(42), and 33(43) denote inverters serially connected in the same manner as shown in FIG. 7.

In that circuit, an input of the inverter 31(41) is connected to an output of the inverter 33(43) through a resistor $R_{1X}$ ($R_1$) and the input of the inverter 31(41) is connected to an output of the inverter 31(41) through a serially connected capacitor 35(45) and resistor $R_{2X}$ ($R_2$), while a node point formed between the capacitor 35(45) and the resistor $R_{2X}$ ($R_2$) is connected to an output of the inverter 32(42) through a resistor $R_{3X}$ ($R_3$). As explained later, at least one of the resistors $R_{1X}$, $R_{2X}$, and $R_{3X}$ in the oscillating circuit 30 is replaced by the MRE 80.

The oscillating frequency $f_1$ of the oscillating circuits 30 and 40 is represented by the following equation;

$$f_1 = \left[ -C_1R_1 \left\{ l_n \frac{V_{TH}}{R_{2(X)}-R_{3(X)}} \cdot V_{DD} + V_{TH} + l_n \frac{V_{DD}-V_{TH}}{R_{2(X)}+R_{3(X)}} \cdot V_{CC} - V_{TH} \right\} \right]^{-1}$$

When a threshold value $V_{TH}$ of the inverters 31(41), 32(42), and 33(43) is $V_{TH}=1/V_{DD}$, the frequency $f_1$ is represented as follows;

$$f_1 = \left\{ -2C_1R_1 l_n \cdot \frac{R_{2(X)}/R_{3(X)}+1}{3(R_{2(X)}/R_{3(X)})-1} \right\} - 1$$

The potential at point A is determined by dividing the voltage between the points E and F utilizing the resistors ($R_{2(X)}$, $R_{3(X)}$).

Here, a voltage having a high level is represented by $V_{AH}$, and a voltage having a low level is represented by $V_{AL}$. The difference therebetween is represented by $V_{AS}$. When a voltage at the point D (an input voltage to the inverter 31(41)) reaches a threshold value $V_{TH}$ of the inverter 31(41), the voltage of each point E, F, and B is reversed in turn and the voltage at the point D is shifted to both the plus and minus directions with an amplitude of $V_{AS}$ with respect to a center level of $V_{TH}$. Then, when the voltage at the point D again approaches the threshold value $V_{TH}$ due to the charge/discharge operation of a capacitor $C_1$ and a resister $R_{1(X)}$, the same operation as mentioned above is repeated.

Note that when the differential voltage is increased, the frequency $f_1$ falls, and vice versa In the first example, the oscillating frequency $f_0$ was determined by the charge/discharge time caused by the capacitor $C_0$ and resistor $R_0$. In this example, the voltage at the point A can be controlled by the resistors $R_{2(X)}$ and $R_{3(X)}$, increasing the flexibility of control of the frequency.

Next, the difference between the sensitivity of the oscillating circuit used in the first example shown in FIG. 7 and that of the second example shown in FIG. 12 will be explained utilizing experimental data.

The situation mentioned above will be explained with reference to FIG. 19. In the oscillating circuit as shown in FIG. 7(a), the resistance of the resistor $R_0$ is changed so as to modulate the frequency.

Note that when the resistance of the resistor $R_0$ is changed to $R_0+\Delta R_0$ the slope indicating the charge/discharge and which determines the frequency thereof, is shown by the characteristic curve L in FIG. 19(a). Conversely, when the resistance is changed to $R_0-\Delta R_0$, the slope is shown by the characteristic curve M. Thus, modulation of the frequency $\Delta T_0$ will occur due to the resistance being changed from $R_0+\Delta R_0$ to $R_0-\Delta R_0$. In this situation, the voltage at point H at the time=0 is increased to $V_{TH}+V_{DD}$ and is kept constant.

Figure 19:
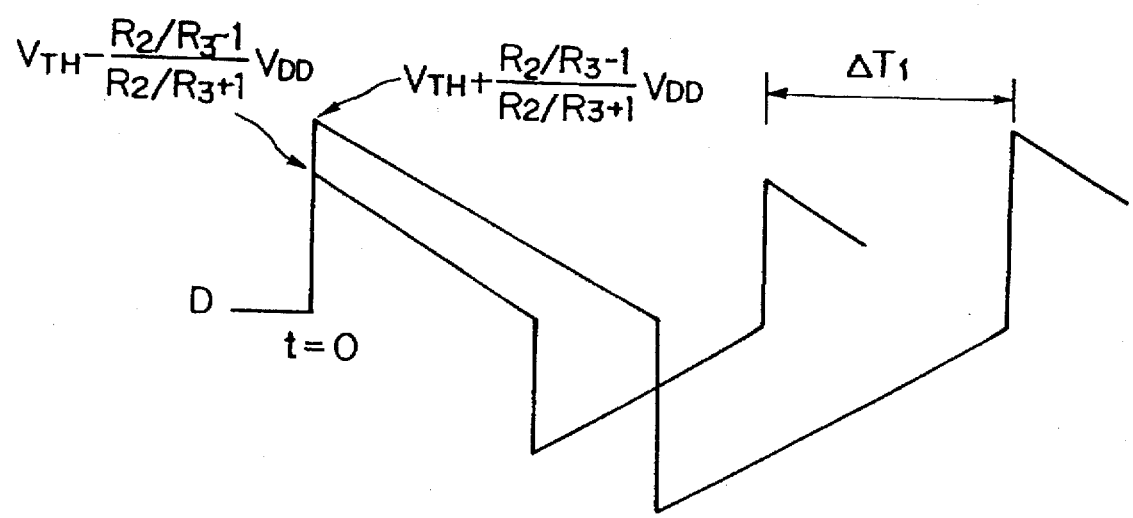
FIG. 19 is a graph of a charge/disenarge operation at point D of the oscillating circuit shown in FIG. 12(a)

On the other hand, in the oscillating circuit shown in FIG. 12(a), change of the resistance of the resistor $R_{1(X)}$ as well as the resistors $R_2$ and $R_3$ is used as a frequency modulating means. The resistors $R_1$, $R_{2(X)}$, and $R_{3(X)}$ are formed by MREs. They are arranged so that the direction of change of resistance are $R_{1X}+\Delta R_{1X}$, $R_{2X}+\Delta R_{2X}$, and $R_{3X}+\Delta R_{3X}$, respectively, under a predetermined magnetic field. Namely, when the resistors $R_{1X}$ and $R_{2X}$ are arranged in an in-phase relationship with each other and the resistors $R_{3X}$ and $R_{1X}$ are arranged in an opposite-phase relationship, (1) When $R_{1X} \rightarrow R_{1X}+R_{1X}$, $R_{2X} \rightarrow R_{2X}+\Delta R_{2X}$, and $R_{3X} \rightarrow R_{3X}-R_{3X}$ The charge/discharge slope is identical to that in the oscillating circuit shown in FIG. 7(a). The voltage at time t=0 is shown by the following equation as shown in FIG. 19:

$$\left[ V_{TH} + \frac{R_{2X}/R_{3X} - 1}{R_{2X}/R_{3X} + 1} \cdot V_{DD} \right]$$

Note that when the time constant of the charge/discharge operation is elongated due to the resistance of the resistor $R_{1X}$ increasing to $R_{1X}+\Delta R_{1X}$, the voltage (voltage for starting charge/discharge operation) at time=0 is increased.

(2) When $R_{1X} \rightarrow R_{1X}-\Delta R_{1X}$, $R_{2X} \rightarrow R_{2X}-\Delta R_{2X}$, and $R_{3X} \rightarrow R_{2X}+\Delta R_{3X}$ The charge/discharge slope is identical to that in the oscillating circuit shown in FIG. 7(a). The voltage for starting the charge/discharge operation at time t=0 is shown by the following equation:

$$\left[ V_{TH} + \frac{R_{2X}/R_{3X} - 1}{R_{2X}/R_{3X} + 1} \cdot V_{DD} \right]$$

Note that when the time constant of the charge/discharge operation is shortened due to the resistance of the resistor decreasing to $R_1-\Delta R_1$, the voltage at time=0 is decreased.

As explained above, the phase of the change of resistance can be arbitrarily set as above by adding the resistors $R_2$ and $R_3$ formed as MREs to the oscillating circuit shown in FIG. 7(a). The voltage for starting the charge/discharge operation can also be modulated as one of the means to modulate the frequency other than the conventional modulating method utilizing adjustment of a time constant in a charge/discharge operation. Accordingly, in this example, a large modulation $\Delta T_1$ of the period can be obtained and thus the frequency thereof can be changed considerably.

Next, the difference between sensitivities of the oscillating circuit shown in FIG. 7(a) and FIG. 12(a), will be explained. Simultaneously, a method for selection of the resistance values of the resistors in the oscillating circuit shown in FIG. 12(a) for improving the sensitivity thereof will be explained.

Note that in this example, the sensitivity is represented by the following equation;

$$\text{Sensitivity} = \left[ \frac{\Delta f/f}{\Delta R/R} \right]$$

First the sensitivity of the oscillating circuit shown in FIG. 7 is calculated as follows:

$$\text{Sensitivity} = \frac{f_0/f_0}{R_0/R_0} = \frac{R_0}{f_0} \cdot \frac{f_0}{R_0}$$

$$= 2 \cdot 2 \cdot C_0 R_0^2 \cdot \frac{1}{2 \cdot 2 \cdot C_0} \left[ -\frac{1}{R_0^2} \right]$$

Therefore, when the change in resistance is 1%, the change of the frequency is 1% (absolute value).

On the other hand, the sensitivity of the oscillating circuit shown in FIG. 12(a) is shown in Table 1. In this table, the resistance is assumed to be varied as follows:
R1—increase by 1%
R2—increase by 1%
R3—decrease by 1%

Further, the ratio $R_2/R_3$ is used as a parameter, and a capacitance $C_1$ is set at 220 pF.

TABLE 1

| Parameter | No change in Resistance | | | | 1% change in Resistance | | | | |
|---|---|---|---|---|---|---|---|---|---|
| Sensitivity (%) $R_2/R_3$ | ($\Omega$) $R_1$ | ($\Omega$) $R_2$ | ($\Omega$) $R_3$ | (Hz) $f_1$ | ($\Omega$) $R_{1X}$ | ($\Omega$) $R_{2X}$ | ($\Omega$) $R_{3X}$ | (Hz) $f_{1X}$ | $f_1 - f_1{}_X/f_1$ |
| 1.5 | 10 K | 1.5 K | 1 K | 642 K | 10.1 K | 1.515 K | 1.01 K | 675 K | 4.8 |
| 2.0 | | 2.0 K | | 432 K | | 2.02 K | | 455 K | 3.0 |
| 3.0 | | 3.0 K | | 321 K | | 3.03 K | | 328 K | 2.0 |
| 4.0 | | 4.0 K | | 238 K | | 4.04 K | | 288 K | 1.7 |
| 5.0 | | 5.0 | | 264 K | | 5.05 | | 268 K | 1.5 |

Figure 20:
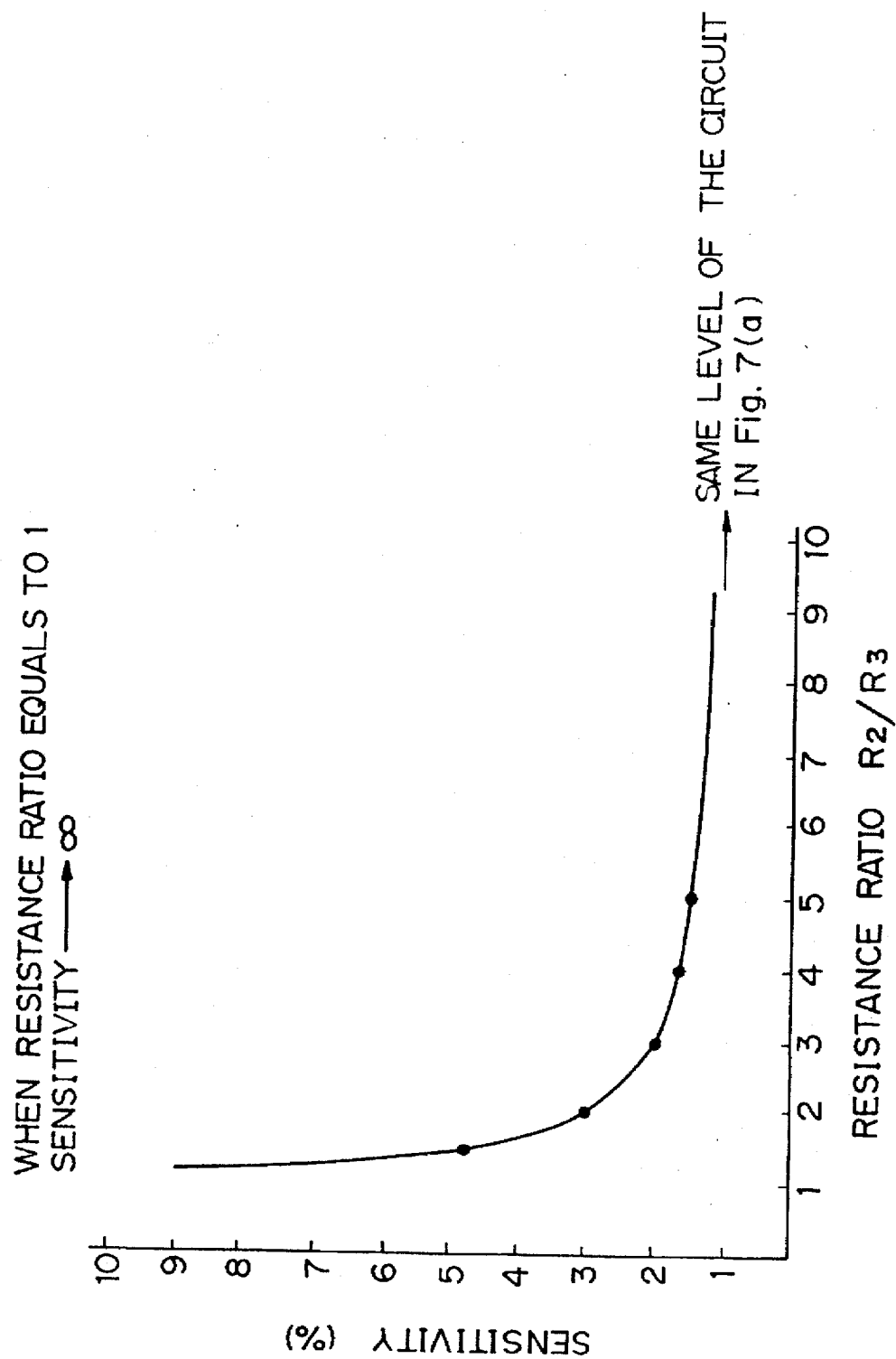
FIG. 20 is a graph of the relationship between the sensitivity and the resistance ratio $R_2/R_3$.

From Table 1, the curve shown in FIG. 20 is obtained.

As is clear from the graph, when the resistance ratio $R_2/R_3$ is increased, the sensitivity is reduced and approaches that of the oscillating circuit shown in FIG. 7(a). While, when the resistance ratio $R_2/R_3$ approaches 1, the sensitivity becomes infinity. In this situation, the oscillating frequency is also infinity, so the oscillation per se becomes unstable.

Therefore, the most suitable resistance values of the resistors $R_1$, $R_2$, and $R_3$ are determined by the following;

(1) The resistance values of the resistors $R_1$, $R_2$ and $R_3$ should be sufficiently larger than the internal resistance of the inverter.

(2) When the resistance values of the resistors $R_1$, $R_2$, and $R_3$ are small, the amount of current consumed will increase.

(3) When the resistance values of the resistors $R_1$, $R_2$ and $R_3$ are large, the impedance of the sensing portion will increase, whereby the sensitivity will be weakened against noise.

From these, the resistance values of the resistors $R_1$, $R_2$, and $R_3$ are suitably set at 1 k$\Omega$ to 10 k$\Omega$.

Further, (1) When the ratio $R_2/R_3$ approaches 1, the sensitivity will be improved, but the oscillation thereof will be unstable.

(2) When the ratio $R_2/R_3$ exceeds 10, the sensitivity is not so different from that of the oscillating circuit shown in FIG. 7(a).

For these reasons, the ratio $R_2/R_3$ is suitably set at 1.5 to 4.

Experimental data of the sensitivity characteristics in the oscillating circuits shown in FIG. 7(a) and FIG. 12(a) will be disclosed hereunder.

(1) Oscillating Circuit Shown in FIG. 7(a)

When devices TC40H004 (produced by Toshiba Co. Ltd.) are used as the inverters, and the resistance $R_0$, the capacitance $C_0$, and source voltage $V_{DD}$ are set at 10 k$\Omega$, 220 pF, and 5 V, respectively, the sensitivity is 0.82 at room temperature (this means a change of frequency of 0.82% with respect to a 1% change of the resistance value).

13

(2) Oscillating Circuit Shown in FIG. 12(a)

The sensitivity is examined in the following four cases in the case of devices TC40H004 (produced by Toshiba Co. Ltd.) used as the inverters, and the resistances $R_{1x}$ and $R_{3x}$, the capacitance $C_1$, and source voltage $V_{DD}$ set at 10 kΩ and 2 or 1 kΩ, 220 pF, and 5 V, respectively, utilizing a parameter of $R_{2(x)}/R_{3(x)}$ and changing the value $R_{2(x)}$ at room temperature.

(1) The value $R_{1x}$ is varied from 0 to 2%,
(2) The value $R_{2x}$ is varied from 0 to 2%,
(3) The values of both $R_{1x}$ and $R_{2x}$ are simultaneously varied from 0 to 2% by the same ratio,
(4) The absolute values of both $R_{2x}$ and $R_{3x}$ are simultaneously varied from 0 to 2% by the same ratio, but one positive increment and the other negative.

Figure 13A:
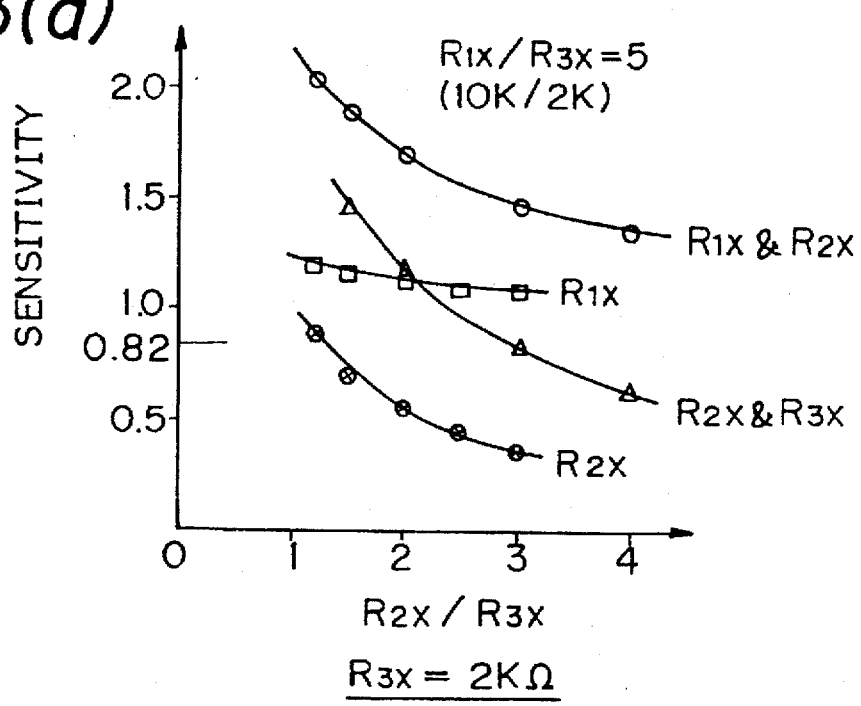
FIGS. 13(a) and 13(b) show results of experiments on the sensitivity of an oscillating circuit.
Figure 13B:
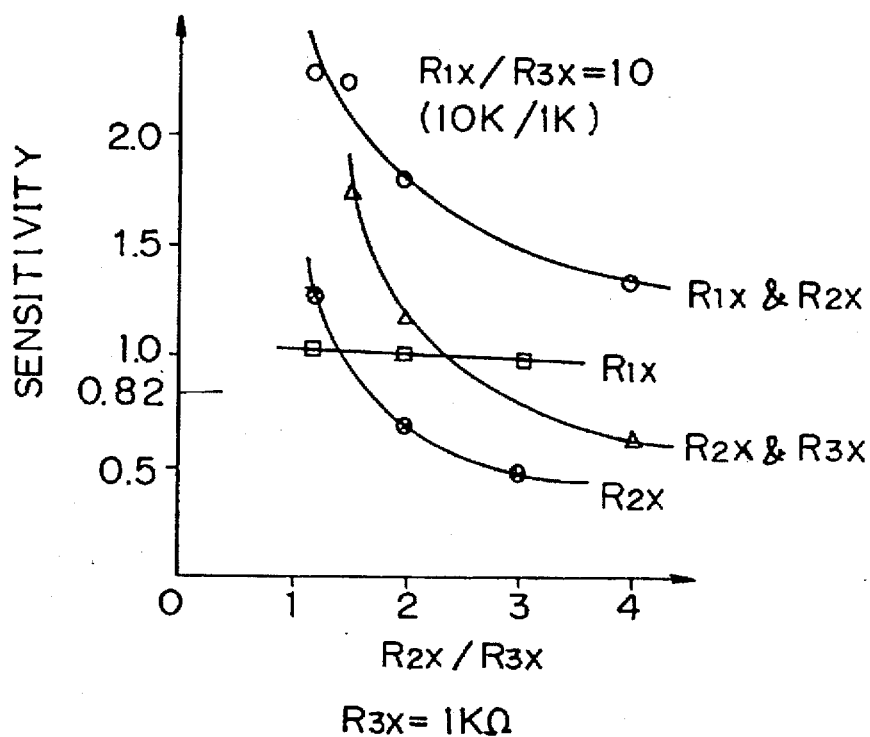

The results obtained by these experiments are shown in FIGS. 13(a) and 13(b), respectively.

Figure 14:
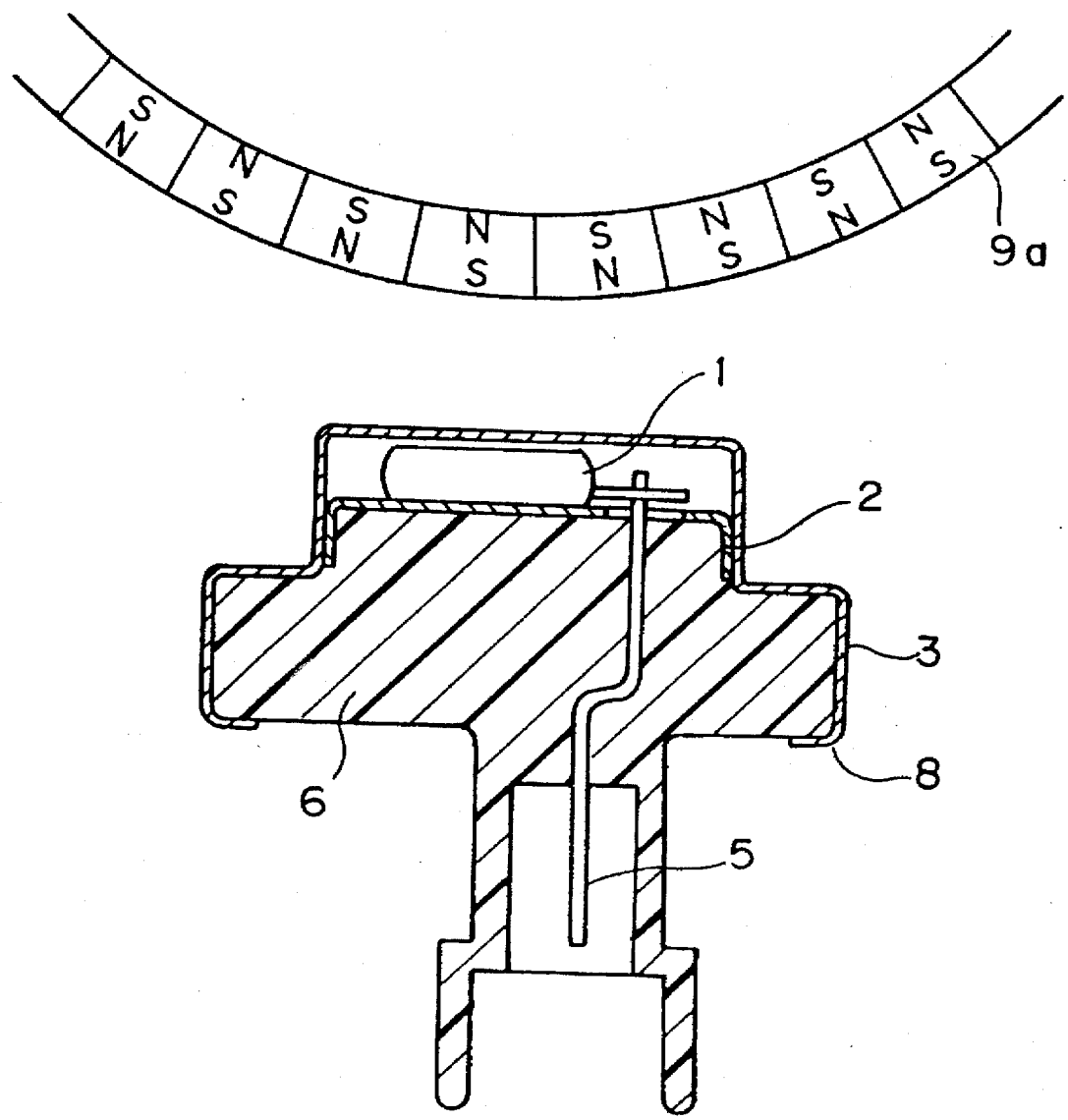
FIG. 14 shows another magnetic detection device of the first aspect of the present invention.

From these results, it will be understood that the sensitivity of the oscillating circuit shown in FIG. 12(a) can be increased by more than 2.5 times that of the oscillating circuit shown in FIG. 7 with a combination of changes of the resistances. Various modifications of the above examples are possible as shown by (9a) to (5) below:

(1) While FIG. 1 showed a gear 9 which is not magnetized, if a gear 9a as shown in FIG. 14 is magnetized with alternately arranged N poles and S poles, the bias magnet 4 shown in FIG. 1 can be omitted.

Figure 15A:
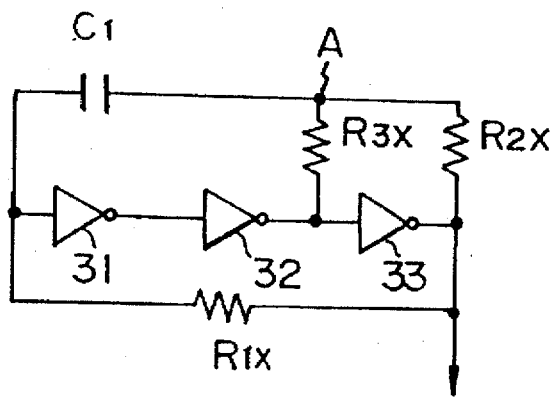
FIGS. 15(a), 15(b), and 15(c) show another embodiment oscillating circuit used in the circuit of FIG. 11.
Figure 15B:
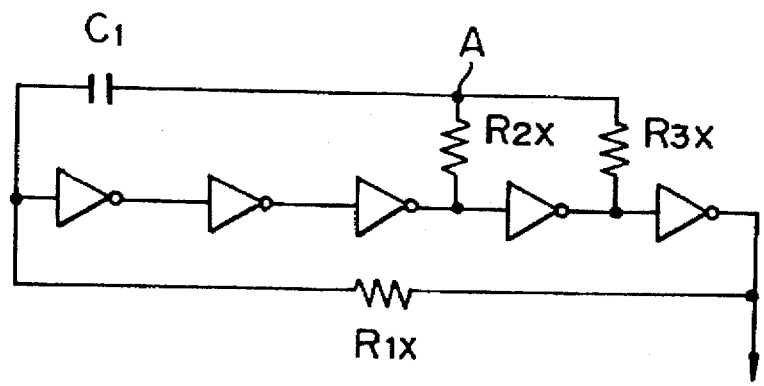
Figure 15C:
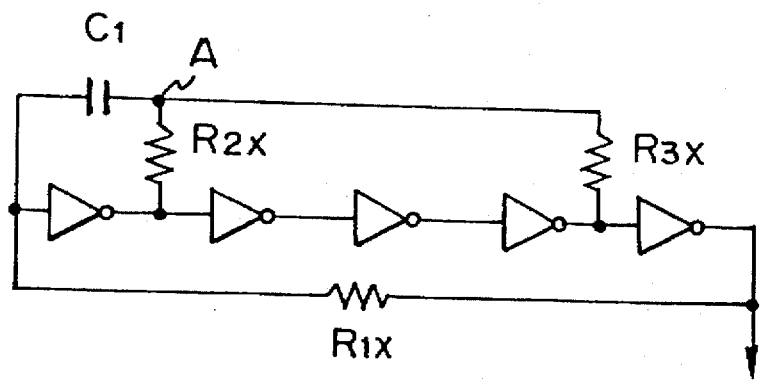

(2) The construction of the oscillating circuit in the second example may be formed as shown in any one of FIGS. 15(a), 15(b), and 15(c). When the construction shown in FIG. 15(a) is used, the positions to which the resistors $R_{2x}$ and $R_{3x}$ are connected may be changed to the outputs of the inverters 32 and 33, respectively. When the construction shown in FIG. 15(b) is used, the number of inverters may be varied to another odd number exceeding 3. Further, when the construction shown in FIG. 15(c) is used, the number of inverters connected between the resistors $R_{2x}$ and $R_{3x}$ may be any odd number exceeding 1.

In other words when an oscillating circuit having a high sensitivity is formed by adding the resistors $R_{2x}$ and $R_{3x}$ to the circuit construction as shown in FIG. 7(a), use may be made of a MREs for resistors $R_{1x}$ to $R_{3x}$ so that the voltage may be set at the point A between the resistors $R_{2x}$ and $R_{3x}$ and so that the voltage at the point A can be varied when the oscillating circuit is subjected to magnetism.

In this case, when the ratio of the resistors $R_{2x}$ and $R_{3x}$ ($R_{2x}/R_{3x}$), is less than 1, the oscillating circuit stops oscillating because that ratio falls outside of the condition in which the circuit can operate stably. Thus, the ratio is set at exceeding 1. Further, when one or more of the resistors $R_{1x}$, $R_{2x}$, and $R_{3x}$ is formed by an MRE, the circuit can be used as a frequency modulator, but when the sensitivity is required to be much higher, at least two of the resistors $R_{1x}$, $R_{2x}$, and $R_{3x}$ must be formed by an MREs.

(3) In the second example, the cases were shown in which the resistors $R_{1x}$ and $R_{2x}$ or the resistors $R_{2x}$ and $R_{3x}$ were replaced by MRES and the resistance changed. If the resistances are changed simultaneously by the same ratio, the design work for these oscillating circuits can be simplified.

(4) In the above examples, two oscillating circuits were used, but three or more oscillating circuits can be used and the outputs thereof compared with each other.

Figure 16A:
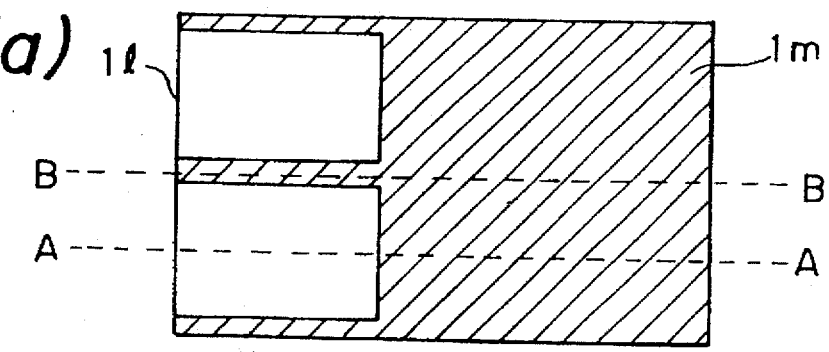
FIGS. 16(a) to 16(f) illustrate a method making a thin portion in an insulating substrate.
Figure 16B:
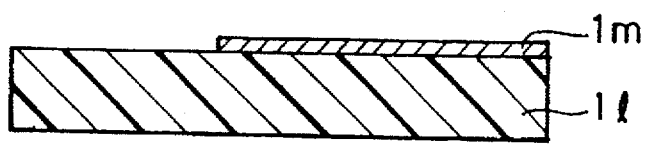
Figure 16C:

(5) In the first example, the sensitivity of the device was improved by connecting the bonding wire 1f to the thin portion 1i of the insulating substrate 1a as shown in FIG. 2. This may be produced by the method shown in FIG. 16(a) to 16(f). First, as shown in FIG. 16(a), an oxide film 1m (indicated by hatching) is formed on the surface of a silicon (Si) substrate 11, the cross-sectional views of which taken from a line A—A and a line B—B in FIG. 16(a) are shown in FIGS. 16(b) and 16(c), respectively.

Figure 16D:
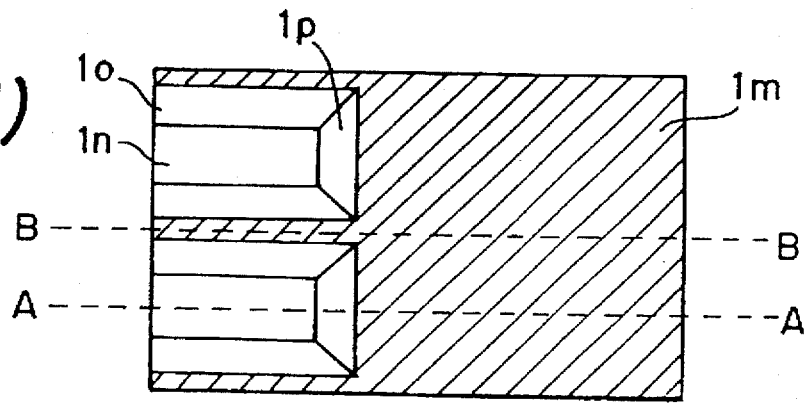
Figure 16E:
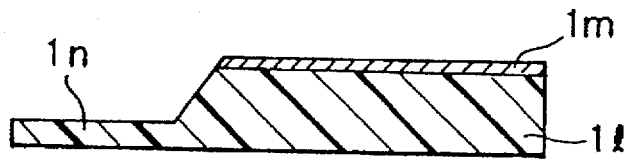
Figure 16F:
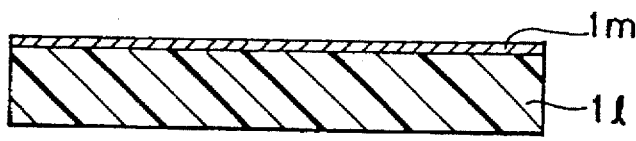

After that, an isotropic etching using an alkaline substance is applied and the configuration of the substrate is changed to that as shown in FIG. 16(d), whereby the thin portion in and tapered portions 1o and 1p are formed. Cross-sectional views taken from a line A—A and a line B—B in FIG. 16(d) are shown in FIGS. 16(e) and 16(f), respectively.

Figure 17A:
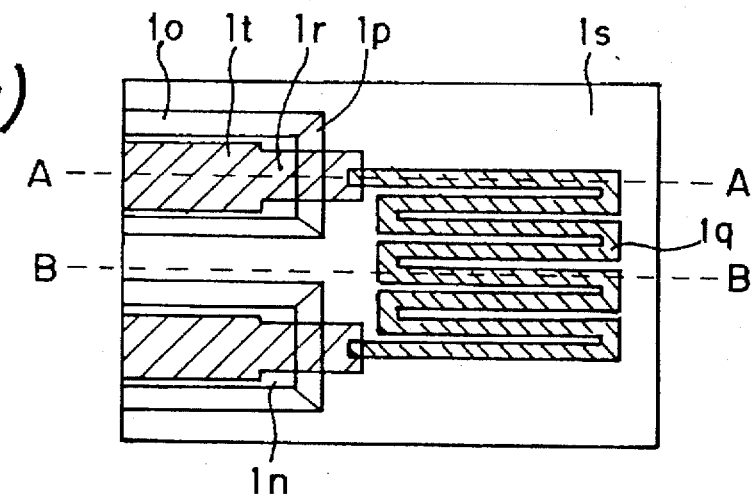
FIGS. 17(a) to 17(c) show a circuit construction in which an MRE and a conductive layer are formed on the insulating substrate.
Figure 17B:
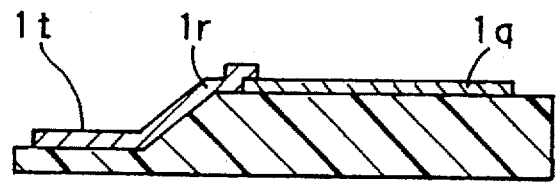
Figure 17C:
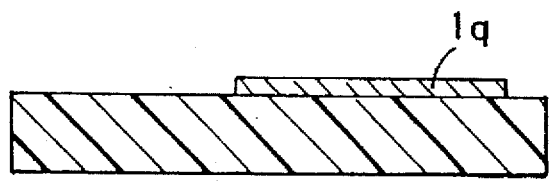
Figure 18:
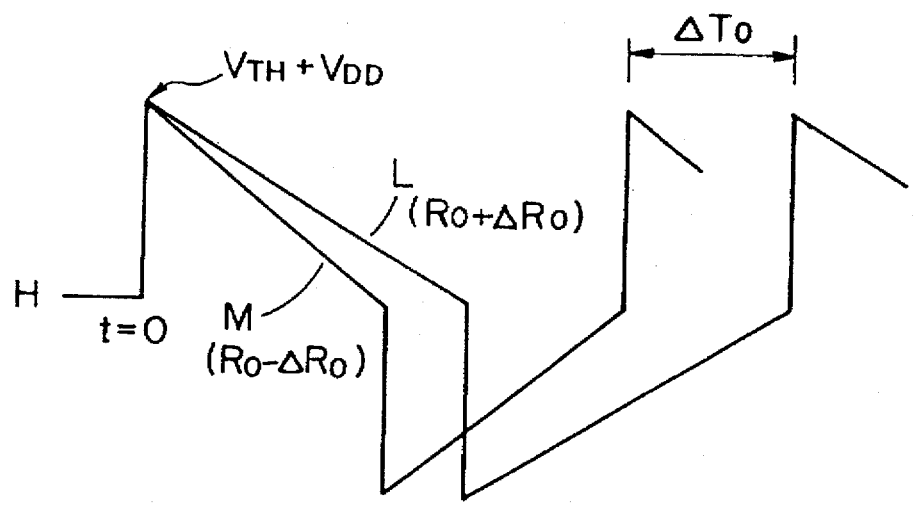
FIG. 18 is a graph of a charge/discharge operation at point H of the oscillating circuit shown in FIG. 7(a)

FIGS. 17(a) to 17(c) show a circuit construction in which an MRE 1q and an conductive layer 1r are formed on the insulating substrate thus produced above. The MRE 1q is formed on the surface of the thick portion 1s of the insulating substrate 1a with a zig-zag configuration as shown in FIG. 17(a). The conductive layer 1r is formed to cover the thick portion 1s, the tapered portion 1p, and the thin portion in of the insulating substrate 1a. Finally, a bonding pad it is provided on the thin portion 1n. Cross-sections along a line A—A and a line B—B in FIG. 17(a) are shown in FIGS. 17(b) and 17(c), respectively.

In FIGS. 17(a) to 17(c), the bonding pad 1t provided on the surface of the thin portion 1n is surrounded by the thick portions in three directions, so the strength of the thin portion will be increased at the bonding operation. Further, the bonding pad it may be mounted on the surface of the insulating substrate without applying the etching operation to the substrate to make the tapered portions.

As explained above, in accordance with the first invention of this application, a magnetoresistance device which can stably work in a widened range of an ambient temperature in which the device is used and is suitable for making an integrating circuit, can be provided and further, in accordance with the second invention, the sensitivity of the magnetoresistance device can be improved.

According to the first aspect of the present invention, when magnetism does not affect the magnetoresistance effective device (MRE) provided in an oscillator circuit, the oscillating frequency of both first and second oscillator circuits mostly coincide with each other.

And when a temperature is varied, the absolute value of each oscillating frequency is changed, although the condition is not changed as long as the whole circuit is experiencing the same uniform temperature.

Therefore, the influence caused by a temperature change can be eliminated by comparing and processing the oscillating frequencies of both oscillator circuits.

When magnetism affects the oscillator circuit, a resistance value of the MRE is varied in accordance with a condition of the magnetism whereby a difference is created between both oscillating frequencies which are otherwise equal to each other, causing a ratio of both oscillating frequencies to change.

Note that this variation of the ratio of both oscillating frequencies is created depending only upon a condition of a magnetic field.

On the other hand, variation of a voltage source, can be compensated for by utilizing the same ratio of both oscillating frequencies as used in a case of the temperature variation.

Accordingly, a detecting operation for a magnetic condition can be carried out stably under a wide range of ambient temperatures in which the detector is used.

In accordance with another embodiment of the present invention as above, since a potential of the node portion defined between the second and third resisters is changed when the MRE detects a magnetic field, an oscillating frequency can be controlled not only by a charge/discharge operation caused by the first resister and the capacitor but also by the potential of the node point and thus a variation of the frequency can be amplified with respect to a variation of a resistance value leading to an improved detecting sensitivity thereof.

A magnetoresistance effective element (MRE) used in this embodiment can have a resistance value thereof varied in response to a variation of a magnetic field. Any kind of elements having such a function as mentioned above can be used, for example a Hall device, a ferromagnetic magnetoresistance element (MRE), and an element including a capacitor instead of a resister or the like.

As explained above, when the magnetoresistance effective element is used in a magnetism detecting device utilizing a bias magnet, a relationship between the amount of oscillation of a magnetic field and a position on which the magnetoresistance effective element is arranged is very important and the sensitivity thereof depends upon the relationship and therefore the setting. Operation of the magnetoresistance effective element in this device and what kind of magnetoresistance effective element is used, are key factors in obtaining an accurate output signal indicating an amount of the variation of the magnetism.

Therefore, the next embodiment of the present invention relates to a magnetism detecting device which can be used in a physical quantity detecting device as one embodiment explained later and which can be replaced with the magnetism detecting circuit as shown in previous embodiments.

FIG. 21(a) shows another example of a conventional magnetic detection device which detects a rotational speed of a rotating body with a rotating gear 204. The gear 204 is made of magnetic material, and a magnet 203 for generating a bias magnetic field is provided. When the gear is rotated, the lines of magnetic force of the bias magnetic field are periodically changed by projecting portions and concave portions to vary with a sine wave form in an A—A' direction in accordance with the relative position of the gearteeth, as shown in FIG. 21(a). This change has been detected heretofore by a plurality of MREs 201a, 201b, 201c, 201d, etc. arranged on an insulating substrate 202 which is provided in a plane perpendicular to a direction of the bias magnetic field.

The magnetic detection device explained above detects the change of intensity of the magnetic field generated inside the plane of the MREs, caused by the change of the angle of the magnetic field, as a change of resistance. The intensity of the magnetic field generated in the plane of the MREs is usually not sufficient to saturate changes in the resistance variation of the MREs and thus the sensitivity and the accuracy of the device depends significantly upon the intensity and angle of the bias magnetic field generated by the bias magnet.

The theory of the change of the resistance of the MREs will be explained with reference to FIGS. 22(a) to 22(c). These Figures show the change of resistance of an the MREs 201 when a magnetic angle is changed in a plane perpendicular to a surface of the insulating substrate 202 on which the MREs 201 are provided and either parallel to or perpendicular to the direction of a current I flowing in the MREs (direction indicated by arrow) under an intensity of a magnetic field saturating the MREs 201.

Figure 22A:
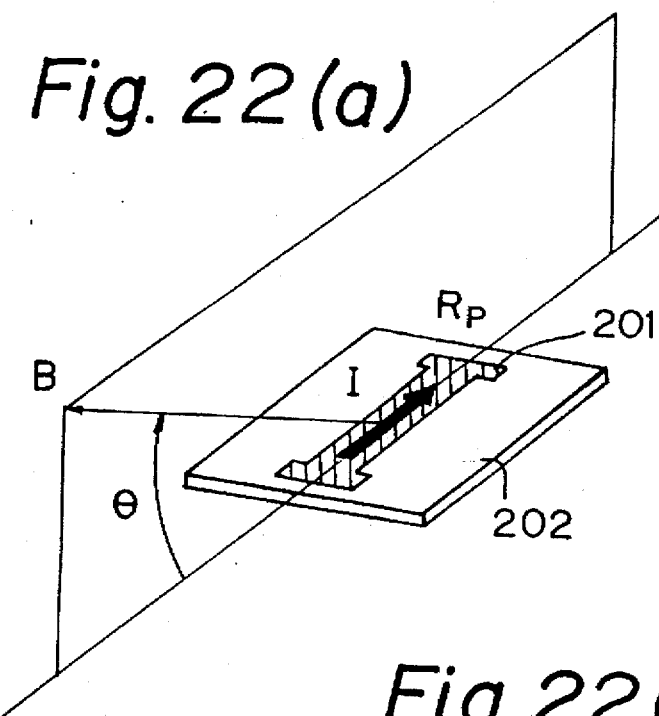
FIG. 22(a) is a perspective view of a magnetic field angle in a plane perpendicular to the insulating substrate on which MRES are formed and parallel to the longitudinal direction of the MRE.
Figure 22B:
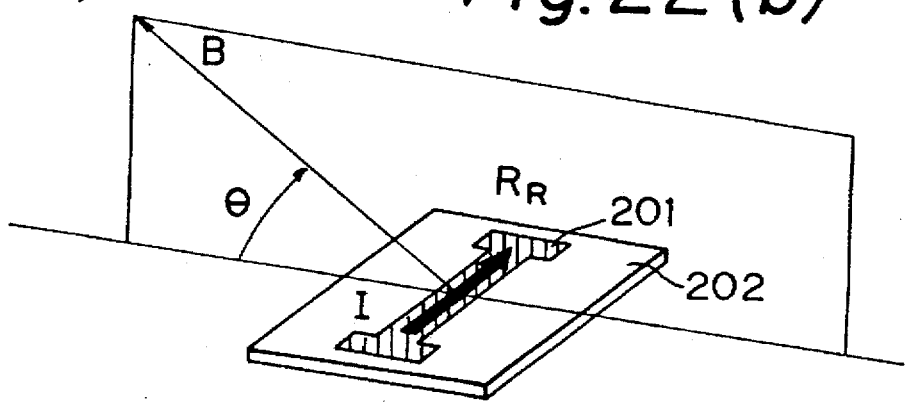
FIG. 22(b) is a perspective view of a magnetic field angle in a plane perpendicular to the insulating substrate on which MRES are formed and perpendicular to the longitudinal direction of the MRE.
Figure 22C:
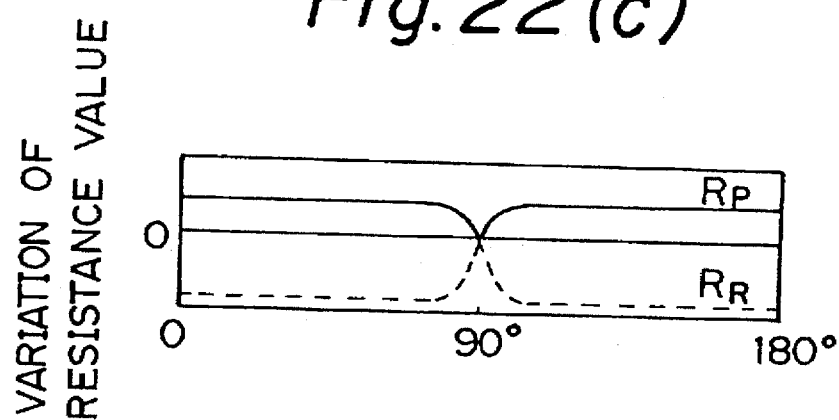
FIG. 22(c) shows the change in resistance of the MRES with respect to the magnetic field angle in FIG. 22(a) and 22(b)

FIG. 22(a) shows that when the angle θ of a magnetic field B is changed in a plane perpendicular to the surface of the insulating substrate 202 and parallel to the current direction, the change of the resistance, i.e., the change of the resistance in the direction parallel to the current direction, is shown by a curve Rp in FIG. 22(c), while when the angle θ thereof is changed in a plane perpendicular to the surface of the insulating substrate 202 and perpendicular to the current direction, the change of the resistance, i.e., the change of the resistance in the direction perpendicular to the current direction, is shown by a curve $R_R$ in FIG. 22(c).

Accordingly, as shown in FIG. 21(a), when the MRE is arranged on a center axis of the bias magnet, the angle θ of the magnetic field applied to the MRE is finely changed in accordance with the movement of an object to be detected.

Note that as shown in FIG. 22(c), since the characteristics of the curves $R_P$ and $R_R$ steeply change with an angle θ in a vicinity of 90°, the change of the resistance of the MREs can be detected with high sensitivity in response to a change of the magnetic field angle θ.

Figure 23:
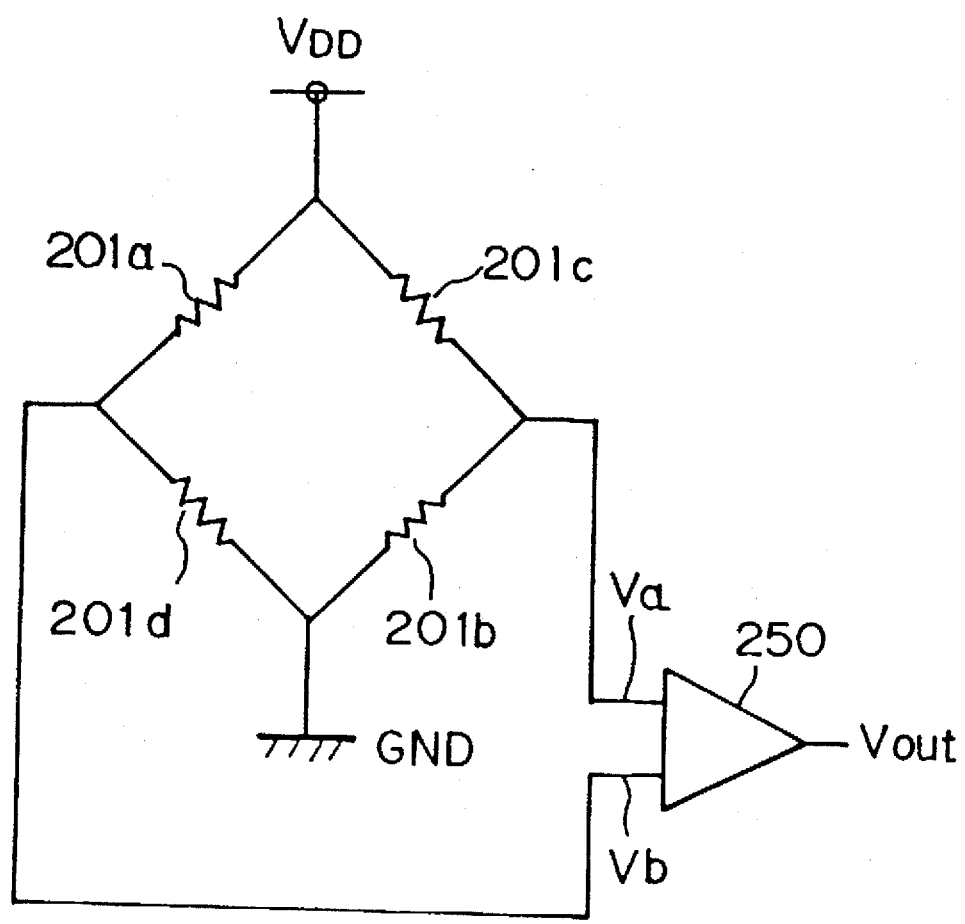
FIG. 23 shows a conventional circuit construction of a magnetic detection device utilizing an MRE.

Movement of an object to be detected (for example rotation of a gear 204) is generally detected by a change in resistance of the MREs by an analog type detecting system, in which an MRE resistance bridge is formed and an output voltage of the resistance bridge is detected by a comparator, as shown in FIG. 23. In FIG. 23, MREs 201a, to 201d correspond to the MREs 201a to 201d shown in FIG. 21(b).

FIG. 24 shows a relationship between oscillation of the magnetic field as shown in FIG. 21(b) (change of the magnetic field angle θ and the change of resistance of the MREs as well as an output of the circuit shown in FIG. 23 at that time, i.e., the output of the magnetic detection device. FIG. 24(a) shows the same relationship as mentioned above when an air gap between the object to be detected and the MREs is large, while FIG. 23(b) shows the same relationship when the air gap is small.

Note that the MREs 201a and 201b and MREs 201c and 201d change in resistance in accordance with a change of the magnetic field angle θ, as shown in FIGS. 24(a) and 24(b). In order to obtain normal outputs 0 and 1, the pattern of the MREs is generally arranged to be displaced from the center of the magnet by a slight offset so that the magnetic field is biased at a cross point A of a curve of the resistance change $R_P$ of the MREs in the parallel direction and that of the resistance change $R_P$ of the MREs in the perpendicular direction.

At this time, the magnetic field angle changes around this cross point A and when the air gap is large as shown in FIG. 24(a), the magnetic field angle is small, so another cross point B is not reached as shown in FIG. 24(a). Accordingly, normal signals of 0 and 1 are output from the detection circuit as shown in FIG. 23, whereby outputs having the same frequency as that of the movement of the object to be detected can be obtained, enabling detection of the movement of the object with a high accuracy.

However, when the air gap is small, the change of the magnetic field angle is large, therefore a cross point D other than the cross point C which is usually used can be reached as shown in FIG. 24(b). In this situation, an output signal 0, 1 other than the normal signal 0, is erroneously output from the detection circuit shown in FIG. 23. Thus, an output having a frequency double the frequency of the movement of the object to be detected is generated, preventing accurate detection.

Thus, a problem arises in that erroneous outputs can be included in the output from the magnetic detection device depending on the air gap formed between the MREs and the object to be detected.

To overcome this, the magnetic detection device may be mounted at a position with an air gap resulting in a small oscillation of the magnetic field angle, however, the cross point as mentioned above exists at a nearly 90° magnetic field angle, and the characteristics of the change of resistance of the MREs are symmetric at the angle of 90°. Therefore, it is very difficult to avoid erroneous detection with extremely precise positioning.

According to another aspect of the present invention a magnetic detection circuit is provided which comprises;

a magnetic field generating means for generating a bias magnetic field toward an object to be detected having magnetic materials therein and MREs provided on a predetermined plane arranged in the bias magnetic field, a resistance value thereof being changed in response to a change of conditions of the bias magnetic field due to a movement of the object to be detected, the change of conditions of the bias magnetic field being detected by the change of the resistance value of the MREs, the predetermined plane formed by a direction of the bias magnetic field generated from the magnetic field generating means and a moving direction of the object to be detected, the MREs being arranged on the plane so that the change of the resistance value displays at least one of a monotonous increment and a monotonous reduction due to the change of the bias magnetic field. The MREs will only change in resistance by a monotonous increment and monotonous reduction due to the change of the bias magnetic field, due to the arrangement. The resistances will never exceed the maximum point or minimum point of the curve shown in FIG. 24(b). Therefore, the change of resistance of the MREs due to the change of the bias magnetic field does not include a change of resistance of the MREs not caused by a change of a condition of the bias magnetic field. The change of resistance, therefore, becomes a clean sine wave corresponding to the change of the condition of the bias magnetic field.

Figure 25:
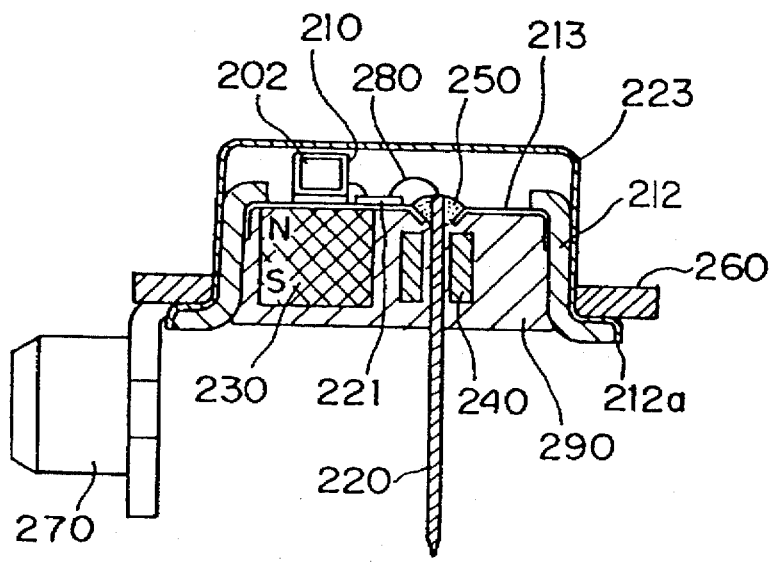
FIG. 25 is a cross-sectional view of the magnetic detection device of the third aspect of the present invention.

FIG. 25 is a cross-sectional view of magnetic detection device according to this aspect. In the figure, an inner plate 213 made of a low thermal expansion metal (for example kovar, stainless steel 430, or the like) is fixed to a housing 212 made of a non-magnetic metal material by soldering, welding, press-fitting, or the like. The inner plate 213 is provided with an output pin 220 sealed with a sealing glass 250. A varistor 221 is provided on the inner plate 213 and adhered to the inner plate 213 with glass having a low melting point or a suitable adhesive.

An insulating substrate 202 on which the MREs are formed, is mounted on a substrate holder 210 with an adhesive. The substrate holder 210 is fixed to the inner plate 213 so that the surface of the substrate on which the MREs are formed is at a right angle with the surface of the inner plate 213. The output pin 220 and the MRE are electrically connected with bonding wires 280 through the varistor 221. An outer case 223 made of a non-magnetic material is press-fitted to a housing 212. The end most portion of a peripheral portion thereof 212a is hermetically connected with the housing 212 utilizing laser welding or the like. The outer case 223 is previously fixed to a bracket 260 by soldering or the like to solidly fix the magnetic detection device. A pin 270 for positioning the device is provided. A magnet 230 for applying a bias magnetic field to the MREs, is mounted on the surface of the inner plate 213 so that the magnetizing direction is perpendicular to the surface of the inner plate 213 (magnetic direction shown in FIG. 26) In this situation, the direction of the magnetic field applied to the plate is parallel to the surface on which the MREs are formed. Ferrite beads 240 are provided for preventing erroneous operations caused by electromagnetic noise. The magnetic detection device is completed by filling a molding resin 290 into the device and curing the resin with heat after the magnet 230 and the ferrite beads 240 are fixed.

Figure 26:
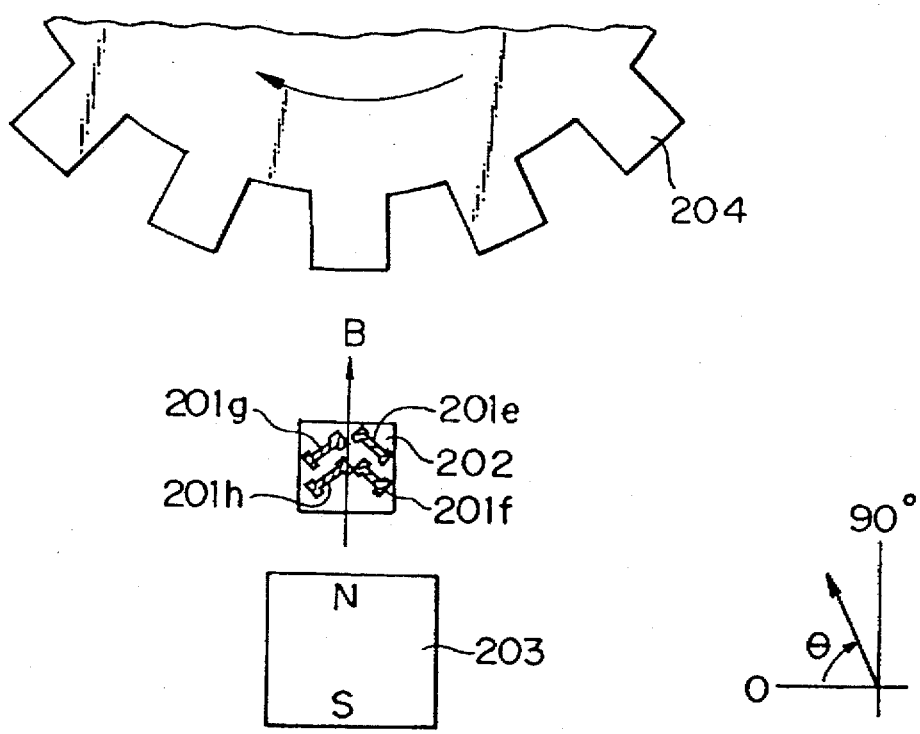
FIG. 26 shows the mutual relationship of arrangements among a magnet, an insulating substrate on which MREs are mounted, and an object to be detected in the third aspect of the present invention.

FIG. 26 shows one pattern of an arrangement of MREs 201e, 201f, 201g, and 201h formed on the insulating substrate 202. As shown in FIG. 26, a group of MREs 201e and 201f and another group of the MREs 201g and 201h are arranged so that the longitudinal direction of the MREs 201e and 201f is inclined with respect to the direction of the bias magnetic field generated by the bias magnet by about 45°, while the longitudinal direction of the MREs 1g and 1h is inclined with respect to the same by about 45° in the opposite direction.

Preferably MREs used in this invention are ferromagnetic magnetoresistance elements made of an alloy, a main substance thereof being Ni, for example, Ni—Co alloy or Ni—Fe alloy and which is formed in a thin film like layer and formed on the insulating substrate 202 by a vapor deposition method or the like with the deposited film being thereafter etched by a photo lithographic method to form a predetermined pattern.

The insulating substrate 202 on which the MREs are provided is arranged on a plane parallel to the direction of the bias magnetic field generated from the bias magnet 203 and parallel to the moving direction of the object to be detected.

Figure 27A:
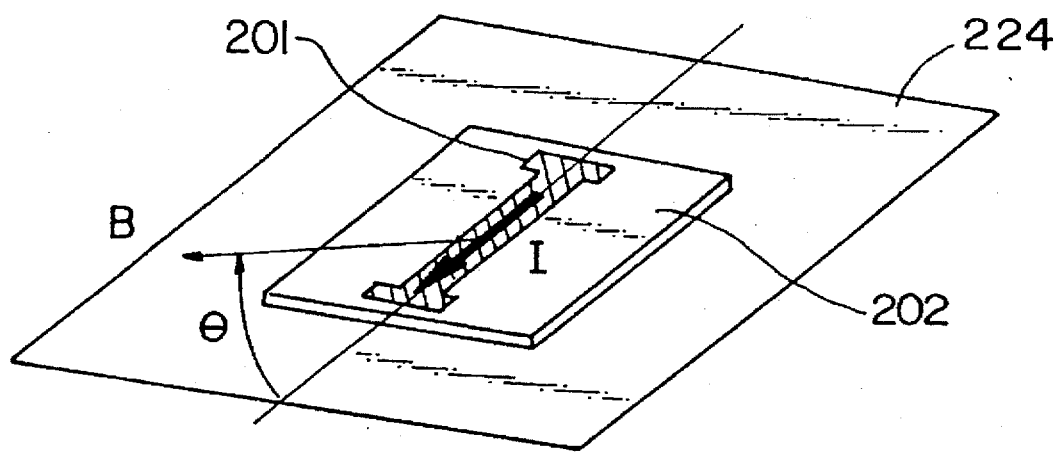
FIG. 27(a) is a schematic view of a magnetic field angle in an insulating substrate on which an MRE is formed.

The operation of this embodiment will be explained hereunder. As shown in FIG. 27(a), when a saturated magnetic field B is changed by an angle θ in the plane 224, corresponding to the surface of the insulating substrate 202 on which the MREs are formed, the change of the resistance of the MRE 201 is as shown in FIG. 27(b).

Note, that in FIG. 26, when the projecting portions or concave portions of the gear 204, i.e., the object to be detected, reach the center of the bias magnetic field, the MREs 201e and 201f are biased with a bias angle of 45° in that plane while the MREs 201g and 201h are biased with a bias angle of 135°.

Figure 27B:
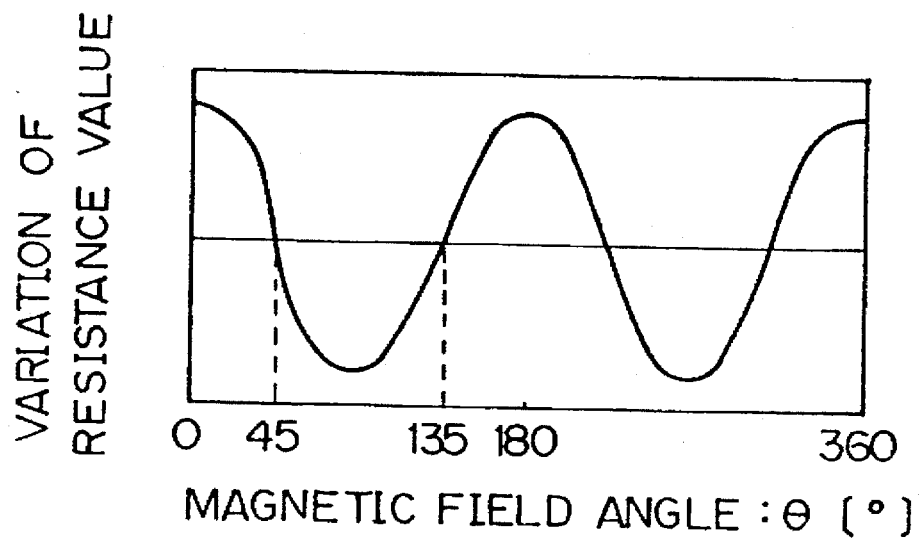
FIG. 27(b) is a graph of the change in resistance of the MRE with respect to the magnetic field angle in FIG. 27(a)

It is apparent from FIG. 27(b), that the resistance at the magnetic field angle of 45° is identical with that at the magnetic field angle of 135°. On the other hand, at the magnetic field angle of 45°, when the magnetic field angle is increased, the resistance is decreased. Conversely, at the magnetic field angle of 135°, when the magnetic field angle is increased, the resistance is increased. Therefore, in a coordinate system as shown in FIG. 26, when the magnetic field angle θ is 90°, the MREs 201e and 201f are biased with a bias angle of 45° while the MREs 201g and 201h are biased with a bias angle of 135°.

Characteristic curves of this magnetic detection device are shown in FIGS. 28(a) and 28(b) in which the abscissa represents the magnetic field angle θ and the ordinate represent the change of resistance of the MREs 201e to 201h.

FIG. 28(a) shows the case of a large air gap between the MREs and the object to be detected. When the magnetic field angle is changed due to movement of the object to be detected, the resistance of one group of the MREs 201e and 201f and another group of the MREs 201g and 201h is increased and decreased, respectively, with respect to a crossing point E. Accordingly, when the MREs 201e to 201h are wired to each other to form a bridge circuit to make a detection circuit as shown in FIG. 23, the detection circuit outputs correct signals 0, 1. In FIG. 26, the MREs 201e to 201h are electrically connected so as to correspond to the MREs 201a to 201d, respectively.

On the other hand, FIG. 28(b) shows the case of a small air gap. When the change of the magnetic field angle θ is enlarged, the resistances of the MREs 201e to 201h are changed in the same manner as explained above and as shown in FIG. 28(b).

As shown in FIG. 24(b), in a conventional magnetic detection device, when the air gap is small, the change of the magnetic field angle θ is enlarged, thereby erroneous operations frequently occur due to use of both cross points, but as is apparent from FIGS. 27(b), 28(a), and 28(b), according to the present invention, the magnetic field will arrive at another cross point only when the change of the magnetic field angle θ exceeds ±90°. Generally speaking, the change of the magnetic field angle is defined by the pitch of the gear and the length of the air gap or the like, but it is at most about ±20°. Therefore, erroneous detection, which occurs in a conventional device when the air gap is small, can be prevented.

A second pattern of an arrangement of the magnetic detection device of the present embodiment will be explained hereunder.

In the first example as mentioned above, the group of MREs 201g and 201h and the group of MREs 201e and 201f were arranged as shown in FIG. 29(a).

In this arrangement, the MREs 201e to 201h are arranged on the insulating substrate 202 as shown in FIG. 29(b). That is, one group of the MREs 201e and 201f are arranged on the substrate inclined with respect to an axis of a magnetic field by about 45°, while another group of the MREs 201g and 201h are arranged on the same substrate inclined to the same axis by about 45° in an opposite direction. Note that in the first pattern of arrangement shown in FIG. 29(a), the same magnetic field might not exactly be applied to both the group of the MREs 201e and 201f and the group of the MREs 201g and 201h and therefore a slight phase difference might conceivably occur between them, but in the second pattern of arrangement shown in FIG. 29(b), no phase difference will occur between them because the same magnetic field is applied exactly to all of the MREs 201e to 201h.

A third pattern of an arrangement is explained hereunder with reference to FIG. 29(c). The MREs 201e to 201h are formed in a two-layer construction in order to minimize the area occupied. That is, one group of the MREs 201e and 201f are formed on a surface of the insulating substrate, and another group of the MREs 201g and 201h are formed on top of a separate insulating film (not shown) provided therebetween.

In the above patterns of arrangement, the MREs have a strip-like configuration, but they may be formed in a comb configuration.

Figure 30A:
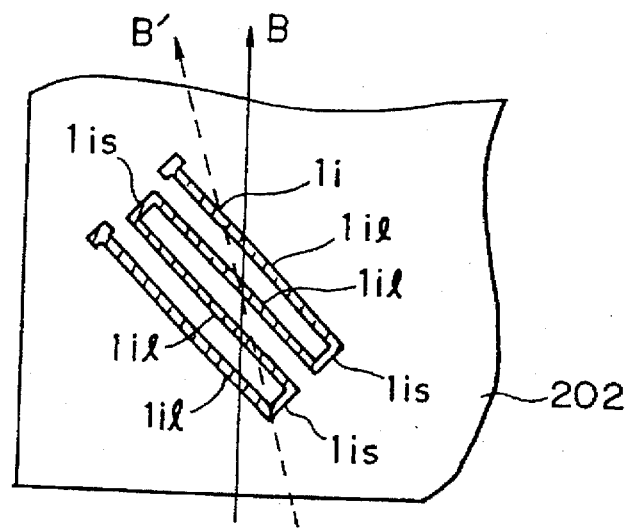
FIGS. 30(a), 30(b), and 30(c) show comr-type patterns of arrangement of MREs on the insulating substrate of the magnetic detection device.

In a fourth pattern of an arrangement as shown in FIG. 30(a), the MREs 1i comprise a plurality of alternating long strip portions 1il and short strip portion 1is joined end to end. The long strip portions 1il are inclined with respect to a magnetic field B by about 45°, while the short strip portions 1is are at right angles to the long strip portions 1il. In this pattern of arrangement, the total resistance value R1i of the MREs with respect to the magnetic field B shown by the continuous line is represented by the following equation;

$$R1i+R1=Rs$$

wherein, R1 denotes the total resistance of the long strip portions 1il and Rs denotes the total resistance of the short strip portions 1is.

In this situation, when the axis of the magnetic field B shown by the continuous line is changed to a magnetic field B' shown by a dotted line due to a movement of an object to be detected the total resistance value R1i' of the MREs is represented by the following equation;

$$R1i' = R1 + \Delta R1 + Rs - \Delta Rs$$
$$= R1 + Rs + (\Delta R1 - \Delta Rs)$$

wherein, both ΔR1 and ΔRs are positive values and denote amounts of change of the total resistance R1 in the long strip portions 1il and the total resistance Rs in the short strip portions 1is caused by the change of the magnetic field, respectively.

Note that since the long strip portions 1il and the short strip portions 1is are arranged at right angles with each other, the changes of the resistances of the long strip portions 1il and the short strip portions 1is are opposite to each other, i.e., the change of the resistance of one is positive, while that of the other is negative. Therefore, the amounts of change with respect to the total resistance may slightly offset each other but this does not adversely affect the accuracy of the output in the circuit shown in FIG. 23.

Figure 30B:
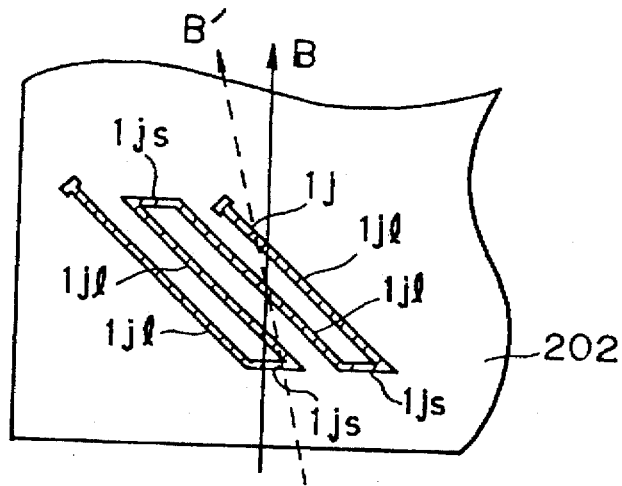

FIG. 30(b) shows a fifth pattern of an arrangement of the MRES. The MRES 1j comprise alternating, end-to-end long strip portions 1jl inclined with respect to the magnetic field B by about 45° and short strip portions 1js perpendicular to the direction of the magnetic field B. The total resistance R1j of the MREs 1j is represented by the following equation, with respect to the magnetic field B;

$$R1j=Rl+Rs$$

wherein, $R_1$ denotes the total resistance of the long strip portions 1jl and Rs denotes the total resistance of the short strip portions 1js.

On the other hand, with the magnetic field B', the total resistance Rl of the long strip portions 1jl increases by ΔRl, but the total resistance of the short strip portions 1js hardly changes. The reason is that since the short strip portions are almost all perpendicular to both the magnetic fields B and B', the change of the resistance is saturated, as shown in FIG. 27(b). Namely, the total resistance R1j' with respect to the magnetic field B' is represented by the following equation;

$$R1j'=Rl+\Delta Rl+Rs$$

Comparing this pattern with the pattern shown in FIG. 30(a), the amount of the change in the pattern of FIG. 30(a) is (ΔRl–ΔRs) while the amount in the pattern of FIG. 30(b) is ΔRl. Thus, the amount of change in the resistance with respect to the total resistance is increased to improve the detecting sensitivity.

Figure 30C:
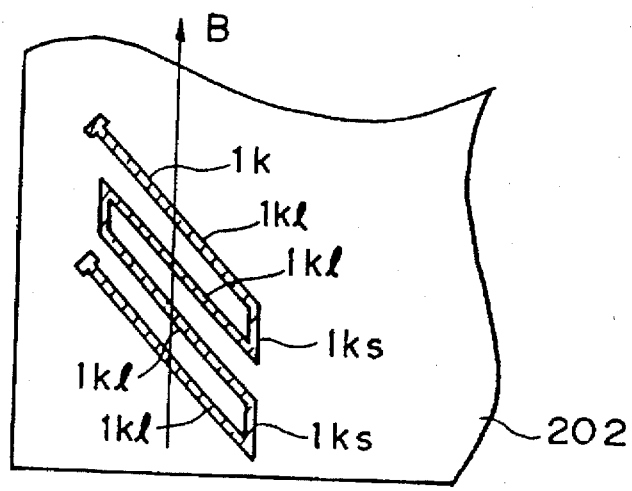

FIG. 30(c) shows a sixth pattern of arrangement of the MREs. The MREs 1k comprise alternating, end-to-end long strip portions 1kl inclined with respect to the magnetic field B by about 45° and short strip portions 1ks parallel to the direction of the magnetic field B. The change of the resistance of the short strip portions 1ks is saturated in the case of the magnetic field B, the same as in FIG. 30(b), and does not change, so the same effect as in the fifth pattern can be obtained.

FIG. 31 shows a specific pattern of an arrangement of the MREs in the third aspect of the present invention.

In the pattern examples of the present invention as mentioned above, at least one pair of MREs are inclined oppositely to each other with respect to the magnetic field by about 45°, but the angle is not restricted to 45°, it may be any angle as long as a change of the resistance of the MREs displays only a monotonous increment and/or a monotonous reduction with respect to the change of the angle of the bias magnetic field. If such a condition is realized, the change of the angle of the magnetic field never includes two cross points. Note that when the MREs are inclined at about 45°, however, the resistance changes the most steeply with respect to the change of the angle of the magnetic field, so the detecting sensitivity is improved.

Also, in these examples, the insulating substrate 202 may be a silicon substrate and the MREs may be provided on the surface of an insulating film formed on the silicon substrate. A detecting circuit, for example, a voltage comparator as shown in FIG. 23, may also be formed on the silicon substrate, thereby forming the element on one chip.

Further, while one or more pairs of MREs were provided to make the magnetic detection device, a combination of MREs and fixed resistors may be used.

In the previous embodiments, the magnetic detection device and the physical quantity detecting device mainly included oscillating circuits having MREs and a comparison means for comparing the oscillating frequencies output from the oscillating circuits by taking a ratio of two oscillating frequencies. However, in these devices, these oscillating circuits are required to generate output signals indicating a change of resistance with the signals crossing to form cross points. Therefore, the construction and positioning of the oscillating circuits are important. Some restrictions exist on the oscillating circuits, and, further it is difficult for the oscillating circuit to be properly positioned.

On the other hand, when analog data is handle by a digital circuit, the physical resolution is determined by the number of bits used in the digital circuit, and the chronological resolution is determined by the clock frequency of the digital circuit. Therefore, a phase difference detecting circuit for detecting, for example, two pulse signals having an arbitrary phase relationship is constructed with the digital circuit. When the phase difference, however, is smaller than the chronological resolution determined by the clock frequency, it is difficult for such a phase difference to be detected. Note that in the present silicon MOS transistor technology, the maximum clock frequency is around 50 MHz and the chronological resolution is limited to around 20 ns. Therefore, in the magnetic detection devices of the previous aspect of the invention, the resolution is restricted and it is difficult to detect a very fine change which should be detected with a resolution of less than 20 ns.

Accordingly, in the fourth aspect of the present invention there is provided a magnetic detection device in which the magnetic change can be detected utilizing a pulse phase difference.

That is the fourth aspect provides a magnetic detection device which further comprises; a delayed pulse signal output means comprising a delay signal circuit which outputs a plurality of pulse signals when a first pulse signal is input thereto, each pulse signal being delayed from the previous pulse signal by a predetermined different delay time, a pulse signal selecting means which receives as input a second pulse signal, delayed from the first pulse signal by any desired time, and a plurality of pulse signals output from the delayed pulse signal output means, and which selects from the plurality of pulse signals, a certain pulse signal having a specific condition with respect to a timing at which the second pulse signal is input, and, a detecting means for detecting a phase difference between the first and the second pulse signals utilizing the pulse signal selected by the pulse signal selecting means.

In the pulse phase difference detecting circuit, when a first pulse signal is input to the delayed pulse signal output means, a plurality of pulse signals are output from the signal delay circuit. Each pulse signal is delayed from the first pulse signal by a predetermined different delay time. The delay time caused by the signal delay circuit can be set extremely shorter than the chronological resolution of a conventional digital circuit. Accordingly, the phase difference between the first pulse signal and the second pulse signal can be detected with a high accuracy by selecting a specific pulse signal out of the plurality of pulse signals, i.e., the first pulse signals, by a pulse signal selecting means and having a specific condition with respect to a timing at which the second pulse signal is input thereto.

Further, in the pulse phase difference detecting circuit as mentioned above, a pulse signal with an oscillating frequency changed in accordance with a detected value of a physical quantity, is output from the first oscillating circuit. The phase difference between this pulse signal and the pulse signal output from the second oscillating circuit is detected and further the condition of change of this phase difference is detected. By detecting the condition of change of the phase difference, the accuracy of the detection is not affected by the absolute oscillating frequencies of the first and second oscillating circuits. Therefore, even if the oscillating frequency changes due to changes of the temperature characteristics and device characteristics, or due to a time elapsed and a variation of the voltage source or the like, the condition of change of the physical quantity can be detected with a high accuracy without regard to any influences as mentioned above.

Figure 32:
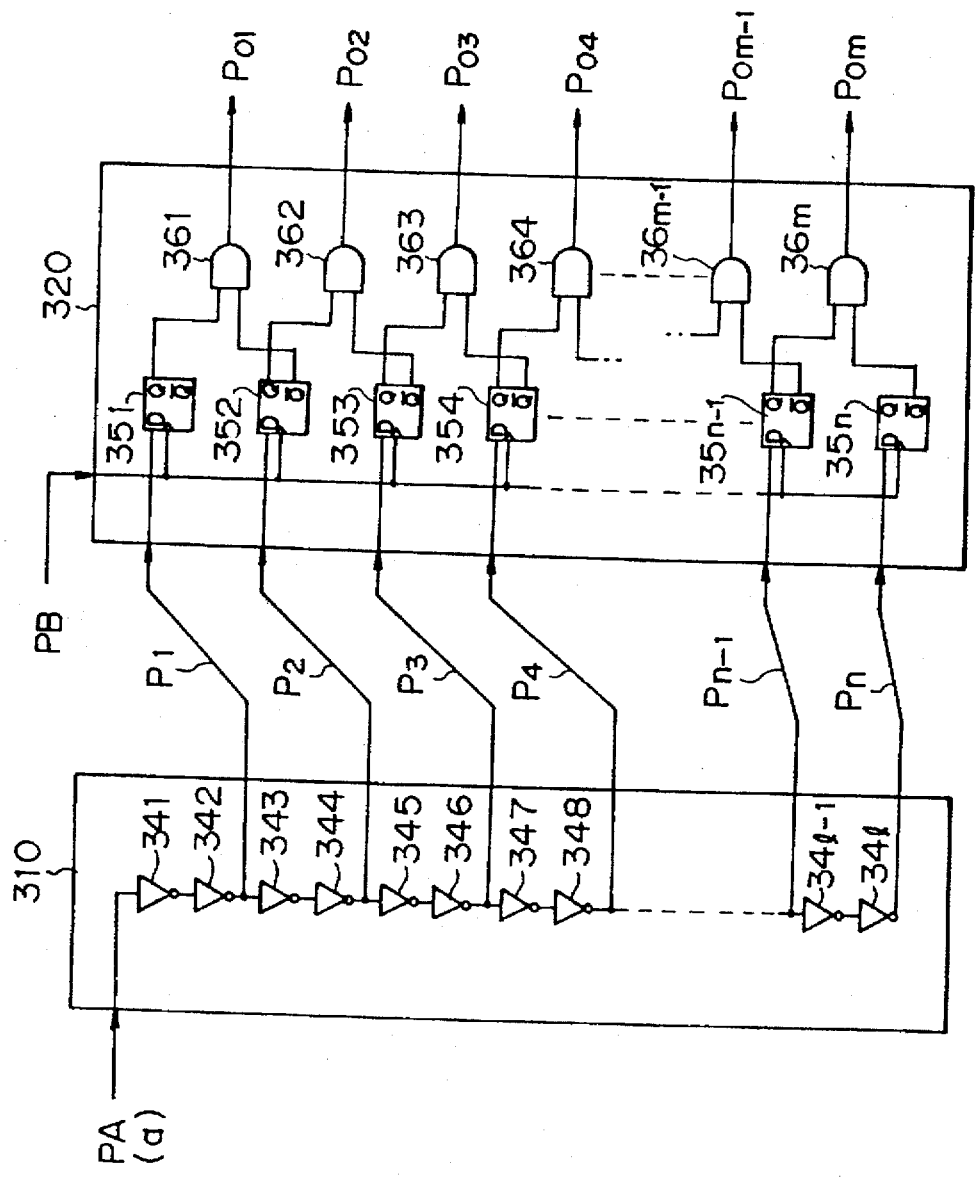
FIG. 32 shows a circuit construction of a pulse phase difference detection circuit of a fourth aspect of the present invention.
Figure 33:
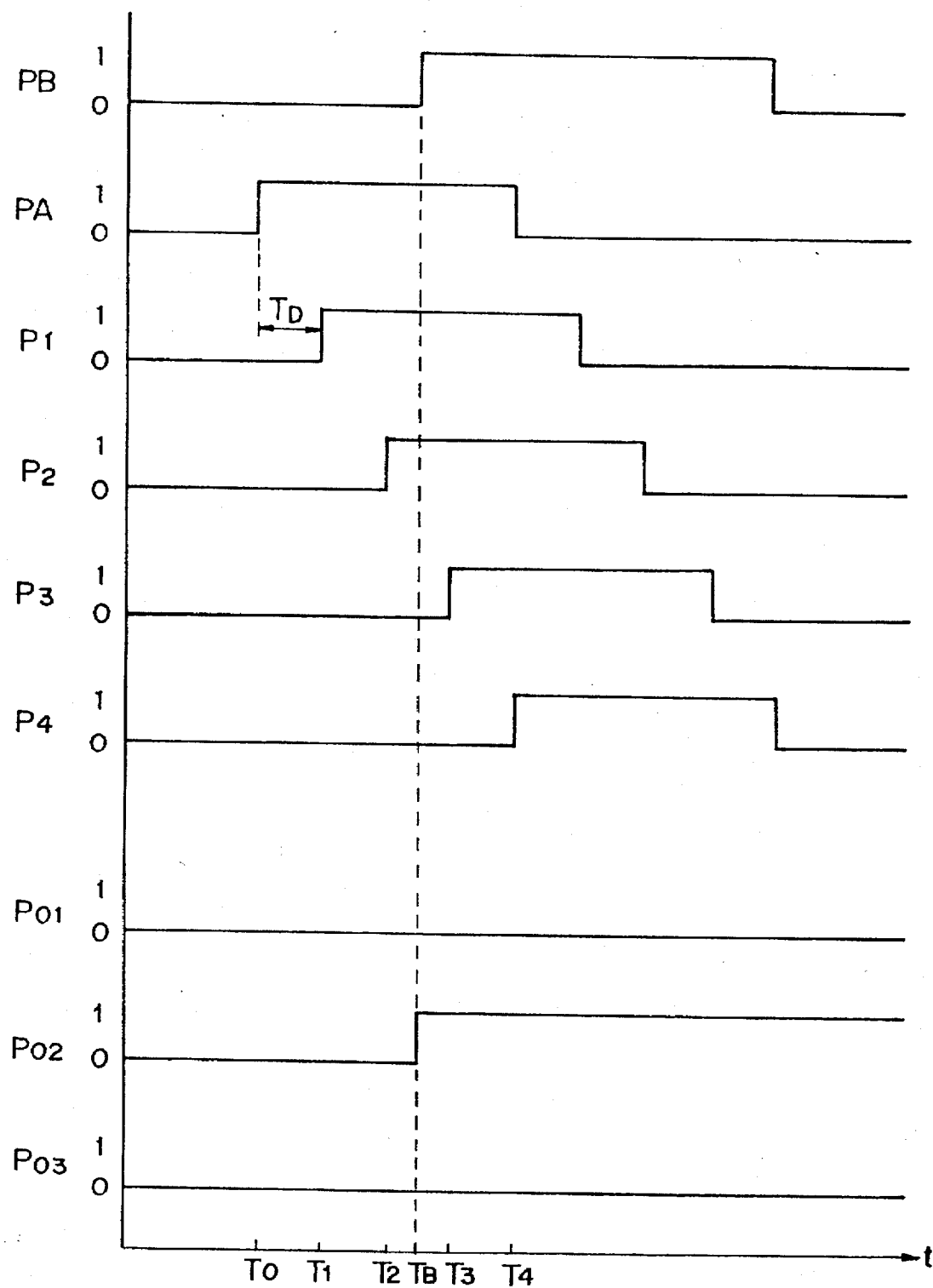
FIG. 33 is a time chart illustrating the operation of the pulse phase difference detection circuit shown in FIG. 32.

Specific examples will be explained with reference to the attached drawings hereunder. FIG. 32 shows the construction of a pulse phase difference detecting circuit. In FIG. 32, a delay pulse signal generating circuit 310 is provided which comprises a gate delay circuit serving as a signal delay circuit consisting of a plurality of inverters 341 to 34$l$. The delay pulse signal generating circuit 310 generates a plurality of output pulse signals $P_1$ to $P_n$ when a level of the pulse signal PA is turned to 1, i.e., turned ON. Each pulse signal is output with a suitable equal delay time $T_D$ from the time when the previous pulse signal is output, as shown in FIG. 33. In this delay pulse signal generating circuit 310, the pulse signal PA is input to an inverter 341 and an output of the inverter 341 is connected to an input of an inverter 342. Further, an output of the inverter 342 is connected to an input of an inverter 343 and simultaneously output therefrom as an output pulse signal $P_1$. Outputs and inputs of the following inverters 343 to 34$l$ are connected in the same manner as explained above, and outputs of the inverters having an even number are output therefrom as output pulse signals $P_1$ to $P_n$.

In the delay pulse signal generating circuit 310 described above, the outputs of the even number inverters 342 to 34$l$, for example, the inverters 342, 344, 346, and 348, respectively, are used as a group generating the output pulse signals $P_1$ to $P_n$. It is apparent that the outputs of odd numbered inverters 341 to 34$l$-1, i.e., the transistors 341, 343, 347, and 34$l$-1, can be added to the above-mentioned group of output pulse signals $P_1$ to $P_n$, if necessary.

The group of pulse signals $P_1$ to $P_n$ are output utilizing the delay time caused only by the inverters 341 to 34$l$, although it is possible to adjust the delay time by changing the number of steps of inverters 341 to 34$l$ or by adding a certain capacitance in a wire connecting any of the inverters 341 to 34$l$.

Figure 39:
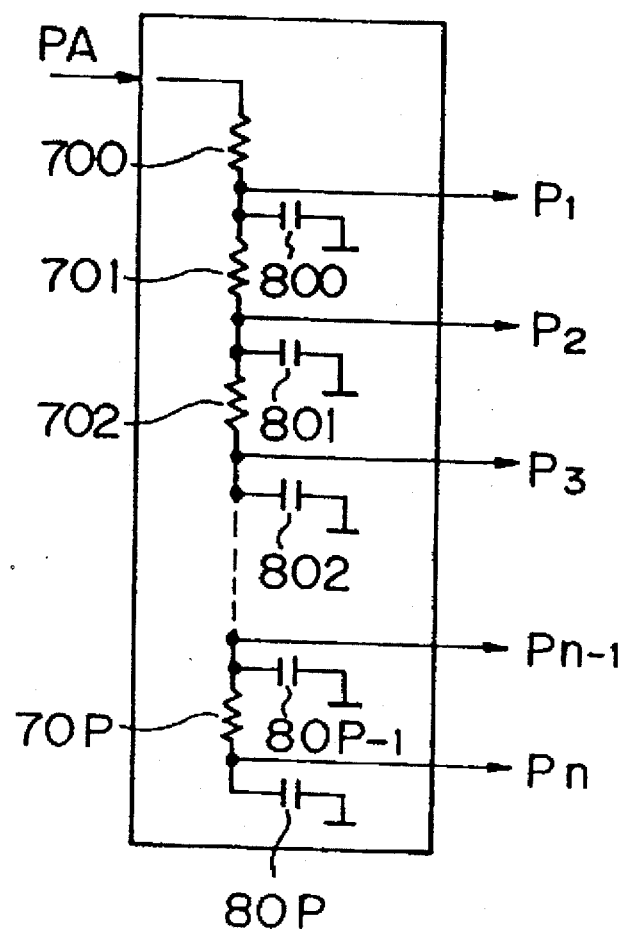
FIG. 39 shows another embodiment of the signal delay circuit of the present invention.

Further, the delay pulse signal generating circuit 310 may be constructed utilizing resistors 700 to 70P and capacitors 800 to 80P as shown in FIG. 39 without using the delay pulse signal generating circuit 310 consisting of inverters as shown in FIG. 32.

In FIG. 32, a pulse signal selecting circuit 320 forming pulse signal selecting means is provided as a synchronized pulse detecting circuit. Each of the group of pulse signals $P_1$ to $P_n$, output from the delay pulse signal generating circuit 310, and a pulse signal PB which has an arbitrary phase relationship with the pulse signal PA are input to the pulse signal selecting circuit 320. The pulse signal selecting circuit 320 detects one output pulse signal out of the group of output pulse signals $P_1$ to $P_n$, which has the phase nearest to that of the pulse signal PB.

Namely, the group of output pulse signals $P_1$ to $P_n$ are input to this synchronized pulse signal selecting circuit 320 as data. Also, the pulse signal PB which has an arbitrary phase relationship with the pulse signal PA is input thereto. The pulse signal selecting circuit 320 detects and outputs the one output pulse signal out of the group of output pulse signals $P_1$ to $P_n$ which has the phase nearest to that of the pulse signal PB.

The pulse signal selecting circuit 320 comprises D-flip-flops (D-FF) 351 to 35n. To one of the D-FFs, each one of the group of output pulse signals $P_1$ to $P_n$ is input. The pulse signal PB is also input to each one of the D-FFS as a clock. The pulse signal selecting circuit 320 has an AND gate 361 to which an output Q of D-FF 351 and an inverted output $\overline{Q}$ of the D-FF 352 are input and outputs a synchronized pulse PO1. Other AND gates 362 to 36n, to which outputs Q and the inverted outputs $\overline{Q}$ of the D-FFS 352 to 35n are input, output synchronized pulses PO2 to POm in the same manner explained above.

The operation of the pulse phase difference detecting circuit as constructed above will be explained hereunder with respect to FIG. 33. Note that the number of signals of the group of the output pulse signals $P_1$ to $P_n$ and the synchronized pulses PO1 to POm are set at 4 and 3 respectively, although any number of signals which are suitable for a circuit as described and applied may be used since there is theoretically no limitation on the number of signals.

In FIG. 33, when the level of pulse signal PA is changed from 0 to 1, i.e., turned ON, at a time To, the level of the output signal of the inverter 342 (that is the output pulse signal) increases from 0 to 1, at a time $T_1$ delayed by a gate delay time $T_D$ from the time To, which is a time for the signal to propagate through the two inverters 341 and 342.

In the same manner, each time $T_2$ to $T_4$ corresponding to the level of each of the output pulse signals $P_2$ to $P_4$ increases, it is delayed in accordance with the number of inverters 343 to 348 through which the signal propagates.

In this example, when a circuit size of inverters 341 to 348 is equal the gate delay time $T_D$ of the inverters 341 to 348 can be made equal to each other.

Thus, the time $T_n$ can be represented as follows;

$$T_n = n \times T_D$$

The gate delay time $T_D$ can be set at around 2 ns at a minimum by a conventional silicon MOS producing technology.

On the other hand, a clock frequency of a conventional digital circuit is around 50 MHz maximum and therefore the chronological resolution in the conventional technology is limited to around 20 ns.

Therefore, in accordance with this example of the present aspect of the invention, a resolution of a high accuracy of 10 times that in the prior art is obtained.

As explained above, each signal of the group of output pulse signals $P_1$ to $P_n$, increased in turn by a time interval of about 2 ns, is input to the synchronized pulse detecting circuit 320. At a time $T_B$ (wherein $T_2 < T_B < T_3$), when a level of the pulse signal PB is changed from 0 to 1, each of the D-FFs 351 to 354 is triggered by the pulse signal PB. At the same time, a signal corresponding to the level of the output pulse signals $P_1$ to $P_4$, provided to the D-FFs at the time $T_B$, is output from both the output Q and inverted output $\overline{Q}$ of each of the D-FFs 351 to 354. For example, at the time $T_B$, the level of the output pulse signals $P_1$ and $P_2$ is 1, while the level of the output pulse signals $P_3$ and $P_4$ is 0. Therefore, the signal having a level of 1 is output from the output Q of the D-FF 351, while the signal having a level of 0 is output from the inverted output $\overline{Q}$ of the D-FF 352. Thus, the output level of the AND gate 361 is 0.

On the other hand, the level of the signal output from the output Q of the D-FF 352 is 1, and that of the signal output from the inverted output $\overline{Q}$ of the D-FF 353 is 1. Thus, the output level of the AND gate 362, i.e., the synchronized pulse signal PO2, is 1.

Regarding the AND gates 363 and 364, the levels of the outputs of the D-FFs 352 to 354 are 0, since the signal level output from the D-FFs 352 to 354 and input thereto is 0.

In accordance with the pulse signal selecting circuit 320, the level of the synchronized pulse signal PO2, which corresponds to the output pulse signal $P_2$, selected from the group of the output pulse signals $P_1$ to $P_n$ and increased just before the time $T_B$ at which the output pulse signal PB is input when selected, can be different from the level of other synchronized pulse signals PO1 and PO3. Therefore, the phase difference between the two pulse signals PA and PB can be detected with accuracy for detection utilizing the gate delay time $T_D$ as a minimum resolution.

In the above-mentioned example, the number of pulse signals to be compared for detecting a phase difference is set at 2, but when the number of pulse signals PB is increased, the detecting operation can be carried out by adding another pulse signal selecting circuit thereto. Accordingly, the number of pulse signals to be compared is not restricted.

Also, one may not only detect the pulse signals increased to the level 1 just before the pulse signal PB is input, but may also detect the pulse signals increased to the level 1, just after the pulse signal PB is input. Further, the detecting operation may be carried out on an nth pulse signal counted from and before the time when the pulse signal PB is input, wherein n is a predetermined number.

The pulse phase difference detecting circuit can also be used for a physical quantity detecting device.

According to a fifth aspect of the present invention, a physical quantity detection device is provided which comprises a first oscillating circuit generating a pulse signal having an oscillating frequency which changes in response to a detected value of a physical quantity to be detected,

- a second oscillating circuit generating a pulse signal having an oscillating frequency to be compared with the oscillating frequency of the first oscillating circuit,
- a pulse phase difference detecting circuit for detecting a phase difference between the pulse signals output from the first oscillating circuit and the second oscillating circuit,
- a changing condition detecting means for detecting the changing condition of the phase difference based upon the phase difference detected by the pulse phase difference detecting circuit, and
- a detecting means for detecting a changing condition of the physical quantity depending upon the changing condition of the phase difference detected by the changing condition detecting means.

Figure 34:
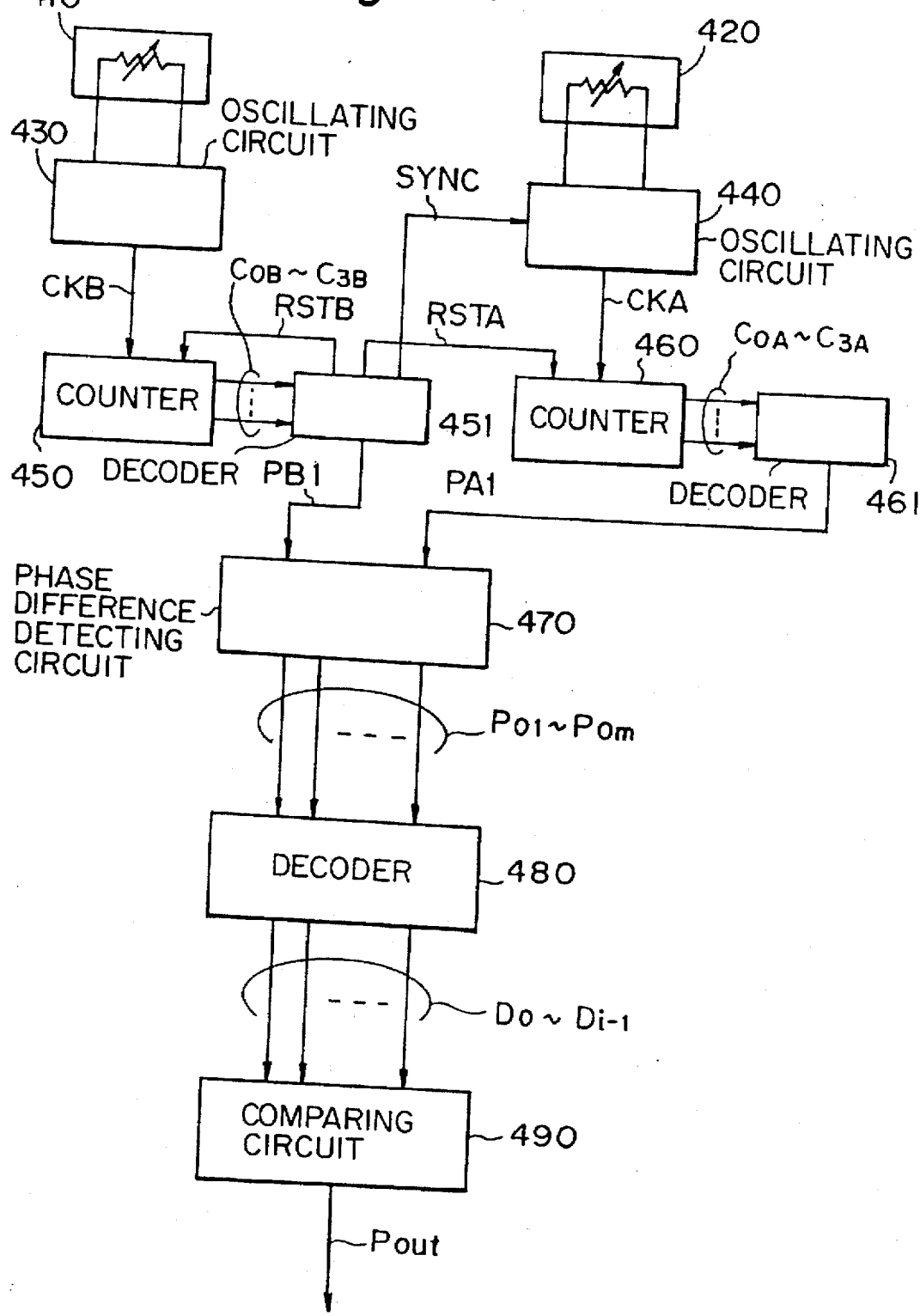
FIG. 34 is a block diagram of a magnetic detection device used for a physical quantity detection device of a fifth aspect of the present invention.

FIG. 34 is a block diagram of a magnetic detection circuit for detecting a physical quantity. In FIG. 34, MREs 410 and 420 are provided. The resistances thereof change in accordance with a change of magnetism. When the two MREs 410 and 420 are formed in the same configuration and arranged so as to be displaced with an angle of 90°, the resistances thereof can be changed in an opposite direction with respect to magnetic changes so the sensitivity to magnetic changes can be improved.

Figure 35:
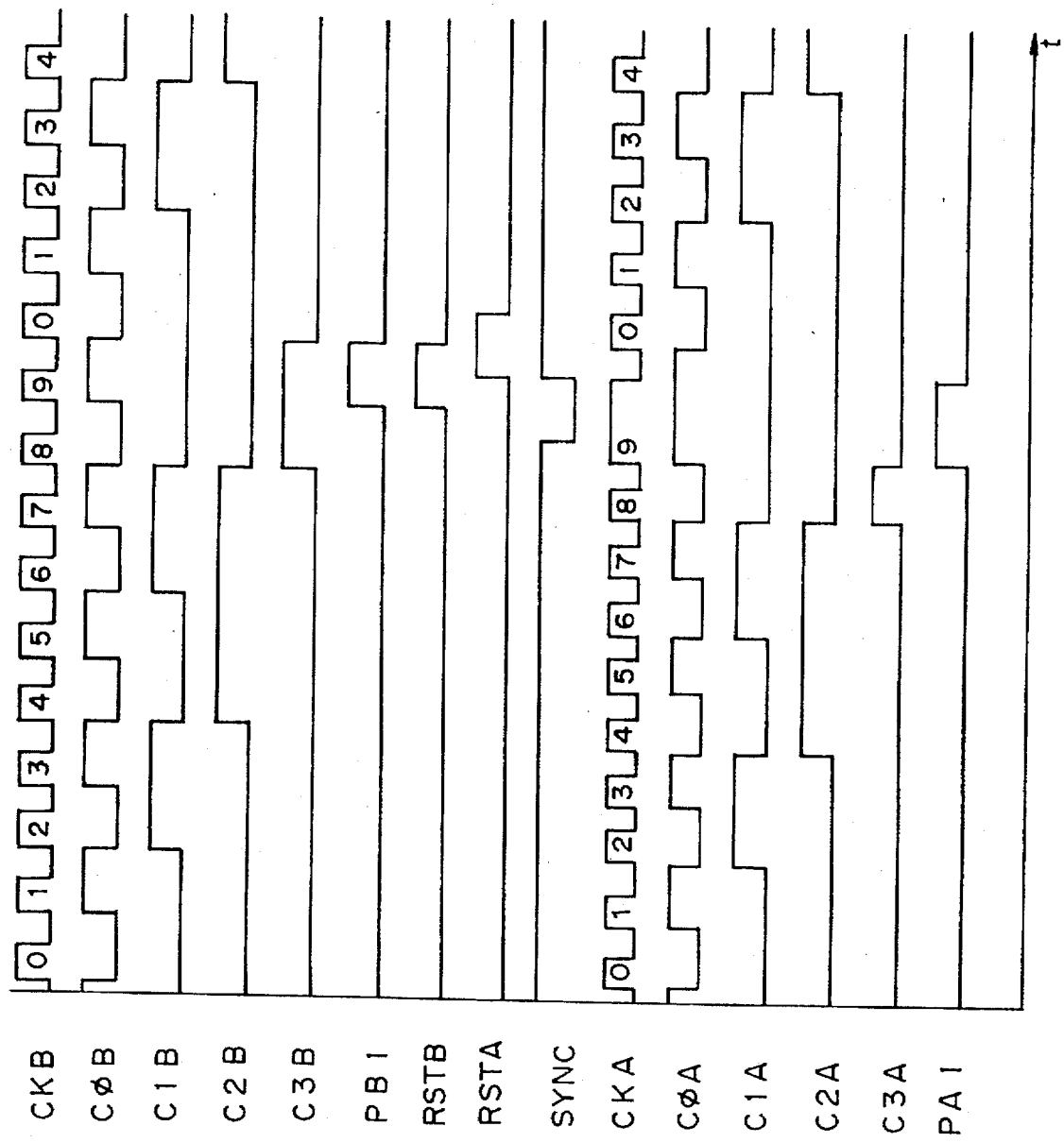
FIG. 35 is a timing chart illustrating an operation of the magnetic detection device shown in FIG. 34.

In this example, oscillating circuits 430 and 440 are also provided. The oscillating frequency can be changed in accordance with the change of resistance of the MREs 410 and 420. The oscillating circuits 430 and 440 are further provided with wave shaping circuits and output pulse signals CKB and CKA having the same frequency as an oscillating frequency determined by the resistances of the MREs 410 and 420, respectively, as shown in FIGS. 34 and 35.

Conventional counters 450 and 460 are provided. The counters count the pulse signals CKB and CKA output from the oscillating circuits 430 and 440 and output count signals C0B to C3B and C0A to C3A, respectively, as shown in FIGS. 34 and 35.

Decoders 451 and 461 are provided. The decoder 451 outputs reset signals RSTB and RSTA to the counters 450 and 460, respectively, when the count of the counter 450 reaches a predetermined value (for example, 9), as shown in FIGS. 34 and 35. The decoder 451 outputs a synchronizing signal SYNC to oscillating circuit 440 to synchronize a starting time for the next counting operation. The decoder 451 further outputs a dividing pulse signal PB1 when the count of the counter 450 reaches 9. In the same manner, the decoder 461 outputs a dividing pulse signal PA1 when the count of the counter 460 reaches 9.

Note that in this example, since the dividing pulse signals PB1 and PA1 are output from the decoders 451 and 461, respectively, when the same number of pulse signals CKB and CKA are counted by the counters 450 and 460, respectively, the difference between the rising times of the dividing pulse signals PB1 and PA1 corresponds to a time in which all of the phase difference of the pulse signals are accumulated. Therefore, the detecting sensitivity to magnetic change is improved, and thus a change of the oscillating frequency due to a slight magnetic change can be detected.

Reference numeral 470 denotes a pulse phase difference detecting circuit as mentioned above, which turns the level of the synchronized pulse signal corresponding to the phase difference between the two pulse signals PB1 and PA1 selected from the synchronized pulse PO1 to POm, to 1, turns the level of other synchronized pulse signals to 0, and outputs both levels.

Reference numeral 480 denotes a decoding circuit, which outputs decoded binary digital signals DO to Di−1 (wherein i denotes a positive integer) corresponding to the synchronized pulse signals selected from the synchronized pulses PO1 to POm output from the pulse phase difference detecting circuit 470, the level being 1.

In this example, the decoding circuit 480 comprises a ROM utilizing the group of the synchronized pulse signals PO1 to POm as address signals. In each address, predetermined binary digital data is stored which indicates the phase difference represented by the synchronized pulse signals PO1 to POm.

Figure 37:
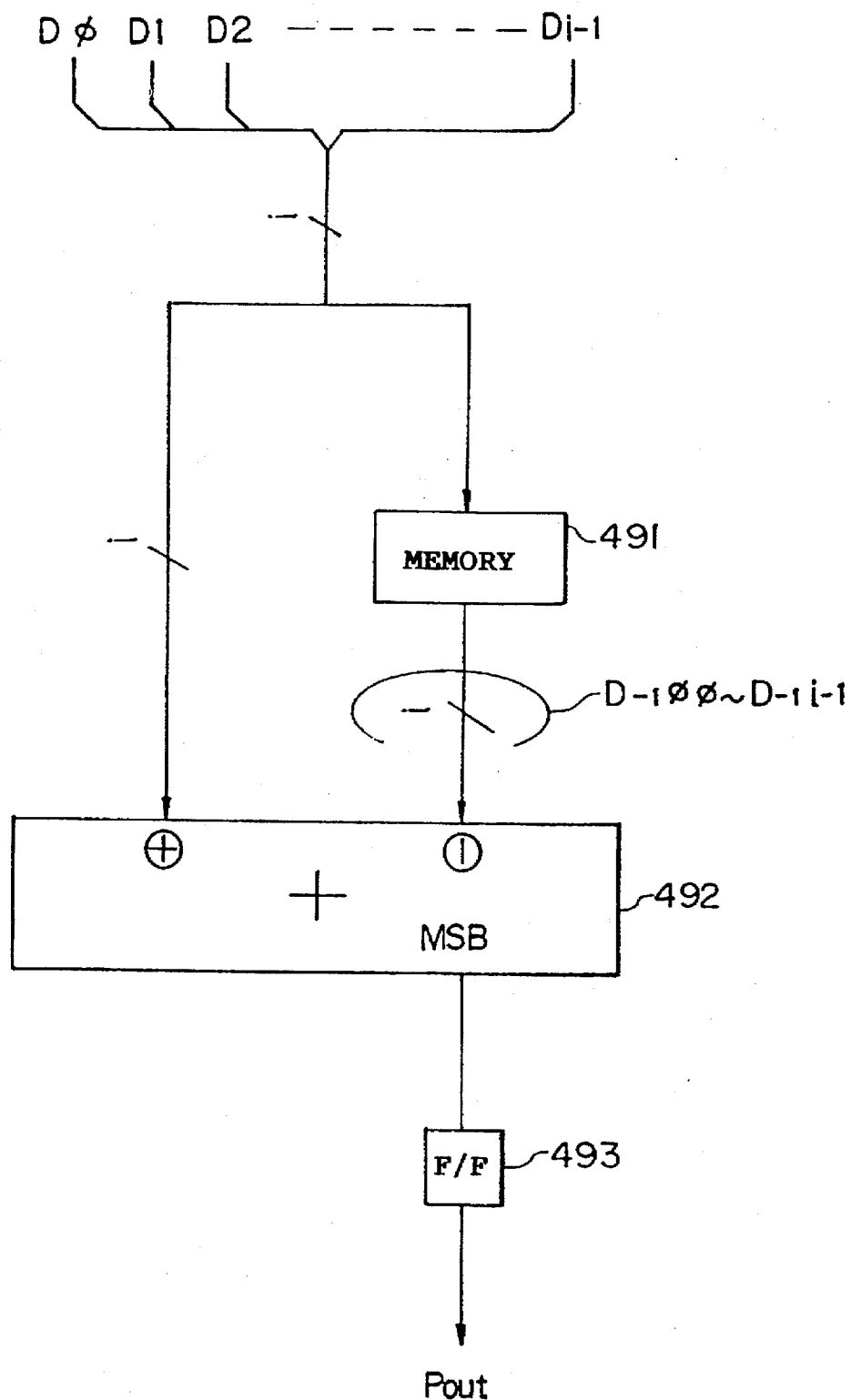
FIG. 37 shows a construction of a comparison circuit used in the magnetic detection circuit shown in FIG. 34.

Reference numeral 490 denotes a comparison circuit which processes the difference between the binary digital data stored in the decoding circuit 480 in a previous step and the binary digital data output at this step and thereafter outputs a pulse signal $P_{OUT}$ with a level 1 or 0 which is reversed at the maximum value and the minimum value of this difference, respectively. The comparison circuit 490 is provided with memory circuits 491 for storing binary digital data signals $D_0$ to $D_{i-1}$ output from the decoding circuit 480. The data is stored therein in a previous step, as shown in FIG. 37. The comparison circuit 490 is further provided with a digital subtracter 492, for processing a difference between the binary digital data $D_0$ to $D_{i-1}$ stored in the memory circuit 491 at a previous step and the binary digital data $D_0$ to $D_{i-1}$ output from the decoding circuit 480 at this time.

A flip-flop 493 is provided which receives as input coded bit signals indicating if the resultant processed data in the digital subtracter 492 is positive or negative and which outputs a pulse signal $P_{OUT}$ in response to the input data. Accordingly, the pulse signal $P_{OUT}$ is a signal with a level reversed from 1 to 0 or vice versa when the binary digital data signals $D_0$ to $D_{i-1}$, which indicate a phase difference between the divided pulse signals PB1 and PA1, are reversed from an increment to a decrement or from a decrement to an increment.

In this processing circuit, a so-called hysteresis circuit may be provided in order to avoid erroneous output data caused by noise.

Figure 36A:
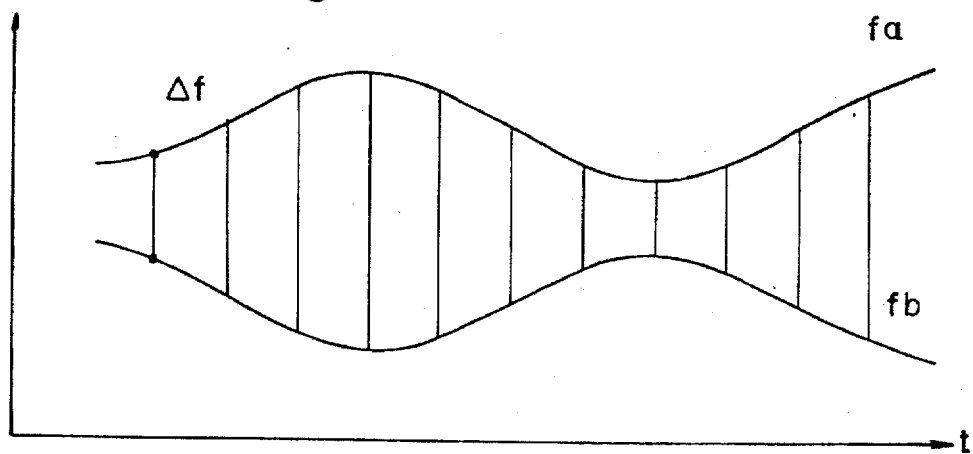
FIGS. 36(A), 36(B), and 36(C) are graphs illustrating the theory behind the magnetic detection circuit shown in FIG. 34.

FIG. 36(A) shows a configuration relating to a change of oscillating frequencies $f_a$ and $f_b$ output from the oscillating circuit 430 and 440 as shown in FIG. 34.

Figure 36B:
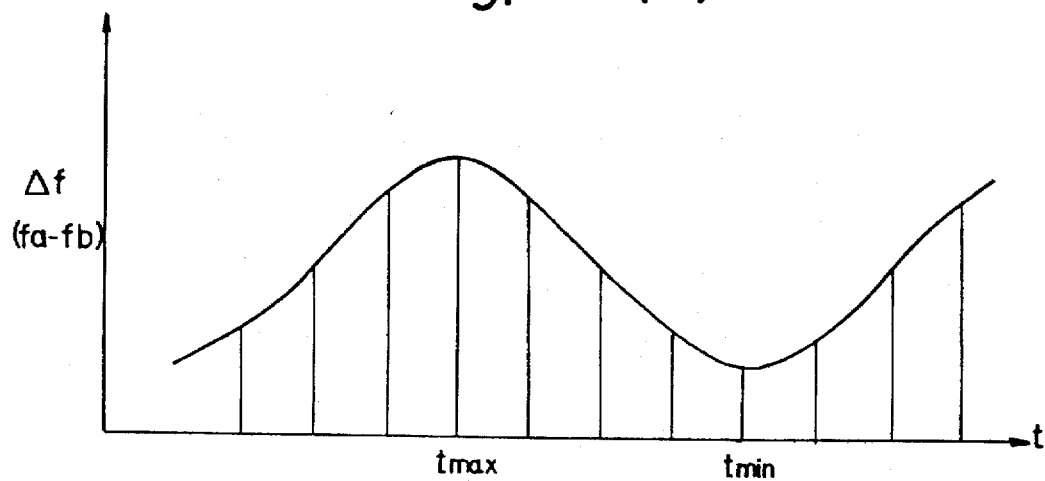
Figure 36C:
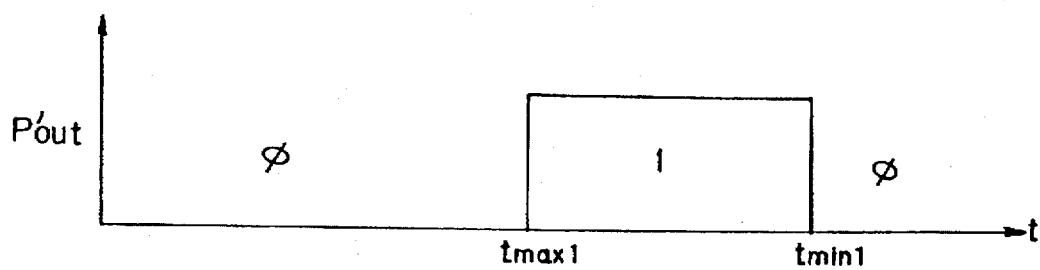

FIG. 36(B) shows a configuration relating to the difference between the oscillating frequencies $f_a$ and $f_b$ shown in FIG. 36(A), which varies in accordance with an elapsed time. The oscillating frequency difference Δf has a frequency corresponding to a magnetic change. Therefore, as shown in FIG. 36(C), a pulse signal $P'_{OUT}$ with a level reversed from 0 to 1 or 1 to 0 in response to the time $t_{max}$ when the signal indicating the oscillating frequency difference Δf comes to the maximum value and to the time $t_{min}$ when the signal indicating the oscillating frequency difference Δf comes to the minimum value, is a signal having a frequency corresponding to the magnetic change.

On the other hand, the phase difference between two divided pulse signals PB1 and PA1 corresponds to the difference of frequencies of the pulse signals CKB and CKA output from two oscillating circuits 430 and 440. (Note that when the difference of the oscillating frequencies is increased, the phase difference is also increased, while when the difference of the oscillating frequencies is decreased, the phase difference is also decreased.) Therefore, the pulse signal output from the flip-flop 493 is also a signal $P_{OUT}$ having a frequency corresponding to the magnetic change and thus the magnetic change can be detected by detecting the pulse signal $P_{OUT}$.

In this method, a pulse signal $P_{OUT}$ having a frequency corresponding to the magnetic change is formed based upon the change of the difference between the oscillating frequencies $f_a$ and $f_b$. Thus, the values of the oscillating frequencies $f_a$ and $f_b$ per se do not adversely affect the detecting accuracy. Namely, when the oscillating frequencies $f_a$ and $f_b$ change due to the difference of characteristics of devices in the production process or the change of characteristics of devices caused by time, the detecting accuracy is not deteriorated.

In the above-mentioned example, the magnetic change is detected utilizing the MREs 410 and 420, but any detecting device can be used instead so long as the oscillating frequencies of the oscillating circuits 430 and 440 can change in response to a magnetic change. One example of this will be explained hereunder with reference to FIG. 38, in which a Hall device 500 is used as a detecting means.

Figure 38:
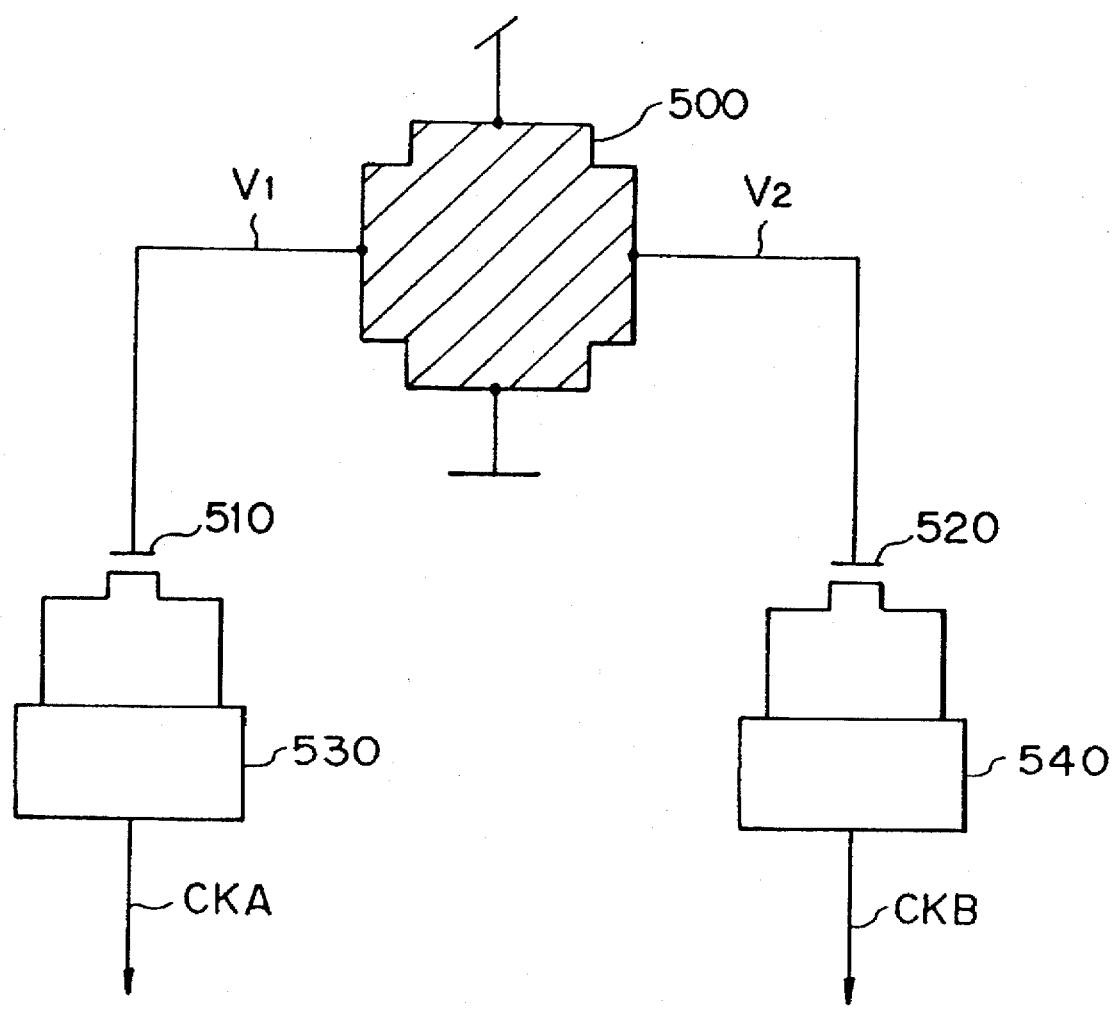
FIG. 38 shows a construction in which a Hall device is used instead of the MRE in the magnetic detection circuit shown in FIG. 34.

In FIG. 38, one of the output signals $V_1$ of the Hall device 500 is connected to a gate of a MOS transistor 510, while another output signal $V_2$ is connected to a gate of an MOS transistor 520. The voltages of the output signals $V_1$ and $V_2$ of the Hall device 500 change in opposite directions with respect to a magnetic change. Thus, the ON resistances of the MOS transistors 510 and 520 also change in opposite directions. Therefore, the oscillating frequencies of the oscillating circuits 430 and 440 can be changed in opposite directions.

In the magnetic detection circuit mentioned above, the pulse signals CKB and CKA output from the oscillating circuits 430 and 440 are divided by the counters 450 and 460, respectively, to produce the divided pulse signals PB1 and PA1 formed by accumulating the phase differences of the pulse signals. Thus, the detection accuracy of the device with respect to a magnetic change can be improved by detecting the phase difference between the divided pulse signals PB1 and PA1.

In this method, to further increase the detecting sensitivity to a magnetic change, a value of a dividing ratio of the pulse signals PB1 and PA1 to be divided may be further increased. However, when the dividing ratio is simply increased, the detecting sensitivity can be improved. Conversely, when decreased a problem arises in that the detecting period (sampling period $T_S$) is elongated. To overcome this, other examples of the magnetic detection circuit will be explained hereunder.

Another magnetic detection circuit comprises a plurality of counters corresponding to the counter 460 as shown in FIG. 34. A divided pulse signal CKA is output from an oscillating circuit corresponding to the oscillating circuit 440 as shown in FIG. 34, whereby starting times for counting pulses of the counters are delayed in turn by a sampling period $T_S$.

Note that in this circuit, the same number of synchronized pulse signals as the number of counters may be output in one sampling period $T_S$ from a counter corresponding to the counter 450 counting a clock signal CKB output from another oscillating circuit 430 as shown in FIG. 34. These synchronized pulse signals are input to a synchronized pulse detecting circuit similar to the circuit 320 shown in FIG. 32, except that a plurality of lines each comprising a plurality of D-FFs and AND gates with input terminals for each line and thus synchronized pulse signals as above, are input to each input terminal, which corresponds to the input terminal to which the pulse signal PB is input.

From each circuit, a plurality of pulse signals each newly starts to oscillate depending upon the time when each of the synchronized pulse signals is input thereto. This new pulse can be used to define a pulse PA1 as shown in FIG. 34, with which a pulse phase difference is detected with respect to another pulse PB1 as shown in FIG. 34. Accordingly, in this circuit, the pulse signal CKA as shown in FIG. 34 can be divided into a divided period having the same number of sampling periods $T_S$ as the number of counters. Therefore, the detecting sensitivity can be increased three times as compared with the pulse phase difference detecting circuit as shown in FIG. 32.

As explained above, in accordance with the fourth aspect of the invention, a plurality of gate delay circuits are used to generate a plurality of pulse signals having slightly different delay times, and a pulse signal having a delay time closest to the phase difference between the first and the second pulse signals can be selected from among the plurality of pulse signals. Since the delay time defined by the gate delay circuit can be set to be extremely short, the phase difference between the first and the second pulse signals can be detected with a high accuracy.

On the other hand, in accordance with a fifth aspect of the present invention, the change of a phase difference between pulse signals of an oscillating circuit with an oscillating frequency, which changes in response to a detected physical value, and other pulse signals, is detected, so that even when the oscillating frequency changes due to changes of temperature characteristics, time elapse, characteristics of devices, source voltage, or the like, the condition of change can still be detected with a high accuracy.

Further, even if the gate delay time $T_D$ is increased due to a temperature increment and the detecting accuracy is reduced, within a reasonable range, the devices can correctly work at high temperatures (exceeding 200° C.). The temperature range in which the detection devices can correctly work exceeds that of a conventional detection device utilizing analog circuits. Turning to still another aspect of the invention, in the oscillating circuits used in previous aspects, a plurality of inverters are used with the resistors, including MREs and a capacitor. These oscillating circuits, however, require large electric power due to the current flowing in the inverters. It has been considered to reduce the amplitude of the working voltage in the oscillating circuits in order to reduce the amount of the power consumption. When the amplitude of the working voltage is reduced, however, the reliability of the circuit is reduced with respect to changes of the voltage, noise, or changes of temperature.

Therefore, an oscillating circuit comprising a plurality of inverters reduces the power consumption while keeping the amplitude of the working voltage as is.

According to a sixth aspect of the present invention, there is provided a magnetic detection device, wherein the oscillating circuit includes a plurality of serially arranged inverters, a resistor, one end connected to an output terminal of a predetermined inverter among the plurality of inverters and another end connected to an input terminal of a first inverter among the plurality of inverters, and a capacitor, one end connected to an output terminal of an inverter output opposite to the output of the predetermined inverter, and another end connected to the input terminal of the first inverter, the oscillating circuit working as a resistance-capacitance type oscillating circuit, an oscillating frequency thereof being defined by a time constant determined by the resistor and the capacitor, each of the plurality of inverters comprising FETs, a size of the FET of the first inverter being smaller than that of other inverters.

Figure 40:
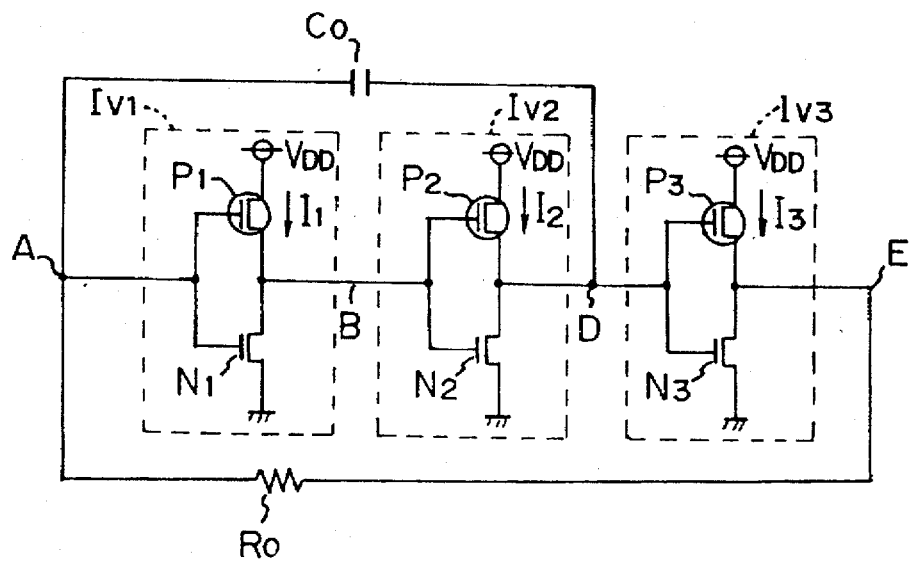
FIG. 40 shows another embodiment of the oscillating circuit used for the magnetic detecting device of the present invention.
Figure 41:
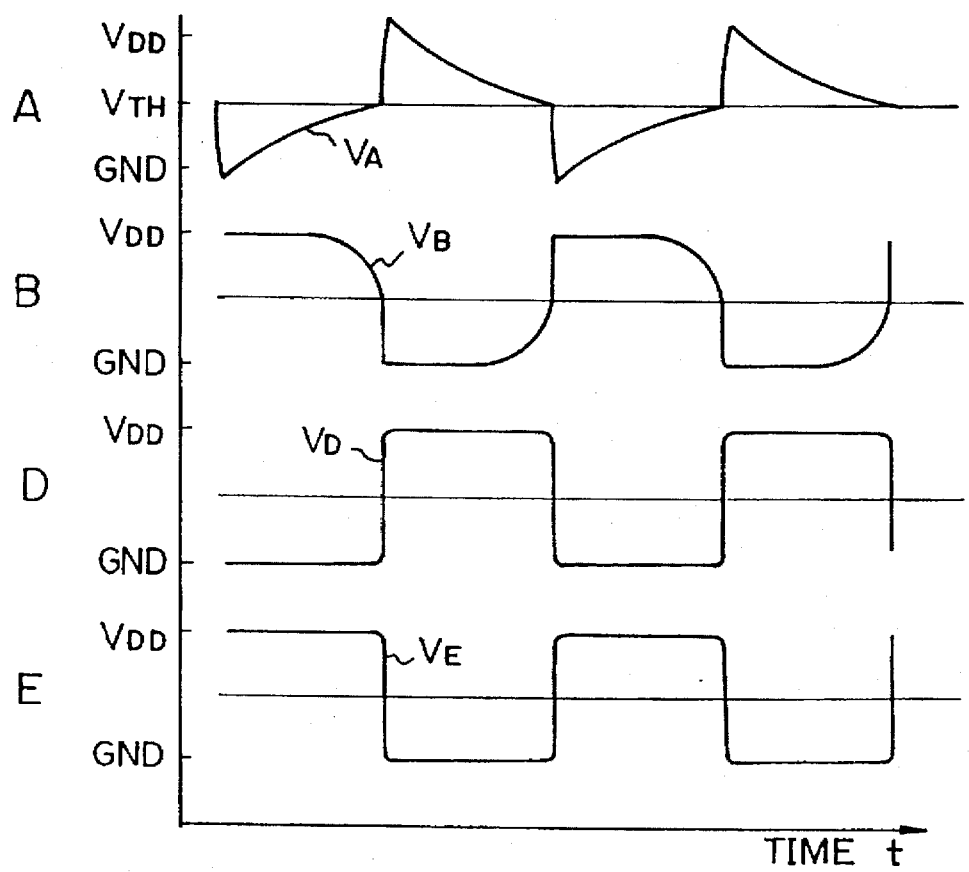
FIG. 41 shows operational waveforms of the circuit shown in FIG. 40.

In FIG. 40, inverters Iv1, Iv2, and Iv3 are serially connected to form a ring oscillating circuit. The inverter Iv1 is a complementary MOS circuit and thus has a P-channel type field effect transistor (FET) P1 and N-channel type FET N1. To a drain terminal of the P-channel type FET P1, a direct voltage $V_{DD}$ is supplied from a direct current source through a switch, not shown. A source terminal of the N-channel FET N1 is grounded. On the other hand, as shown in FIG. 41, the inverter Iv1 has a threshold voltage $V_{TH}$ lower than the direct voltage $V_{DD}$. When a voltage $V_A$ applied to an input terminal A of this circuit is higher than the threshold voltage $V_{TH}$, the N-channel FET N1 is made conductive, whereby an output voltage $V_B$ generated at an output terminal B is turned to 0. At this time, the P-channel FET is in a non-conductive condition. When the input voltage $V_A$ is lower than the threshold voltage $V_{TH}$, the P-channel FET is made conductive, whereby the output voltage $V_B$ is the direct voltage $V_{DD}$. At this time, the N-channel FET N1 is in a non-conductive condition.

As shown in FIG. 42, the inverters Iv2 and Iv3 have the same construction as does the inverter Iv1, except that the sizes (represented by a ratio of channel width W/channel length L) of the transistors used are larger. A capacitor $C_O$ is connected between an output terminal D of the inverter Iv2 and an input terminal A of the inverter Iv1, while a resistor $R_O$ is connected between an output terminal E of the inverter Iv3 and the input terminal A of the inverter Iv1. Thus, the oscillating frequency of this oscillating circuit is determined by a time constant defined by the capacitor $C_O$ and resistor $R_O$.

The operation of this oscillating circuit will be explained hereunder. In FIG. 41, at a time when power has just been applied to this circuit, the charge of the capacitor is zero. Thus, an input voltage $V_A$ of the input terminal A of the inverter Iv1 is 0 volts (GND level). Therefore, the output voltage $V_B$ of the inverter Iv1, the output voltage $V_D$ of the inverter Iv2, and the output voltage $V_E$ of the inverter Iv3 are a source voltage $V_{DD}$, 0 volts, and a source voltage $V_{DD}$, respectively.

Since the output voltage $V_E$ of the inverter Iv3 is a source voltage $V_{DD}$ and the output voltage $V_D$ of the inverter Iv2 is 0 volts, the capacitor $C_O$ is charged through the resistor $R_O$. By this charging operation, the voltage of the input terminal A of the inverter $V_A$ is increased in accordance with the time constant defined by the capacitor $C_O$ and the resistor $R_O$.

When the input voltage $V_A$ exceeds the threshold voltage $V_{TH}$, each output voltage $V_B$, $V_D$, and $V_E$ of each inverter Iv1, Iv2, and Iv3 respectively is reversed. Therefore, the output voltage $V_B$, the output voltage $V_D$, and the output voltage $V_E$ are zero, the source voltage $V_{DD}$, and 0 volts, respectively. At this time, when the output voltage $V_D$ of the inverter Iv2 is the source voltage $V_{DD}$, the input voltage $V_A$ of the input terminal A of the inverter Iv1 is the source voltage $V_{DD}$+ the threshold voltage $V_{TH}$. Since the output voltage $V_E$ of the inverter Iv3 is 0 volts, the charge stored in the capacitor $C_O$ is discharged through the resistor $R_O$ in this time. Due to this discharge operation, the input voltage $V_A$ of the input terminal A of the inverter Iv1 is decreased in accordance with the time constant defined by the capacitor $C_O$ and the resistor $R_O$.

When the input voltage $V_A$ falls below the threshold voltage $V_{TH}$, the output voltages $V_B$, $V_D$, and $V_E$ of the inverters Iv1, Iv2, and Iv3, respectively, are again reversed, so that the input voltage of the inverter Iv1 is the threshold voltage $V_{TH}$ and so that the output voltage $V_D$ of the inverter Iv2 is the source voltage $V_1$. Therefore, the charging operation is again started in the capacitor $C_O$.

The oscillating operation continues due to the repetition of the operation as explained above.

At this time, when the threshold voltage $V_{TH}$ is set at ½ of the source voltage $V_{DD}$, the frequency F is represented by the following equation:

$$F = \frac{1}{2 \cdot 2C_O R_O}$$

In the oscillating circuit as shown in FIG. 40, when the oscillation as mentioned above is continued, the voltage input to the inverters Iv1, Iv2, and Iv3 is changed from the source voltage $V_{DD}$ to 0 volts and vice versa. At this time, when the voltage input to the inverters Iv1, Iv2, and Iv3 becomes close to the threshold voltage $V_{TH}$, a through current transiently flows from the P-channel FET P1 to the N-channel FET N1. The current demand in the oscillating circuit as shown in FIG. 40 includes this through current and a charge/discharge current caused by the capacitor $C_O$ and resistor $R_O$. The charge/discharge current is a key factor for determining the oscillating frequency, however, thus the charge/discharge current cannot be reduced. Accordingly, to reduce the current demand in this oscillating circuit, it is necessary to reduce the through current. This through current $I_D$, in a saturated condition, is represented by the following equation:

$$I_D = \frac{\mu}{2} \cdot \frac{W}{L} Cox(V_G - V_T)2$$

In a non-saturated condition, it is represented by the following equation:

$$I_D = \mu \frac{W}{L} Cox \left[ (V_G - V_T)V_D - \frac{1}{2} V_D^2 \right]$$

wherein,
W denotes a channel width of a gate;
L denotes a channel length of the gate;
$\mu$ denotes the surface mobility of a carrier;
Cox denotes a gate capacity per unit area;
$V_G$ denotes a gate voltage;
$V_D$ denotes a drain voltage;
$V_T$ denotes a threshold voltage; and
$I_D$ denotes a drain current.

From these equations, the through current $I_D$ is found to be proportional to the transistor size W/L. This transistor size W/L is a parameter for determining the current carrying capacitance. The narrower the channel width W and the longer the channel length, the more difficult it is for the current to flow therein. It is considered that the resistance value thereof increases equivalently.

Figure 44:
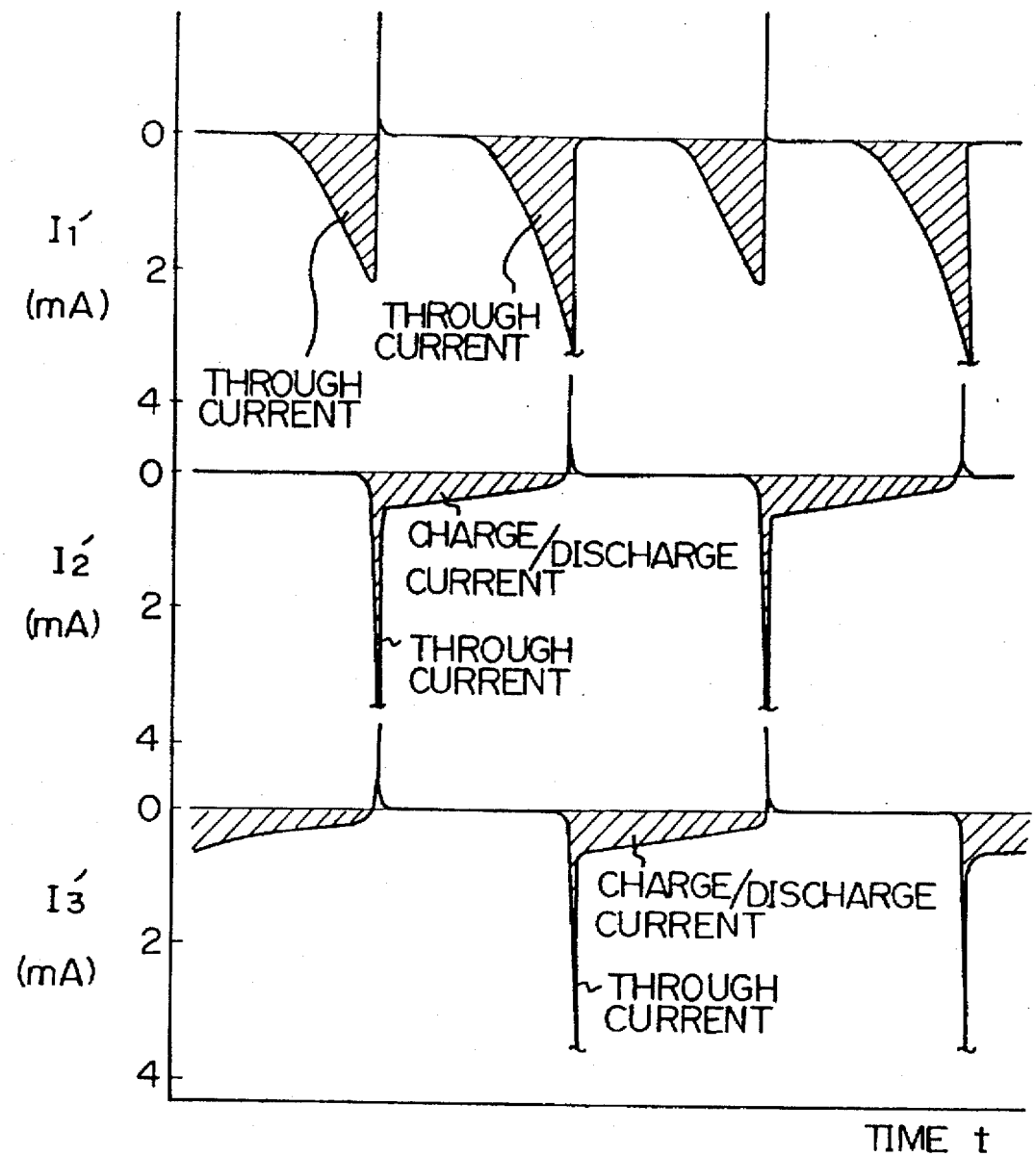
FIG. 44 shows waveforms indicating currents flowing in the inverters having the transistor sizes indicated in FIG. 43.

As shown in FIG. 43, when the channel width W and the channel length L of the P-channel FET P1–P3 in the inverters Iv1, Iv2, and Iv3 are set at 1250 μm and 5 μm, respectively; the channel width W and the channel length L of the N channel FET in the inverters Iv1, Iv2, and Iv3 are set at 500 μm and 5 μm respectively; and the transistor size W/L of the inverters Iv1, Iv2, and Iv3 is set at the same value as in the conventional inverter, the through current flowing in the inverters Iv1, Iv2, and Iv3 is as shown in FIG. 44.

It is apparent from FIG. 44 that when the inverters Iv1, Iv2, and Iv3 having the same transistor size W/L are used, the through current of the current I1' which flows through the inverter Iv1 becomes the largest. The reason is that a voltage varied in accordance with a time constant defined by the capacitor $C_O$ and the resistor $R_O$ is applied to the input terminal A of the inverter Iv1, as shown in FIG. 41. Note that the ratio of change of the voltage changed in accordance with a time constant defined by the capacitor $C_O$ and the resistor $R_O$ is generally small, and thus a period during which the input voltage $V_A$ of the inverter Iv1 is closed to the threshold voltage $V_{TH}$ is longer than that of the input voltage $V_B$ and $V_D$ of other inverters Iv2 and Iv3. Therefore, the through current of the current I1' which flows through the inverter Iv1 becomes larger than that of each current I2' and I3' which flow through other inverters Iv2 and Iv3, respectively.

Figure 45:
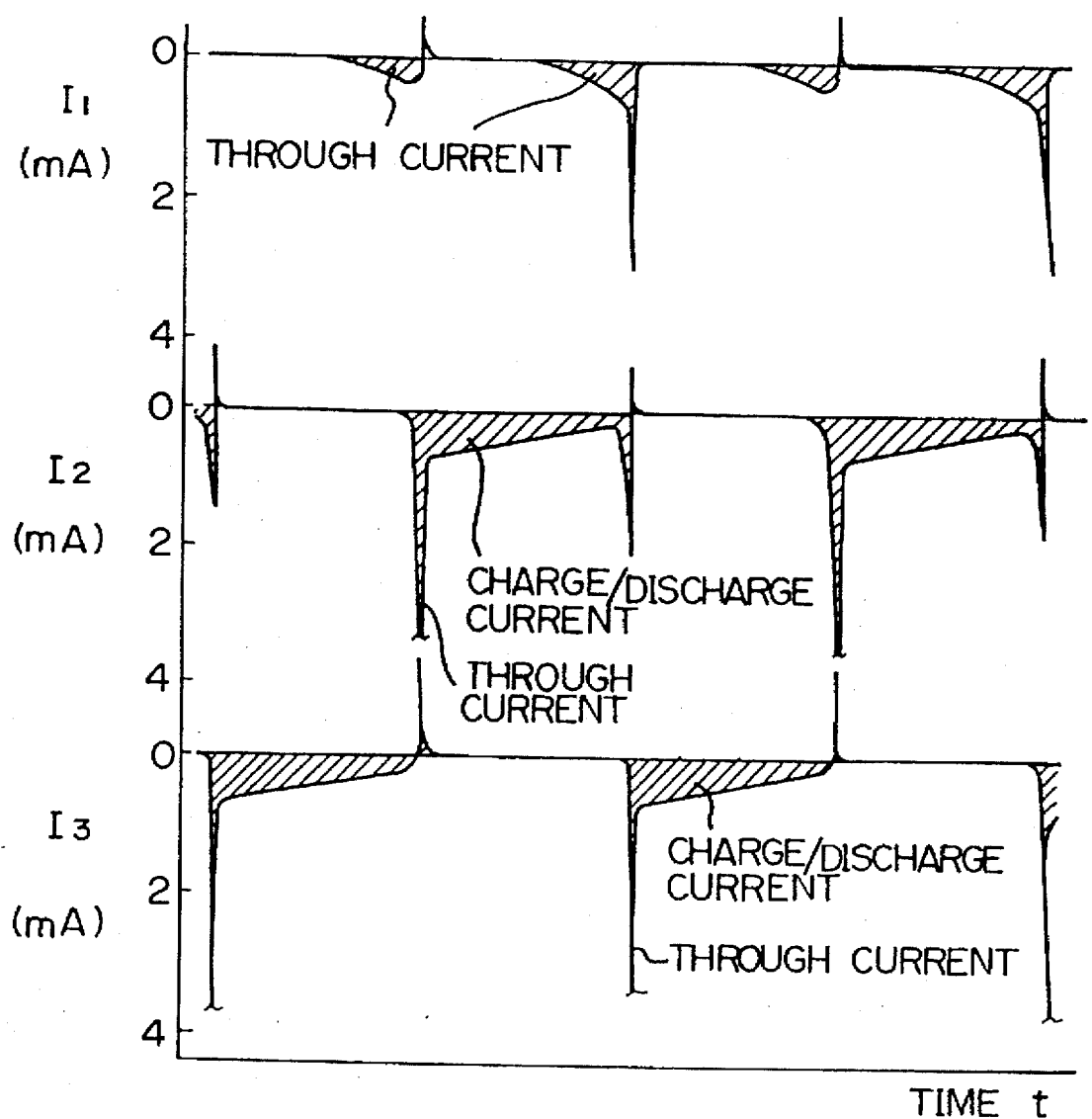
FIG. 45 shows waveforms indicating currents flowing in the inverters having the transistor sizes indicated in FIG. 42.

The transistor size W/L of the inverter Iv1 is set at a value one-fifth of the transistor size W/L of the inverters Iv2 and Iv3, in order to reduce the through current of the current I1' which flows through the inverter Iv1 as shown in FIG. 42. The waveforms of the through currents of the currents I1', I2', and I3' which flow through each inverter Iv1, Iv2, and Iv3 respectively are shown in FIG. 45. It is apparent from FIG. 45 that the through current of the current I1' which flows through the inverter Iv1 can be sufficiently reduced.

Note that the P-channel FET $P_2$ and the N-channel FET $N_2$ of the inverter Iv2 should have a driving performance because it has the capacitor $C_0$ charged and discharged and thus it is difficult to reduce the transistor size W/L. On the other hand, since both the P-channel FET P3 and the N-channel FET N3 of the inverter Iv3 are connected to the resistor $R_0$, it is also difficult to reduce the transistor size W/L. Conversely, since both the P-channel FET and N-channel FET N1 of the inverter Iv1 need only have a driving performance for charging and discharging a parasitic capacitance generated in a gate of the inverter Iv2, the transistor size W/L can be reduced.

Note also that, when the number of stages of the inverters is increased, the through current can be further reduced.

In these aspects mentioned above, the magnetic detection device may be formed with a plurality of oscillating circuits, each having MREs and a logic processing circuit integrated into one chip. Such a magnetic detection device is generally required to have an anti-noise characteristic and an improved surge characteristic.

According to a seventh aspect of the present invention, there is provided an integrated circuit device used for detecting magnetism, which comprises;

an integrated circuit, a metallic casing containing the integrated circuit; a varistor having electrodes formed on opposite surfaces thereof, one surface thereof being connected to an inside surface of the casing in an electrically insulated condition; a plurality of lead wires for transmitting electrical signals to an external circuit from the metallic casing; and a conductive means for electrically connecting the integrated circuit to the plurality of lead wires through the electrodes formed on each side of the varistor.

Figure 46:
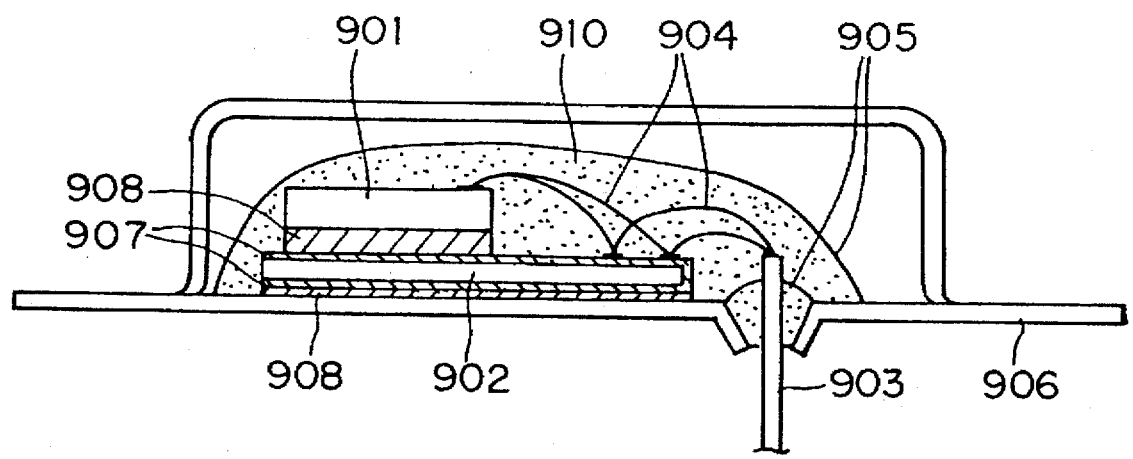
FIG. 46(a) is a cross-sectional view of an integrated circuit used for the magnetic detection device of the present invention.
FIG. 46(b) is a plane view of the construction in the case shown in FIG. 46(a).
Figure 46:
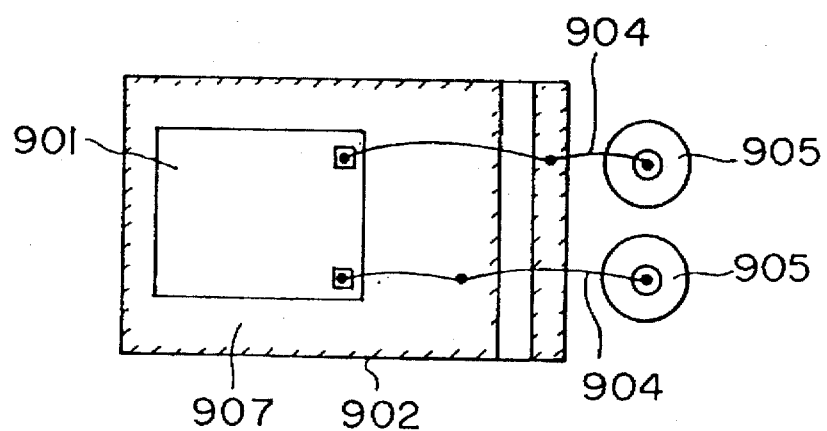

FIG. 46(a) is a cross-sectional view of the integrated circuit device, and FIG. 46(b) is a plane view of the construction in a case 906. Shown is a one chip MRE sensor with two lines utilizing a source line in which signals overlap. In that, the IC chip 901 is a silicon chip including a logic processing means, for example, a one chip MRE sensor. A varistor 902 is a non-linear resistance element made mainly of ZnO and having a resistance which can steeply increase or decrease in accordance with an increment of an applied voltage. On both surfaces of the varistor 902, electrodes 907 are formed. One of the electrodes 907 is fixedly mounted on a surface of the case 906 made of a metallic material through a melted insulating glass 908. On the other hand, the IC chip 901 is fixedly mounted on the opposite surface of the varistor 902 with a melted insulating glass 908 interposed. One electrode 907 formed on one of the surfaces thereof is printed so that another end of the electrode is extended to the opposite surface of the varistor through a side surface thereof.

In this construction, a lead wire 903, introducing a signal, for example, an electrical source signal, thereto, is connected on the electrode 907 formed on the surface of the varistor 902 through a bonding wire 904. Therefore, the signal introduced thereto is applied to the IC chip 901. A hermetical glass 905 is used for fixing the lead wire 903 to the case 906 insulatingly. A junction coat 910 is used to protect the IC chip 901 and the bonding wire 904.

Although the embodiments described above relate to a physical quantity detection device which detects magnetism, it will also be appreciated that the device could be employed to alternatively detect pressure or temperature.

We claim:

1. A physical quantity detection device for detecting a physical quantity comprising:

first pulse generating means for generating first successive pulse signals, wherein intervals between said first successive pulse signals change in response to a change in said physical quantity being detected;

first pulse dividing means comprising:
first counting means for counting said first successive pulse signals having a first counting pulse signal output and a first counting initiating signal input, and
first decoding means having a first decoding signal input from said first counting pulse signal output and a first decoding pulse signal output for generating a first pulse signal when a counted value of said first counting means reaches a first predetermined value, said first decoding means further having a synchronization signal output for generating a synchronization signal, a first reset signal output for generating a first reset signal to the first counting initiating signal input for initiating said first counting means, and a second reset signal output for generating a second reset signal when a counted value of said first counting means reaches a second predetermined value;

second pulse generating means for generating second successive pulse signals, an interval between said second successive pulse signals being one of constant and changing in response to said change in said physical quantity being detected, said second pulse generating means having a synchronization signal input from said first decoding means synchronization signal output for controlling said second pulse generating means by said synchronization signal so that a phase of said first successive pulse signals is synchronized with a phase of said second successive pulse signals;

second pulse dividing means comprising:
second counting means for counting said second successive pulse signals having a second counting pulse signal output, said second counting means further having a second initiating signal input for receiving said second reset signal from said first decoding means for initializing said second counting means, and
second decoding means having a second decoding signal input from said second counting pulse signal output and a second decoding pulse signal output for generating a second pulse signal when a counted value of said second counting means reaches a third predetermined value; and pulse phase difference detecting means having a plurality of phase difference inputs from said first and second decoding pulse signal outputs for detecting a pulse phase difference between said first pulse signals and second pulse signals, and for outputting a resultant signal representing said physical quantity based upon said pulse phase difference.

2. A physical quantity detection device according to claim 1, wherein:

said first pulse generating means and said second pulse generating means are each provided with at least one of a resistor, a capacitor and an inductor, a value of said at least one of said resistor, said capacitor, and said inductor being changed with respect to said change in said physical quantity.

3. A physical quantity detection device for detecting a physical quantity comprising:

first pulse generating means for generating first successive pulse signals, wherein intervals between said first successive pulse signals change in response to a change in said physical quantity being detected;

first pulse dividing means comprising:
  first counting means for counting said first successive pulse signals having a first counting pulse signal output and a first counting initiating signal input, and
  first decoding means having a first decoding signal input from said first counting pulse signal output and a first decoding pulse signal output for generating a first pulse signal when a counted value of said first counting means reaches a first predetermined value, said first decoding means further having a synchronization signal output for generating a synchronization signal, a first reset signal output for generating a first reset signal to the first counting initiating signal input for initiating said first counting means, and a second reset signal output for generating a second reset signal when a counted value of said first counting means reaches a second predetermined value;
second pulse generating means for generating second successive pulse signals, intervals between said second successive pulse signals changing in response to said change in said physical quantity being detected, said second pulse generating means having a synchronization signal input from said first decoding means synchronization signal output for controlling said second pulse generating means by said synchronization signal so that a phase of said first successive pulse signals is synchronized with a phase of said second successive pulse signals;
second pulse dividing means comprising:
  second counting means for counting said second successive pulse signals having a second counting pulse signal output, said second counting means further having a second initiating signal input for receiving said second reset signal from said first decoding means for initializing said second counting means, and
  second decoding means having a second decoding signal input from said second counting pulse signal output and a second decoding pulse signal output for generating a second pulse signal when a counted value of said second counting means reaches a third predetermined value; and
pulse phase difference detecting means having a plurality of phase difference inputs from said first and second decoding pulse signal outputs for detecting a pulse phase difference between said first pulse signals and second pulse signals, and for outputting a resultant signal representing said physical quantity based upon said pulse phase difference;
said first pulse generating means and said second pulse generating means each increasing a frequency of pulses generated from one of said first pulse generating means and said second pulse generating means, and each decreasing a frequency of pulses generated from another of said first pulse generating means and said second pulse generating means.

4. A physical quantity detection device according to claim 1, wherein:
said first counting means includes a first counter to which said first successive pulse signal is input;
said first decoding means includes a first decoder, coupled to said first counter to which a first counter output signal generated by said first counter is input, said first decoder outputting said synchronization signal and said first reset signal;

said second counting means includes a second counter to which said second successive pulse signal is input; and
said second decoding means includes a second decoder coupled to said second counter, to which a second counter output signal generated by said second counter is input.

5. A physical quantity detection device according to claim 1, wherein:
an operation of said second pulse generating means is stopped temporarily in response to said synchronization signal.

6. A physical quantity detection device according to claim 4, wherein:
said counted value of said second pulse dividing means is initialized to a predetermined value by said first reset signal.

7. A physical quantity detection device according to claim 1, wherein said pulse phase difference detecting means comprises:
delay signal output means for outputting a plurality of delayed signals when said first pulse signal is input thereto, each of said plurality of delayed signals being delayed in time with respect to said first pulse signal by predetermined different amounts of time; and
pulse signal selecting means, which receives said second pulse signal, for detecting said phase difference between said first pulse signal and said second pulse signal by selecting a certain one signal from among said plurality of delayed signals, said certain one signal having a specific condition with respect to a timing at which said second pulse signal is input to said pulse signal selecting means.

8. A physical quantity detection device according to claim 1, wherein:
said first decoding means comprises a decoder, said decoder generating said second reset signal when said counted value counted by said first counting means reaches said first predetermined value and said second counting means is reset by said second reset signal.

9. A physical quantity detection device according to claim 7, wherein:
said delay signal output means comprises an inverter.

10. A physical quantity detection device according to claim 1, further comprising:
signal processing means, receiving said resultant signal as pulse phase difference data, for processing said pulse phase difference data digitally so as to determine whether or not a currently detected pulse phase difference data is higher or lower than a predetermined value, and for providing output data representing said physical quantity in response to said processed data.

11. A physical quantity detection device according to claim 10, wherein:
said signal processing means detects an extreme value of said pulse phase difference data and outputs an extreme output signal in response to said detected extreme value.

12. A physical quantity detection device for detecting a physical quantity comprising:
pulse generating means for generating successive pulse signals, wherein intervals between said successive pulse signals are determined with respect to a change in said detected physical quantity, said pulse generating means for converting said physical quantity into a pulse frequency representing a time-dimension factor, and for outputting time-signals based upon said pulse frequency;

time-pulse dividing means, for receiving said time-signals as input signals, for counting said time-signals and generating a time-pulse dividing output pulse when a counted value reaches a predetermined value, and for generating a synchronization signal when counting starts again after a counted value reaches a predetermined value;

reference signal generating means for generating reference signals having a predetermined frequency, said reference signal generating means being cyclically in synchronization with said pulse generating means in response to said synchronization signal; and time-signal detecting means for detecting a phase-relationship between said time-pulse dividing output pulse and said reference signals, and for outputting a signal for representing said physical quantity based on said phase-relationship.

13. A physical quantity detection device according to claim 12, wherein:

said reference signals change in frequency in a direction opposite to a change in frequency of said time-pulse dividing output pulse as said condition of said physical quantity changes.

14. A physical quantity detection device according to claim 12, wherein said time-pulse dividing means comprises:

a counter counting said time-signals as said counted value; and a decoder generating said synchronization signal based upon said counted value.

15. A physical quantity detection device according to claim 13, wherein said reference signal generating means comprises:

reference pulse signal generating means for generating reference pulse signals;

a counter counting said reference pulse signals; and a decoder decoding said counted value and generating said reference signal;

said reference signal generating means being initialized cyclically in response to said synchronization signal.

16. A physical quantity detection device for detecting a physical quantity of a type which can change an oscillating characteristic of an oscillating element, said device comprising:

first oscillating means for generating a first pulse signal having a first oscillating frequency which can be changed in response to a change in said physical quantity detected;

second oscillating means for generating a second pulse signal having a reference oscillating frequency to be compared with said first oscillating frequency of said first pulse signal;

first counting means connected to said first oscillating means for counting a number of pulses of said first pulse signal starting from a first pulse of said first pulse signal positioned at a predetermined first counting point, and for outputting a first counting signal when said first counting means counts a first predetermined number of pulses of said first pulse signal;

second counting means connected to said second oscillating means for counting a number of pulses of said second pulse signal starting from a first pulse of said second pulse signal positioned at a predetermined second counting point, and for outputting a second counting signal when said second counting means counts a second predetermined number of pulses of said second pulse signal;

pulse phase difference detecting means connected to said first counting means and second counting means for detecting a phase difference between said first counting signal and said second counting signal; and detecting means, receiving an input from said phase difference detecting means, for detecting whether or not the frequency of said first pulse signal of said first oscillating means has changed, depending upon said pulse phase difference detected by said pulse phase difference detecting means;

one of said first counting means and said second counting means outputting a synchronization signal to one of said second oscillating means and said first oscillating means respectively, after said first counting means outputs said first counting signal and said second counting means outputs said second counting signal, so that said first counting point of said first counting pulse signal is synchronized with said second counting point of said second pulse signal.

17. A physical quantity detection device for detecting a condition of a physical quantity comprising:

first pulse generating means for generating successive pulse signals, an interval of said first successive pulse signals changing in response to a change in said physical quantity being detected;

a first counter counting said successive pulse signals and generating a first pulse signal when a first counted value of said first counter reaches a first predetermined value;

a first decoder generating a synchronization signal when said first counted value of said first counter reaches a second predetermined value;

second pulse generating means for generating pulse signals, for stopping generation of said pulse signals after a predetermined number of pulse signals are generated, for restarting generation of said pulse signals in synchronization with one of a first level of said synchronization signal and a leading edge of said synchronization signal, and for stopping said restarting generation of said pulse signals in synchronization with one of a second level of said synchronization signal and a trailing edge of said synchronization signal;

a second counter counting said second pulses and generating a second pulse signal when a second counted value of said second counter reaches a third predetermined value; and pulse phase difference detecting means for detecting a pulse phase difference between said first pulse signal and said second pulse signal, and for outputting a digitized signal representing said physical quantity based on said phase difference.

* * * * *